(12) United States Patent
Matsubara

(10) Patent No.: US 10,411,025 B2
(45) Date of Patent: Sep. 10, 2019

(54) SEMICONDUCTOR DEVICE AND MANUFACTURING METHOD THEREOF

(71) Applicant: Renesas Electronics Corporation, Tokyo (JP)

(72) Inventor: Yoshihisa Matsubara, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/900,664

(22) Filed: Feb. 20, 2018

(65) Prior Publication Data

US 2018/0301462 A1    Oct. 18, 2018

(30) Foreign Application Priority Data

Apr. 18, 2017  (JP) .................. 2017-082021

(51) Int. Cl.
| | | |
|---|---|---|
| *H01L 27/11546* | (2017.01) | |
| *H01L 29/788* | (2006.01) | |
| *H01L 29/423* | (2006.01) | |
| *H01L 29/66* | (2006.01) | |
| *H01L 21/265* | (2006.01) | |
| *H01L 21/28* | (2006.01) | |
| *H01L 29/792* | (2006.01) | |
| *H01L 27/1157* | (2017.01) | |
| *H01L 27/11573* | (2017.01) | |

(52) U.S. Cl.
CPC .. *H01L 27/11546* (2013.01); *H01L 21/26513* (2013.01); *H01L 21/28282* (2013.01); *H01L 27/1157* (2013.01); *H01L 27/11573* (2013.01); *H01L 29/42324* (2013.01); *H01L 29/42344* (2013.01); *H01L 29/6656* (2013.01); *H01L 29/66545* (2013.01); *H01L 29/66833* (2013.01); *H01L 29/7883* (2013.01); *H01L 29/792* (2013.01); *H01L 29/6659* (2013.01)

(58) Field of Classification Search
CPC ......... H01L 27/11546; H01L 27/11573; H01L 29/7883; H01L 29/42324; H01L 29/792; H01L 29/42344; H01L 29/66833; H01L 27/1157; H01L 21/28282
See application file for complete search history.

(56) References Cited

U.S. PATENT DOCUMENTS 7,713,810 B2  5/2010  Hagemeyer et al.
9,093,546 B2  7/2015  Uozaki et al.

FOREIGN PATENT DOCUMENTS

JP  2005-533370 A  11/2005
JP  2014-103204 A  6/2014

*Primary Examiner* — Matthew L Reames
*Assistant Examiner* — John A Bodnar
(74) *Attorney, Agent, or Firm* — McGinn IP Law Group, PLLC

(57) ABSTRACT

In a semiconductor device including a higher-breakdown-voltage MISFET, an improvement is achieved in the breakdown voltage of the MISFET, while preventing an increase in the area of the MISFET. A gate pattern including a gate electrode of the higher-breakdown-voltage MISFET is formed higher in level than a gate pattern including a gate electrode of a lower-breakdown-voltage MISFET. An $n^+$-type semiconductor region included in each of source/drain regions of the higher-breakdown-voltage MISFET is formed deeper than an $n^+$-type semiconductor region included in each of source/drain regions of the lower-breakdown-voltage MISFET.

3 Claims, 36 Drawing Sheets

FIG. 47

| | OPERATION METHOD WRITE/ERASE | WRITE OPERATION VOLTAGE (V) Vmg/Vs/Vcg/Vd/Vb | ERASE OPERATION VOLTAGE (V) Vmg/Vs/Vcg/Vd/Vb | READ OPERATION VOLTAGE (V) Vmg/Vs/Vcg/Vd/Vb |
|---|---|---|---|---|
| A | SSI (WRITE)/ BTBT (ERASE) | 10/5/1/0.5/0 | -6/6/0/open/0 | 0/0/1.5/1.5/0 |
| B | SSI (WRITE)/ FN (ERASE) | 10/5/1/0.5/0 | 12/0/0/0/0 | 0/0/1.5/1.5/0 |
| C | FN (WRITE)/ BTBT (ERASE) | -12/0/0/0/0 | -6/6/0/open/0 | 0/0/1.5/1.5/0 |
| D | FN (WRITE)/ FN (ERASE) | -12/0/0/0/0 | 12/0/0/0/0 | 0/0/1.5/1.5/0 |

SEMICONDUCTOR DEVICE AND MANUFACTURING METHOD THEREOF

CROSS-REFERENCE TO RELATED APPLICATIONS

The disclosure of Japanese Patent Application No. 2017-082021 filed on Apr. 18, 2017 including the specification, drawings and abstract is incorporated herein by reference in its entirety.

BACKGROUND

The present invention relates to a semiconductor device and a manufacturing method thereof, which can be used for, e.g., the manufacturing of a semiconductor device including a higher-breakdown-voltage transistor.

A semiconductor chip has an I/O (Input Output) region including a circuit which performs input/output operations with a device outside the semiconductor chip, a power supply circuit, or the like. In the I/O region, a higher-breakdown-voltage MISFET (Metal Insulator Semiconductor Field Effect Transistor or MIS type field effect transistor) which is driven with a voltage higher than that for driving the MISFET formed in a logic region (core region) is provided. The higher-breakdown-voltage MISFET may be used to supply a high voltage to a nonvolatile storage element.

Patent Document 1 (Japanese Translation of PCT Application No. 2005-533370) describes a memory transistor including a structure in which a gate electrode is formed over a floating gate electrode via an ONO (Oxide Nitride Oxide) film.

Patent Document 2 (Japanese Unexamined Patent Application Publication No. 2014-103204) describes a MOSFET (Metal Oxide Semiconductor Field Effect Transistor) including a gate electrode formed of a multi-layer film including polysilicon films in two layers.

RELATED ART DOCUMENTS

Patent Documents

[Patent Document 1] Japanese Translation of PCT Application No. 2005-533370

[Patent Document 2] Japanese Unexamined Patent Application Publication No. 2014-103204

SUMMARY

For example, in a vehicle-mounted semiconductor device, it is required to improve a protection voltage for an element associated with a power supply for the purpose of preventing noise-induced malfunction or the like. To satisfy the requirement, it can be considered to increase the area of the I/O region and thus improve the breakdown voltage of the semiconductor device. However, in that case, a problem arises in that the miniaturization of the semiconductor device becomes difficult. To achieve each of an improvement in the reliability of the semiconductor device and the miniaturization thereof, it is therefore necessary to prevent an increase in the area of a semiconductor element in the I/O region and increase the breakdown voltage of the semiconductor element.

Other problems and novel features of the present invention will become apparent from a statement in the present specification and the accompanying drawings.

The following is a brief description of the outline of a representative one of the embodiments disclosed in the present application.

In a semiconductor device according to an embodiment, a gate pattern including a gate electrode of a first transistor is formed higher in level than a gate pattern including a gate electrode of a second transistor, while diffusion regions forming the source/drain regions of the first transistor are formed deeper than diffusion regions forming the source/drain regions of the second transistor.

According to the embodiment, it is possible to improve the performance of the semiconductor device.

BRIEF DESCRIPTION OF THE DRAWINGS

FIG. 47 is a table showing an example of conditions under which voltages are applied to the individual portions of a selected memory cell during "Write", "Erase", and "Read" operations.

DETAILED DESCRIPTION

Figure 1:
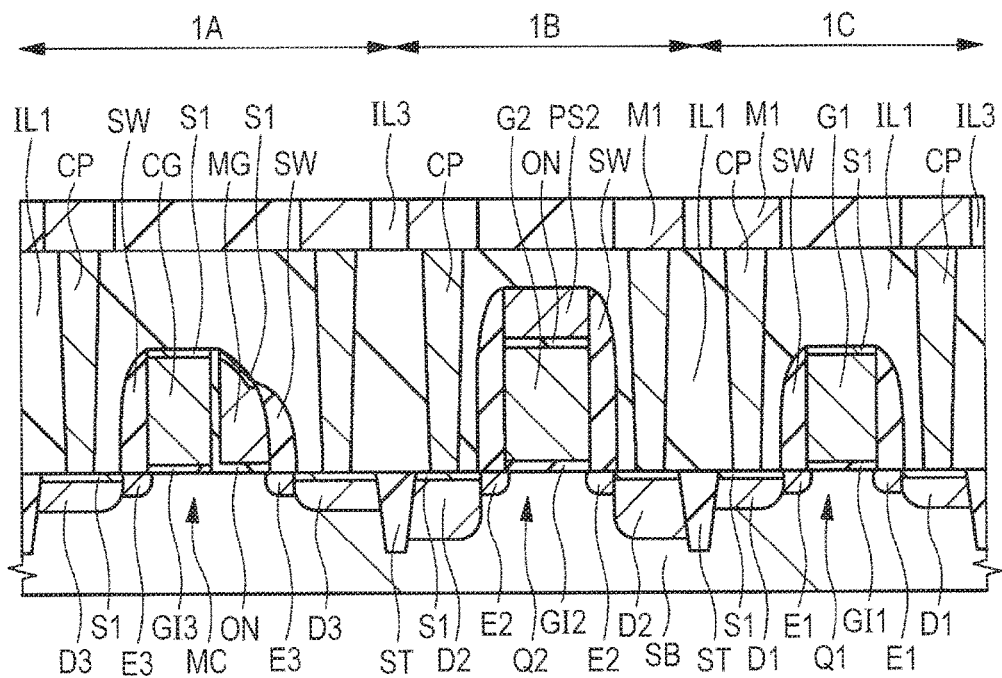
FIG. 1 is a cross-sectional view of a semiconductor device in Embodiment 1.

In each of the following embodiments, if necessary for the sake of convenience, the embodiment will be described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in the following embodiments, when the number and the like (including the number, numerical value, amount, range, and the like) of elements are mentioned, they are not limited to the mentioned numbers unless particularly explicitly described otherwise or unless they are obviously limited to specific numbers in principle. The number and the like of the elements may be not less than or not more than the mentioned numbers.

Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe the embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

Note that the superscript signs "−" and "−" represent the relative concentrations of impurities each having the n- or p-type conductivity type. For example, in the case of an n-type impurity, "n⁻" and "n⁺" show increasingly higher impurity concentrations.

Embodiment 1

Semiconductor devices in the present and following embodiments are semiconductor devices each including a higher-breakdown-voltage MISFET (higher-breakdown-voltage transistor) used in a power supply circuit or the like. By allowing diffusion regions forming the source/drain regions of the higher-breakdown-voltage MISFET to be formed deep, the breakdown voltage of the higher-breakdown-voltage MISFET is improved.

Note that, in Embodiment 1, a description will be given of the case where a lower-breakdown-voltage MISFET (lower-breakdown-voltage transistor) included in a logic circuit or the like and a nonvolatile memory (nonvolatile storage element, flash memory, or nonvolatile semiconductor storage device) are embedded together with the higher-breakdown-voltage MISFET in mixed relation in the same semiconductor substrate. In the present and following embodiments, the nonvolatile memory will be described on the basis of a memory cell based on an n-channel MISFET (Metal Insulator Semiconductor Field Effect Transistor).

Also, in the present and following embodiments, polarities (the polarities of voltages applied during write/erase/read operations and the polarities of carriers) are intended to describe operations when the memory cell is based on the n-channel MISFET. When the memory cell is based on a p-channel MISFET, by inverting all the polarities including the conductivity types of applied potentials and carriers, the same operations in principle can be obtained.

Structure of Semiconductor Device in Embodiment 1

Figure 2:
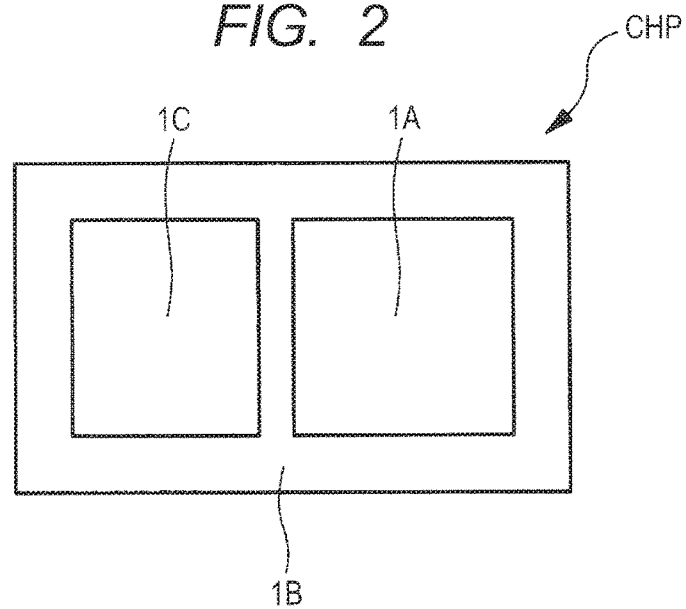
FIG. 2 is a schematic plan view of the semiconductor device in Embodiment 1.

The following will describe the semiconductor device in Embodiment 1 using FIGS. 1 and 2. FIG. 1 is a cross-sectional view showing the semiconductor device in Embodiment 1. FIG. 2 is a schematic plan view of a semiconductor chip including the semiconductor device in Embodiment 1. FIG. 1 shows the cross-sectional view of each of a memory cell region 1A, an I/O region 1B, and a logic region 1C which are arranged in this order in a left-to-right direction in the drawing. The memory cell region 1A, the I/O region 1B, and the logic region 1C are present at positions on the main surface of the same semiconductor substrate which do not overlap each other in plan view.

Each of the I/O region 1B and the logic region 1C is a portion of a peripheral circuit region. Peripheral circuits are the circuits other than a nonvolatile memory. Examples of the peripheral circuits inside a memory module include a control circuit, a sense amplifier, a column decoder, a row decoder, an input/output circuit which receives an input and produces an output from and to the outside of the module, and a power supply circuit. Examples of the peripheral circuits outside the memory module include a processor such as a CPU, various analog circuits, a SRAM (Static Random Access Memory) module, and an external input/output circuit. In FIG. 1, the MISFET formed in the I/O region 1B is a higher-breakdown-voltage MISFET, while the MISFET formed in the logic region 1C is a lower-breakdown-voltage MISFET.

In Embodiment 1, a description will be given of the case where, as the two transistors included in the memory cell in the memory cell region 1A, n-channel MISFETs (control transistor and memory transistor) are formed. However, it is also possible to invert the conductivity type and form p-channel MISFETs (control transistor and memory transistor) in the memory cell region 1A. Likewise, in the present embodiment, a description will be given of the case where an n-channel MISFET is formed in each of the I/O region 1B and the logic region 1C. However, it is also possible to invert the conductivity type and form a p-channel MISFET in each of the I/O region 1B and the logic region 1C. It is also possible to form both of an n-channel MISFET and a p-channel MISFET, i.e., a CMISFET (Complementary MISFET) in each of the I/O region 1B and the logic region 1C.

As shown in FIG. 1, the semiconductor device in Embodiment 1 includes a semiconductor substrate (semiconductor wafer) SB made of p-type monocrystalline silicon (Si) having a specific resistance of, e.g., about 1 to 10 Ωcm or the like. The semiconductor substrate SB has a main surface (upper surface) and a back surface (lower surface) opposite to the main surface. The various MISFETs mentioned above are formed in the main surface of the semiconductor substrate SB. In the main surface of the semiconductor substrate SB, a plurality of trenches are formed and, in the trenches, isolation regions ST each made of an insulating film defining active regions are formed. The isolation regions ST are provided between the individual regions arranged along the main surface of the semiconductor substrate SB so as to electrically isolate elements from each other. In each of the memory cell region 1A, the I/O region 1B, and the logic region 1C also, the isolation region ST is provided so as to electrically isolate the plurality of elements from each other.

The isolation regions ST are made of an insulator such as silicon dioxide and can be formed by, e.g., a STI (Shallow Trench Isolation) method, a LOCOS (Local Oxidation of Silicon) method, or the like. The isolation regions ST are formed herein by the STI method.

Each of memory cells MC in MONOS (Metal Oxide Nitride Oxide Semiconductor) memories formed in the memory cell region 1A includes a control transistor and a memory transistor. The control transistor has a control gate electrode CG formed over the semiconductor substrate SB via a gate insulating film GI3 and a pair of source/drain regions formed in the upper surface of the semiconductor substrate SB located lateral to the control gate electrode CG. The gate insulating film GI3 is made of, e.g., a silicon dioxide film.

The memory transistor includes a memory gate electrode MG formed over the semiconductor substrate SB via an ONO (Oxide Nitride Oxide) film ON and a pair of source/drain regions formed in the upper surface of the semiconductor substrate SB located lateral to the memory gate electrode MG. The control gate electrode CG and the memory gate electrode MG are adjacent to each other via the ONO film ON. The control transistor and the memory transistor share the same source/drain regions. Note that, in the main surface of the semiconductor substrate SB located under the memory cell MC, a p-type well in which a p-type impurity (e.g., boron (B)) is introduced at a relatively low concentration is formed.

In the main surface of the semiconductor substrate SB located immediately below the control gate electrode CG and the memory gate electrode MG, i.e., in a channel region, a p-type impurity is introduced. Such introduction of an impurity into the channel region is performed so as to increase the threshold voltages of the control transistor and the memory transistor.

Note that, since the control transistor is the transistor for selecting the memory cell, the control transistor can also be regarded as a selection transistor. Accordingly, the control gate electrode CG can also be regarded as a selection gate electrode. The memory transistor is a storage transistor.

Each of the foregoing pair of source/drain regions has an $n^-$-type semiconductor region E3 as an extension region in which an n-type impurity (e.g., either or both of As (arsenic) and P (phosphorus)) is introduced at a relatively low concentration. Each of the foregoing pair of source/drain regions also has an $n^-$-type semiconductor region D3 in which an n-type impurity (e.g., only As (arsenic) or both of As (arsenic) and P (phosphorus)) is introduced at a relatively high concentration.

That is, each of the foregoing pair of source/drain regions has, in addition to the $n^-$-type semiconductor region D3 having a high n-type impurity concentration, the $n^-$-type semiconductor region E3 having an impurity concentration lower than that of the $n^-$-type semiconductor region D3, i.e., an LDD (Lightly doped Drain) structure. In each of the pair of source/drain regions, the $n^-$-type semiconductor region E3 is formed at a position closer to the control gate electrode CG and the memory gate electrode MG than the position of the $n^+$-type semiconductor region D3. That is, the $n^-$-type semiconductor region E3 and the $n^+$-type semiconductor region D3 are formed in the main surface of the semiconductor substrate SB, and the $n^-$-type semiconductor region E3 is disposed between the $n^-$-type semiconductor region D3 and the main surface of the semiconductor substrate SB located immediately below the control gate electrode CG. The $n^-$-type semiconductor region E3 is formed shallower than the $n^+$-type semiconductor region D3.

With the one of the side surfaces of a multi-layer film including the gate insulating film GI3 and the control gate electrode CG which is not adjacent to the memory gate electrode MG, a sidewall SW made of an insulating film is in contact, while the other side surface thereof is covered with the ONO film ON. The sidewall SW is made of a multi-layer film including, e.g., a silicon nitride film and a silicon dioxide film. Between the foregoing multi-layer film and the sidewall SW, an offset spacer made of, e.g., a silicon nitride film, a silicon dioxide film, or a multi-layer film thereof may also be formed.

The portion of the ONO film ON which is not in contact with the foregoing multi-layer film including the control gate electrode CG, i.e., the ONO film ON in contact with the upper surface of the semiconductor device SB extends along the upper surface of the semiconductor substrate SB. That is, with the one of the side surfaces of the foregoing multi-layer film, the ONO film ON extending in a direction perpendicular to the main surface of the semiconductor substrate SB is in contact. The ONO film ON has a bottom portion extending along the upper surface of the semiconductor substrate SB located lateral to the foregoing multi-layer film. That is, the ONO film ON has an L-shaped cross-sectional shape in a cross section along a gate length direction of each of the control gate electrode CG and the memory gate electrode MG and along a direction perpendicular to the main surface of the semiconductor substrate SB. In other words, the ONO film ON is formed continuously from the region between the memory gate electrode MG and the control gate electrode CG to the region between the memory gate electrode MG and the semiconductor substrate SB.

Figure 27:
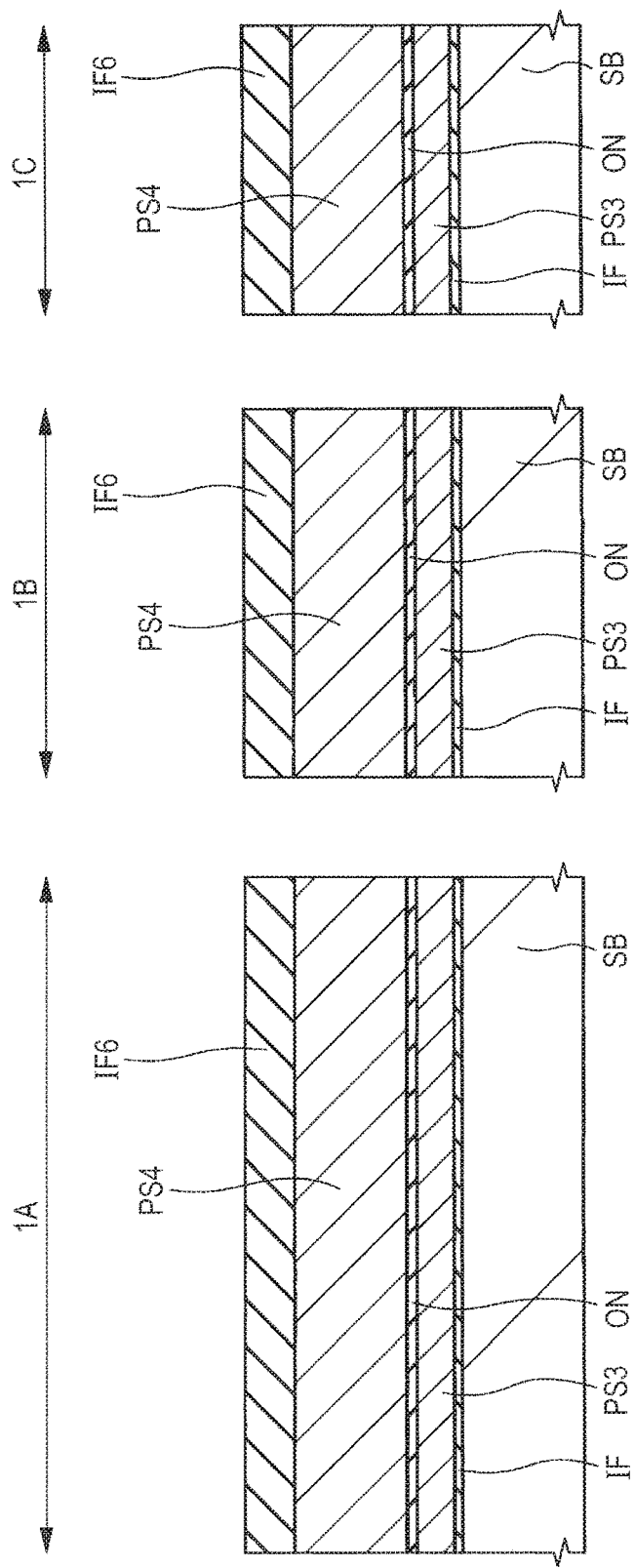
FIG. 27 is a cross-sectional view of the semiconductor device in Embodiment 3 during the manufacturing process thereof.

The ONO film ON is an insulating film for the gate insulating film of the memory transistor and has an internal charge storage portion (charge storage film or charge retention portion). Specifically, the ONO film ON is made of a multi-layer film including a silicon dioxide film OX1 (see FIG. 6) formed over the semiconductor substrate SB, a silicon nitride film NT (see FIG. 6) formed over the silicon dioxide film OX1, and a silicon dioxide film OX2 (see FIG. 6) formed over the silicon nitride film NT. In the present application, for improved clarity of illustration, the ONO film ON is shown in a single layer in each of the cross-sectional views other than FIGS. 6 and 27. However, the ONO film ON actually has a multi-layer structure, as described above. Between the memory gate electrode MG and the control gate electrode CG and between the memory gate electrode MG and the upper surface of the semiconductor substrate SB, the ONO film ON is interposed. Each of the silicon dioxide film OX1, the silicon nitride film NT, and the silicon dioxide film OX2 has an L-shaped cross-sectional shape. The film thickness of the ONO film ON is, e.g., 16 nm.

With the one of the side surfaces of a multi-layer film including the ONO film ON and the memory gate electrode MG which is opposite to the control gate electrode CG, the sidewall SW is in contact. Between the multi-layer film and the sidewall SW, an offset spacer may also be formed. The respective upper surfaces of the control gate electrode CG, the memory gate electrode MG, and the $n^+$-type semiconductor region D3 are exposed from the sidewalls SW.

To the respective upper surfaces of the control gate electrode CG, the memory gate electrode MG, and the pair of $n^+$-type semiconductor regions D3, contact plugs CP are coupled via silicide layers S1. Each of the contact plugs CP is a coupled metal film (conductive coupled portion) extending through an interlayer insulating film IL1 described later. Each of the silicide layers S1 is made of, e.g., a cobalt silicide layer, a nickel silicide layer, a nickel-platinum silicide layer, or the like. Each of the control gate electrode CG and the memory gate electrode MG is made of, e.g., a polysilicon film. Note that, in FIG. 1, the respective contact plugs electrically coupled to the control gate electrode CG and the memory gate electrode MG are not shown. The contact plugs are formed in another region.

Next, in the I/O region 1B, a higher-breakdown-voltage MISFET Q2 is formed. The higher-breakdown-voltage MISFET Q2 has a gate electrode G2 formed over the main surface of the semiconductor substrate SB via a gate insulating film GI2 and a pair of source/drain regions formed in the main surface of the semiconductor substrate SB located lateral to the gate electrode G2. Each of the source/drain regions has an $n^-$-type semiconductor region E2 as an extension region and an $n^+$-type semiconductor region D2 as a diffusion region having an impurity concentration higher than that of the $n^-$-type semiconductor region E2. The $n^-$-type semiconductor region E2 and the $n^-$-type semiconductor region D2 are formed in the main surface of the semiconductor substrate SB. The $n^-$-type semiconductor region E2 is disposed between the $n^+$-type semiconductor region D2 and the main surface of the semiconductor substrate SB located immediately below the gate electrode G2.

The $n^-$-type semiconductor region E2 is a region in which an n-type impurity (e.g., As (arsenic), P (phosphorus), or both of As and P) is introduced at a relatively low concentration in the main surface of the semiconductor substrate SB. On the other hand, the $n^+$-type semiconductor region D2 is a diffusion region in which an n-type impurity (e.g., only As (arsenic) or both of As (arsenic) and P (phosphorus)) is introduced at a relatively high concentration.

The gate insulating film GI2 has a film thickness of, e.g., about 15 nm and made of, e.g., a silicon dioxide film. The gate electrode G2 is made of, e.g., a polysilicon film. The side surfaces of the gate electrode G2 are covered with the sidewalls SW. The sidewalls SW expose the upper surface of the gate electrode G2. In the main surface of the semiconductor substrate SB located under the MISFET Q2, the p-type well in which a p-type impurity (e.g., B (boron)) is introduced at a relatively low concentration is formed, though the illustration thereof is omitted. To the respective upper surfaces of the pair of n$^-$-type semiconductor regions D2, the contact plugs CP are coupled via the silicide layers S1. To the gate electrode G2 also, the contact plug CP is electrically coupled. Note that, in FIG. 1, the contact plug electrically coupled to the gate electrode G2 is not shown. The contact plug is formed in another region.

The lower-breakdown-voltage MISFET Q1 has a gate electrode G1 formed over the main surface of the semiconductor substrate SB via a gate insulating film GI1 and a pair of source/drain regions formed in the main surface of the semiconductor substrate SB located lateral to the gate electrode G1. Similarly to each of the source/drain regions formed in the memory cell region 1A, each of the source/drain regions has an n$^-$-type semiconductor region E1 as an extension region and an n$^+$-type semiconductor region D1 as a diffusion region having an impurity concentration higher than that of the n$^-$-type semiconductor region E1. The n$^-$-type semiconductor region E1 and the n$^+$-type semiconductor region D1 are formed in the main surface of the semiconductor substrate SB. The n$^-$-type semiconductor region E1 is disposed between the n$^-$-type semiconductor region D1 and the main surface of the semiconductor substrate SB located immediately below the gate electrode G1.

The gate insulating film GI1 has a film thickness of, e.g., about 2 nm and made of, e.g., a silicon dioxide film. The gate electrode G1 is made of, e.g., a polysilicon film. The side surfaces of the gate electrode G1 are covered with the sidewalls SW. The sidewalls SW expose the upper surface of the gate electrode G1. In the main surface of the semiconductor substrate SB located under the MISFET Q1, the p-type well in which a p-type impurity (e.g., B (boron)) is introduced at a relatively low concentration is formed, though the illustration thereof is omitted. Onto the respective upper surfaces of the gate electrode G1 and the pair of n$^+$-type semiconductor regions D1, the contact plugs CP are coupled via the silicide layers S1. Note that, in FIG. 1, the contact plug electrically coupled to the gate electrode G1 is not shown. The contact plug is formed in another region.

The length (gate length) of the gate electrode G2 in a gate length direction thereof is larger than the length (gate length) of the gate electrode G1 in a gate length direction thereof. The distance between the pair of source/drain regions in the I/O region 1B is larger than the distance between the pair of source/drain regions in the logic region 1C. The gate length of the gate electrode G2 is the length of the gate electrode G2 in a direction orthogonal to a gate width direction as a longitudinal direction of the gate electrode G2 extending in a depth direction in FIG. 1. That is, the gate length direction is a direction in which the pair of source/drain regions face each other with the gate electrode G2 being interposed therebetween in plan view, which is the length of the gate electrode G2 in a lateral direction thereof.

The reason why the gate electrode G2 thus has the large gate length and the gate insulating film GI2 thus has the large thickness is that, since the MISFET Q2 is the element used for the supply of a high voltage to the memory cell MC or the like, the breakdown voltage of the MISFET Q2 needs to be increased. By contrast, to the lower-breakdown-voltage MISFET Q1, such a high voltage as applied to the MISFET Q2 is not applied. Since the MISFET Q1 is an element required to perform a high-speed operation, the gate length of the gate electrode G1 is relatively small, and the thickness of the gate insulating film GI1 is relatively small.

One of the characteristic features of the semiconductor device in Embodiment 1 is that the n$^-$-type semiconductor regions D2 as the diffusion regions are deeper than each of the n$^-$-type semiconductor regions D1 and D3. In other words, each of the source/drain regions including the n$^+$-type semiconductor regions D2 has a depth larger than that of each of the source/drain regions including the n$^+$-type semiconductor regions D1 and that of each of the source/drain regions including the n$^+$-type semiconductor regions D3. Note that the depth of each of the source/drain regions mentioned in the present application means the depth of each of the n$^-$-type semiconductor regions D1 to D3, not the depth of each of the n$^-$-type semiconductor regions E1 to E3.

When a depth of a semiconductor region formed in the main surface (upper surface) of the semiconductor substrate SB is mentioned in the present application, the depth indicates a distance in a direction (height direction, depth direction, or perpendicular direction) perpendicular to the main surface of the semiconductor substrate SB, which is a distance from the upper surface of the semiconductor substrate SB to the lower surface of the semiconductor region located at the lowermost position thereof (closer to the back surface of the semiconductor substrate SB).

Specifically, the n$^+$-type semiconductor region D2 has the depth which is not less than twice the depth of each of the n$^+$-type semiconductor regions D1 and D3. For example, the depth of each of the n$^+$-type semiconductor regions D1 and D3 is 80 nm, while the depth of the n$^-$-type semiconductor region D2 is 160 nm. Accordingly, the area of each of the facing side surfaces of the pair of n$^+$-type semiconductor regions D2 is larger than the area of each of the facing side surfaces of the pair of n$^-$-type semiconductor regions D3 and the area of each of the facing side surfaces of the pair of n$^+$-type semiconductor regions D1. Note that the depth of the position in each of the n$^-$-type semiconductor regions D1 and D3 where the impurity concentration is highest is, e.g., 40 nm, while the depth of the position in each of the n$^+$-type semiconductor regions D2 where the impurity concentration is highest is, e.g., 80 nm.

One of the characteristic features of the semiconductor device in Embodiment 1 is that the upper surface of the gate electrode G2 is covered with the ONO film ON and a silicon film (conductive film) PS2 which are formed in this order over the gate electrode G2. A film (first film) including the ONO film ON and the silicon film PS2 is in contact with the upper surface of the gate electrode G2. Each of the ONO film ON and the silicon film PS2 in the I/O region 1B has the same length as that of the gate electrode G2 in the gate length direction of the gate electrode G2. Immediately above each of the control gate electrode CG, the memory gate electrode MG, and the gate electrode G1, neither the ONO film nor a polysilicon film is formed. The ONO film ON in the memory cell region 1A and the ONO film ON over the gate electrode G2 are originally made of one film that is divided in the manufacturing process. That is, the ONO film in the memory cell region 1A and the ONO film over the gate electrode G2 are in the same layer and contain silicon dioxide and silicon nitride as the same materials.

The heights of the respective upper surfaces of the control gate electrode CG and the gate electrodes G1 and G2 are substantially the same. The height mentioned herein indicates a distance in the height direction, which is a distance from the main surface of the semiconductor substrate SB unless particularly described. Accordingly, the height of a multi-layer pattern including the gate insulating film GI2, the gate electrode G2, the ONO film ON, and the silicon film PS2 is larger than the height of each of a pattern including the gate insulating film GI3, the control gate electrode CG, the ONO film ON, and the memory gate electrode MG and a multi-layer pattern including the gate insulating film GI1 and the gate electrode G1.

Consequently, the height of each of the sidewalls SW formed over the side surfaces of the multi-layer pattern including the gate insulating film GI2, the gate electrode G2, the ONO film ON, and the silicon film PS2 is larger than the height of each of the sidewall SW formed over the side surface of the control gate electrode CG and the sidewalls SW formed over the side surfaces of the gate electrode G1. In other words, the sidewalls SW covering the side surfaces of the gate electrode G2 in the I/O region 1B also cover the respective side surfaces of the ONO film ON and the silicon film PS2. Note that the sidewalls SW in the I/O region 1B expose the respective upper surfaces of the ONO film ON and the silicon film PS2.

The ONO film ON and the silicon film PS2 which are located immediately above the gate electrode G2 are formed below the upper surface of the interlayer insulating film IL1 in which the contact plugs CP are embedded. That is, over the semiconductor substrate SB, the interlayer insulating film IL1 covering the memory cell MC, the MISFETs Q1 and Q2, the sidewalls SW, the silicide layers S1, and the ONO film ON and the silicon film PS2 which are located immediately above the gate electrode G2 is formed. In other words, the interlayer insulating film IL1 does not expose the respective upper surfaces of the control gate electrode CG, the silicon film PS2, and the gate electrode G1. The upper surface of the silicon film PS2 is closer to the upper surface of the interlayer insulating film IL1 than the respective upper surfaces of the control gate electrode CG and the gate electrode G1. Accordingly, the position of the lower surface of the interlayer insulating film IL1 located immediately above the gate electrode G2 is higher than the position of the lower surface of the interlayer insulating film IL1 located immediately above each of the control gate electrode CG and the gate electrode G1.

The plurality of contact plugs CP are formed so as to extend through the interlayer insulating film IL1. The upper surface of the interlayer insulating film IL1 is planarized to be located at generally the same height as that of each of the respective upper surfaces of the plurality of contact plugs CP. The interlayer insulating film IL1 is made mainly of, e.g., a silicon dioxide film.

Over the interlayer insulating film IL1 and the contact plug CP, an interlayer insulating film IL3 is formed. The interlayer insulating film Il3 is made mainly of, e.g., a silicon dioxide film. The interlayer insulating film IL3 has a plurality of wire trenches extending from the upper surface thereof to reach the lower surface thereof. In each of the wire trenches, a wire M1 is embedded. The wire M1 is made mainly of, e.g., Cu (copper) and formed by, e.g., a so-called single damascene method. The upper surfaces of the wires M1 and the upper surface of the interlayer insulating film IL3 are planarized in generally the same plane. The interlayer insulating film IL3 and the plurality of wires M1 form a first wiring layer. The first wiring layer is located over the main surface of the semiconductor substrate SB and closest to the main surface of the semiconductor substrate SB.

The bottom surfaces of the wires M1 are coupled to the upper surfaces of the contact plugs CP. That is, the wires M1 are electrically coupled individually to the control gate electrode CG, the memory gate electrode MG, the gate electrodes G1 and G2, and the $n^+$-type semiconductor regions D1 and D3 via the contact plugs CP and the silicide layers S1. Note that the wires M1 electrically coupled to the control gate electrode CG, the memory gate electrode MG, and the gate electrodes G1 and G2 are formed in another region not shown in FIG. 1.

The ONO film ON and the silicon film PS2 which are located immediately above the gate electrode G2 are located below the lower surfaces of the wires M1, the upper surfaces of the contact plugs CP, and the upper surface of the interlayer insulating film IL1.

Next, a description will be given of a configuration of a semiconductor chip CHP shown in FIG. 2. The semiconductor chip CHP has a rectangular shape in plan view. Over a semiconductor substrate forming the semiconductor chip CHP, various semiconductor elements are mounted. The main surface of the semiconductor chip CHP includes the memory cell region 1A having the plurality of MONOS memories to which data is rewritten and the logic region 1C where a logic circuit and the like are formed. The semiconductor chip CHP has the I/O region 1B surrounding the periphery of each of the memory cell region 1A and the logic region 1C. In the I/O region 1B, e.g., a power supply circuit for rewriting or an external input/output circuit which performs input/output operations with a device outside the semiconductor chip CHP is provided.

Operation of Nonvolatile Memory

Next, referring to FIG. 47, a description will be given of an example of operations to the nonvolatile memory.

FIG. 47 is a table showing an example of conditions under which voltages are applied to the individual portions of the selected memory cell during "Write", "Erase", and "Read" operations in Embodiment 1. In the table of FIG. 47, a voltage Vmg applied to the memory gate electrode MG of the memory cell MC shown in FIG. 1, a voltage Vs applied to the source region thereof, a voltage Vcg applied to the control gate electrode CG thereof, a voltage Vd applied to the drain region thereof, and a base voltage Vb applied to the p-type well thereof in the upper surface of the semiconductor substrate SB during each of the "Write", "Erase", and "Read" operations are shown. The selected memory cell mentioned herein refers to a memory cell selected as a target to which the "Write", "Erase", or "Read" operation is to be performed. Note that, in the example of the nonvolatile memory shown in FIG. 1, the active region on the right of the memory gate electrode MG is the source region, while the active region on the left of the control gate electrode CG is the drain region.

Note that, what is shown in the table of FIG. 47 is a preferred example of the conditions for voltage application. The conditions for voltage application are not limited thereto and can variously be changed as necessary. In Embodiment 1, the injection of electrons into the silicon nitride film NT (see FIG. 6) as the internal charge storage portion of the ONO film ON of the memory transistor is defined as the "Write" operation, and the injection of holes (positive holes) into the silicon nitride film NT is defined as the "Erase" operation.

Note that, in the table of FIG. 47, the row A corresponds to the case where an SSI method is used as a write method and a BTBT method is used as an erase method. The row B corresponds to the case where the SSI method is used as the write method and a FN method is used as the erase method.

The row C corresponds to the case where the FN method is used as the write method and the BTBT method is used as the erase method. The row D corresponds to the case where the FN method is used as each of the write method and the erase method.

The SSI method can be regarded as an operation method which injects hot electrons into the silicon nitride film NT to perform a write operation to the memory cell. The BTBT method can be regarded as an operation method which injects hot holes into the silicon nitride film NT to perform an erase operation to the memory cell. The FN method can be regarded as an operation method which uses the tunneling of electrons or holes to perform a write operation or an erase operation. In other words, a write operation in accordance with the FN method can be regarded as an operation method which injects electrons into the silicon nitride film NT using a FN tunnel effect to perform a write operation to the memory cell, and an erase operation in accordance with the FN method can be regarded as an operation method which injects holes into the silicon nitride film NT using the FN tunnel effect to perform an erase operation to the memory cell. A specific description will be given below.

A write method is subdivided into a write method (hot electron injection write method) called the SSI (Source Side Injection) method which performs a write operation by performing hot electron injection in accordance with source side injection, and a write method (tunneling write method) called the FN (Fowler Nordheim) method which performs a write operation using FN tunneling.

A write operation in accordance with the SSI method is performed by applying, e.g., voltages (Vmg=10 V, Vs=5 V, Vcg=1 V, Vd=0.5 V, and Vb=0 V) as shown as "Write Operation Voltages" in the row A or B in the table of FIG. 47 to the individual portions of the selected memory cell to which the write operation is to be performed and injecting electrons into the silicon nitride film NT in the ONO film ON of the selected memory cell.

At this time, hot electrons are generated in the channel region (between the source and drain regions) under the space between the two gate electrodes (memory gate electrode MG and control gate electrode CG) and injected into the silicon nitride film NT as the internal charge storage portion of the ONO film ON under the memory gate electrode MG. The injected hot electrons (electrons) are trapped by the trap level in the silicon nitride film NT in the ONO film ON, resulting in an increase in the threshold voltage of the memory transistor. That is, the memory transistor is brought into a written state.

A write operation in accordance with the FN method is performed by applying, e.g., voltages (Vmg=-12 V, Vs=0 V, Vcg=0 V, Vd=0 V, and Vb=0 V) as shown as "Write Operation Voltages" in the row C or D in the table of FIG. 47 to the individual portions of the selected memory cell to which the write operation is to be performed and causing tunneling of electrons from the memory gate electrode MG in the selected memory cell and injection thereof into the silicon nitride film NT in the ONO film ON. At this time, the electrons from the memory gate electrode MG tunnel through the silicon dioxide film OX2 (see FIG. 6) by FN tunneling (under the FN tunnel effect) to be injected into the ONO film ON and trapped by the trap level in the silicon nitride film NT in the ONO film ON, resulting in an increase in the threshold voltage of the memory transistor. That is, the memory transistor is brought into the written state.

Note that the write operation in accordance with the FN method can also be performed by causing tunneling of electrons from the semiconductor substrate SB and injection thereof into the silicon nitride film NT in the ONO film ON. In this case, the write operation voltages can be, e.g., voltages obtained by inverting the positive/negative signs of the "Write Operation Voltages" in the row C or D in the table of FIG. 47.

An erase method is subdivided into an erase method (hot hole injection erase method) called the BTBT (Band-To-Band Tunneling phenomenon) method which performs an erase operation by hot hole injection using the BTBT, and an erase method (tunneling erase method) called the FN (Fowler Nordheim) method which performs an erase operation using the FN tunneling.

An erase operation in accordance with the BTBT method is performed by injecting holes (positive holes) generated by the BTBT into the charge storage portion (silicon nitride film NT in the ONO film ON). For example, voltages (Vmg=-6 V, Vs=6 V, Vcg=0 V, Vd=open, and Vb=0 V) as shown as "Erase Operation Voltages" in the row A or C in the table of FIG. 47 are applied to the individual portions of the selected memory cell to which the erase operation is to be performed. Thus, the holes are generated using the BTBT phenomenon and subjected to electric field acceleration to be injected into the silicon nitride film NT in the ONO film ON of the selected memory cell, thus reducing the threshold voltage of the memory transistor. That is, the memory transistor is brought into an erased state.

An erase operation in accordance with the FN method is performed by applying, e.g., voltages (Vmg=12 V, Vs=0 V, Vcg=0 V, Vd=0 V, and Vb=0 V) as shown as "Erase Operation Voltages" in the row B or D in the table of FIG. 47 to the individual portions of the selected memory cell to which the erase operation is to be performed and causing tunneling of holes from the memory gate electrode MG in the selected memory cell and injection thereof into the silicon nitride film NT in the ONO film ON. At this time, the holes from the memory gate electrode MG tunnel through the silicon dioxide film OX2 (see FIG. 6) by the FN tunneling (under the FN tunnel effect) to be injected into the ONO film ON and trapped by the trap level in the silicon nitride film NT in the ONO film ON, resulting in a reduction in the threshold voltage of the memory transistor. That is, the memory transistor is brought into an erased state.

Note that the erase operation in accordance with the FN method can also be performed by causing tunneling of holes from the semiconductor substrate SB and injection thereof into the silicon nitride film NT in the ONO film ON. In this case, the erase operation voltages can be, e.g., voltages obtained by inverting the positive/negative signs of the "Erase Operation Voltages" in the row B or D in the table of FIG. 47.

During a read operation, e.g., voltages as shown as "Read Operation Voltages" in the row A, B, C, or D in the table of FIG. 47 are applied to the individual portions of the selected memory cell to which the read operation is to be performed. By setting the voltage Vmg to be applied to the memory gate electrode MG during the read operation to a value between the threshold voltage of the memory transistor in the written state and the threshold voltage thereof in the erased state, the written state or the erased state can be determined.

Manufacturing Method of Semiconductor Device

Referring to FIGS. 3 to 14, a method of manufacturing the semiconductor device in Embodiment 1 will be described.

FIGS. 3 to 14 are cross-sectional views showing the semiconductor device in Embodiment 1 during the manufacturing process thereof. FIGS. 3 to 14 show the cross-sectional views of the memory cell region 1A, the I/O region 1B, and the logic region 1C which are arranged in this order in the left-to-right direction in the drawing. FIGS. 3 to 14 show the memory cell of the nonvolatile memory, the higher-breakdown-voltage MISFET, and the lower-breakdown-voltage MISFET which are being formed in the memory cell region 1A, the I/O region 1B, and the logic region 1C, respectively.

In the case described herein, the n-channel MISFETs (control transistor and memory transistor) are formed in the memory cell region 1A. However, it is also possible to invert the conductivity type and form p-channel MISFETs (control transistor and memory transistor) in the memory cell region 1A. Likewise, in the case described herein, n-channel MISFETs are formed in the I/O region 1B and the logic region 1C. However, it is also possible to invert the conductivity type and form p-channel MISFETs in the I/O region 1B and the logic region 1C. Alternatively, it is also possible to form both of n-channel MISFETs and p-channel MISFETs in the I/O region 1B and the logic region 1C, i.e., form CMISFETs.

Figure 3:
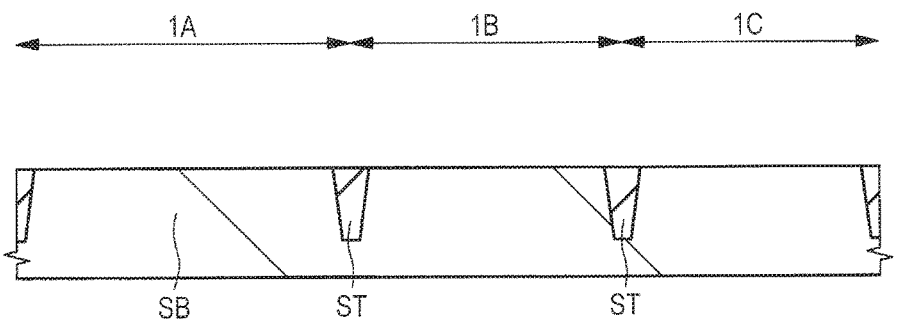
FIG. 3 is a cross-sectional view of the semiconductor device in Embodiment 1 during the manufacturing process thereof.

In the manufacturing process of the semiconductor device, first, as shown in FIG. 3, the semiconductor substrate (semiconductor wafer) SB made of p-type monocrystalline silicon (Si) having a specific resistance of, e.g., about 1 to 10 Ωcm or the like is provided. Then, in the main surface of the semiconductor substrate SB, the plurality of isolation regions ST defining active regions are formed.

Each of the isolation regions ST is made of an insulator such as silicon dioxide and can be formed by, e.g., a STI method, a LOCOS method, or the like. A description will be given herein of the formation of the isolation regions using the STI method.

That is, a silicon dioxide film and a silicon nitride film are stacked in this order over the semiconductor substrate SB. Then, using a photolithographic technique and a dry etching method, the silicon nitride film and the silicon dioxide film are etched, and trenches are further formed in the upper surface of the semiconductor substrate SB. The plurality of trenches are formed.

Subsequently, in these trenches, an insulating film made of, e.g., silicon dioxide is embedded. Then, by a polishing step or the like, each of the insulating films over the semiconductor substrate SB is removed therefrom to form the plurality of isolation regions ST. The isolation regions ST are formed between, e.g., the memory cell region 1A and the I/O region 1B and between the I/O region 1B and the logic region 1C. Thus, the structure shown in FIG. 3 is obtained.

Next, in the main surface of the semiconductor substrate SB located in the memory cell region 1A, the I/O region 1B, and the logic region 1C, the p-type wells are formed, though the illustration thereof is omitted. The p-type wells can be formed by ion implantation of a p-type impurity such as, e.g., B (boron) into the semiconductor substrate SB or the like. Note that the p-type wells formed in the respective regions where the memory cells, the higher-breakdown-voltage MISFET, and the lower-breakdown-voltage MISFET are formed can be formed by the same ion implantation step, but can also be performed by different ion implantation steps by individually performing patterning during implantation for the purpose of optimizing the properties of the individual elements.

Figure 4:
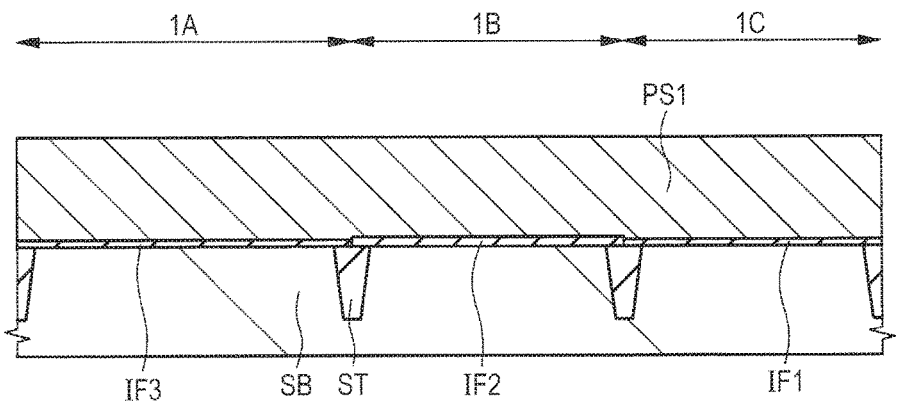
FIG. 4 is a cross-sectional view of the semiconductor device during the manufacturing process thereof, which is subsequent to FIG. 3.

Next, as shown in FIG. 4, over the main surface of the semiconductor substrate SB, insulating films IF1 to IF3 for gate insulating films are formed. That is, the insulating film IF3 is formed over the upper surface of the semiconductor substrate SB located in the memory cell region 1A, the insulating film IF2 is formed over the upper surface of the semiconductor substrate SB located in the I/O region 1B, and the insulating film IF1 is formed over the upper surface of the semiconductor substrate SB located in the logic region 1C. As each of the insulating films IF1 to IF3, e.g., a silicon dioxide film can be used. The insulating films IF1 and IF3 are formed in the same step. The insulating film IF2 has a film thickness larger than that of each of the insulating films IF1 and IF3. The film thickness of each of the insulating films IF1 and IF3 is, e.g., 2 nm, while the film thickness of the insulating film IF2 is, e.g., 15 nm.

In the step of forming the insulating films IF1 to IF3, first, over the upper surface of the semiconductor substrate SB, the insulating film IF2 having a relatively large film thickness is formed by an ISSG (In-Situ Steam Generation) oxidation method. Then, using a photolithographic technique and an etching method, the insulating film IF2 is left in the I/O region 1B, while the insulating film IF2 in the other regions is removed therefrom. Subsequently, using a thermal oxidation method or the like, in the memory cell region 1A and the logic region 1C, the insulating films IF3 and IF1 each having a relatively small film thickness are formed over the semiconductor substrate SB.

Note that there are cases where the film thickness of the insulating film IF3 is intended to be larger than the film thickness of the insulating film IF1. In such cases, when the foregoing insulating film IF2 is left and the insulating film IF2 in the other regions is removed therefrom, the insulating film IF2 is left in the region including the region where the insulating film IF1 is formed, and then the insulating film IF3 is formed. Subsequently, the insulating films in the region where the insulating film IF1 is formed, i.e., a multi-layer film including the insulating films IF2 and IF3 is removed using a photolithographic technique and an etching method. Then, the insulating film IF1 thinner than the insulating film IF3 is formed to thus allow the insulating film IF3 to have a film thickness larger than that of the insulating film IF1.

Then, using, e.g., a CVD (Chemical Vapor Deposition) method, a silicon film (conductive film) PS1 made of a polycrystalline silicon film is formed over the semiconductor substrate SB. It is also possible to form an amorphous silicon film as the silicon film PS1 during the deposition thereof and then change the silicon film PS1 made of the amorphous silicon film to the silicon film PS1 made of the polycrystalline silicon film by subsequent heat treatment. The silicon film PS1 can also be changed to a low-resistance semiconductor film (doped polysilicon film) by performing the introduction of an impurity into the silicon film PS1 during the deposition thereof, the ion implantation of an impurity into the silicon film PS1 after the deposition thereof, or the like. The film thickness of the silicon film PS1 is, e.g., about 250 nm.

Figure 5:
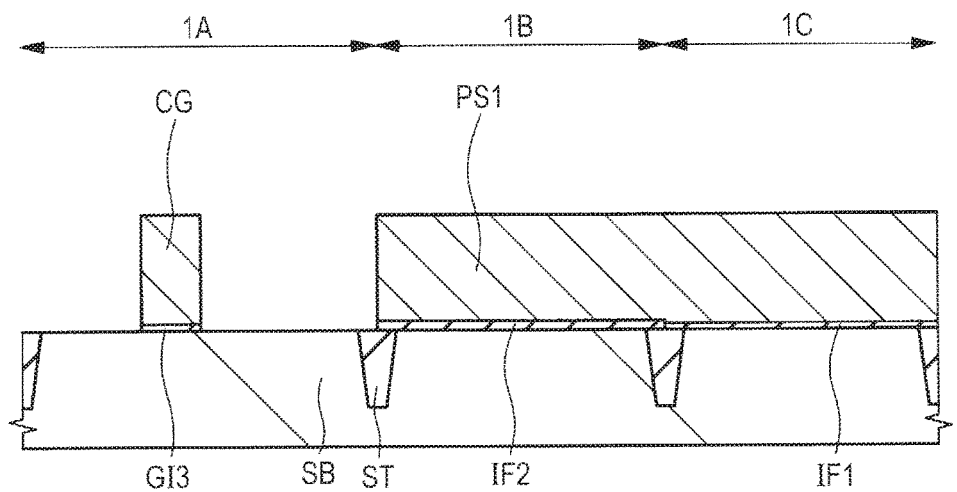
FIG. 5 is a cross-sectional view of the semiconductor device during the manufacturing process thereof, which is subsequent to FIG. 4.

Next, as shown in FIG. 5, a multi-layer film including the silicon film PS1 and the insulating film IF3 located in the memory cell region 1A is patterned using a photolithographic technique and an etching technique. As a result, in the memory cell region 1A, the gate insulating film GI3 made of the insulating film IF3 is formed. Also, by the etching step, the control gate electrode CG made of the silicon film PS1 is formed in the memory cell region 1A. The control gate electrode CG is in a pattern extending in a predetermined direction in plan view. The predetermined direction is a depth direction in FIG. 5.

Figure 6:
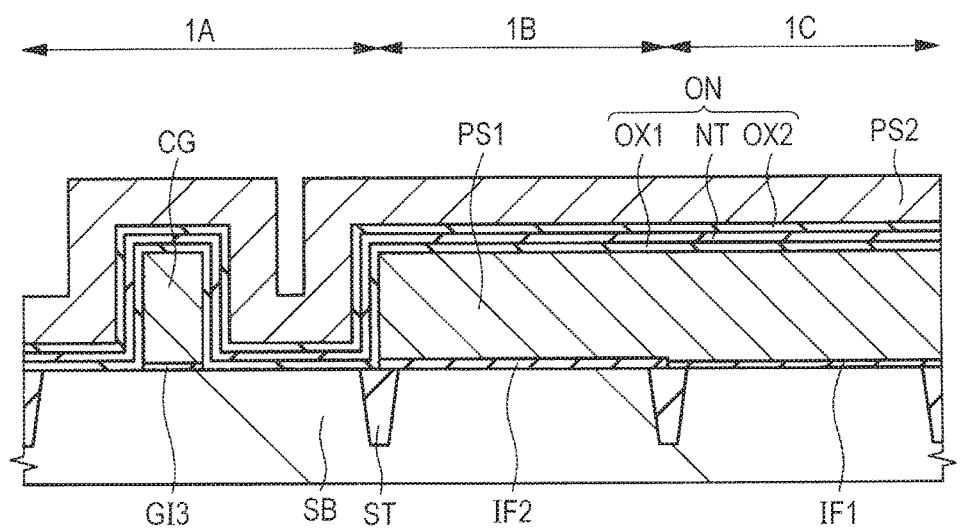
FIG. 6 is a cross-sectional view of the semiconductor device during the manufacturing process thereof, which is subsequent to FIG. 5.

Next, as shown in FIG. 6, over the entire main surface of the semiconductor substrate SB, the ONO (Oxide Nitride Oxide) film ON for the gate insulating film of the memory transistor is formed. The ONO film ON covers the upper surface of the semiconductor substrate SB and the side and upper surfaces of a multi-layer film including the gate insulating film GI3 and the control gate electrode CG in the memory cell region 1A. The ONO film ON also covers the side and upper surfaces of a film including the insulating films IF1 and IF2 and the silicon film PS1 in the I/O region 1B and the logic region 1C.

The ONO film ON is an insulating film having an internal charge storage portion (charge storage film or charge retention portion). Specifically, the ONO film ON is made of the multi-layer film including the silicon dioxide film OX1 formed over the semiconductor substrate SB, the silicon nitride film NT formed over the silicon dioxide film OX1, and the silicon dioxide film OX2 formed over the silicon nitride film NT. The silicon nitride film NT has the function of the charge storage portion.

The silicon dioxide films OX1 and OX2 can be formed by, e.g., an oxidation process (thermal oxidation process), a CVD method, or a combination of the oxidation process and the CVD method. In the oxidation process performed at this time, ISSG oxidation can also be used. The silicon nitride film NT can be formed by, e.g., a CVD method.

In Embodiment 1, as the insulating film (charge storage layer) having the trap level, the silicon nitride film NT is formed. As the film used as the charge storage portion, a silicon nitride film is appropriate in terms of reliability or the like. However, the film used as the charge storage portion is not limited to the silicon nitride film. It is also possible to use a high-dielectric-constant film (high-dielectric-constant insulating film) having a dielectric constant higher than that of the silicon nitride film, such as, e.g., an aluminum oxide (alumina) film, a hafnium oxide film, or a tantalum oxide film as the charge storage portion. Note that, when the ONO film ON is formed, a pattern made of the silicon film PS1 formed over the semiconductor substrate SB or the like may conceivably be exposed to a high temperature.

The thickness of the silicon dioxide film OX1 can be set to, e.g., about 2 to 10 nm. The thickness of the silicon nitride film NT can be set to, e.g., about 5 to 15 nm. The thickness of the silicon dioxide film OX2 can be set to, e.g., about 2 to 10 nm. The film thickness of the ONO film is, e.g., 16 nm.

Subsequently, over the entire main surface of the semiconductor substrate SB, the polycrystalline silicon film (conductive film) PS2 is formed using, e.g., a CVD method so as to cover the top surface of the ONO film ON. As a result, the side and upper surfaces of the ONO film ON exposed in the memory cell region 1A is covered with the silicon film PS2. That is, over the side surfaces of the control gate electrode CG, the silicon film PS2 is formed via the ONO film ON. The film thickness of the silicon film PS2 is, e.g., 65 nm. It is also possible to form an amorphous silicon film as the silicon film PS2 during the deposition thereof and then change the silicon film PS2 made of the amorphous silicon film to the silicon film PS2 made of the polycrystalline silicon film by subsequent heat treatment. The silicon film PS2 is a film in which, e.g., a p-type impurity (e.g., B (boron)) is introduced at a relatively high concentration.

The silicon film PS2 is a film for forming the memory gate electrode MG described later. The silicon film PS2 has the function of increasing the height of a multi-layer pattern including the gate electrode formed in the I/O region 1B.

When the film thickness of a specific film is mentioned herein, the film thickness means the thickness of the film in a direction perpendicular to the surface of the underlay of the film. For example, when the silicon film PS2 is formed over and along a surface extending along the main surface of the semiconductor substrate SB, such as the upper surface of the ONO film ON, the film thickness of the silicon film PS2 means the thickness of the silicon film PS2 in a direction perpendicular to the main surface of the semiconductor substrate SB. The thickness of the portion of the silicon film PS2 which is formed in contact with a wall perpendicular to the main surface substrate SB, such as the side surface of the ONO film ON, means the thickness of the silicon film PS2 in a direction perpendicular to the side surface.

Figure 7:
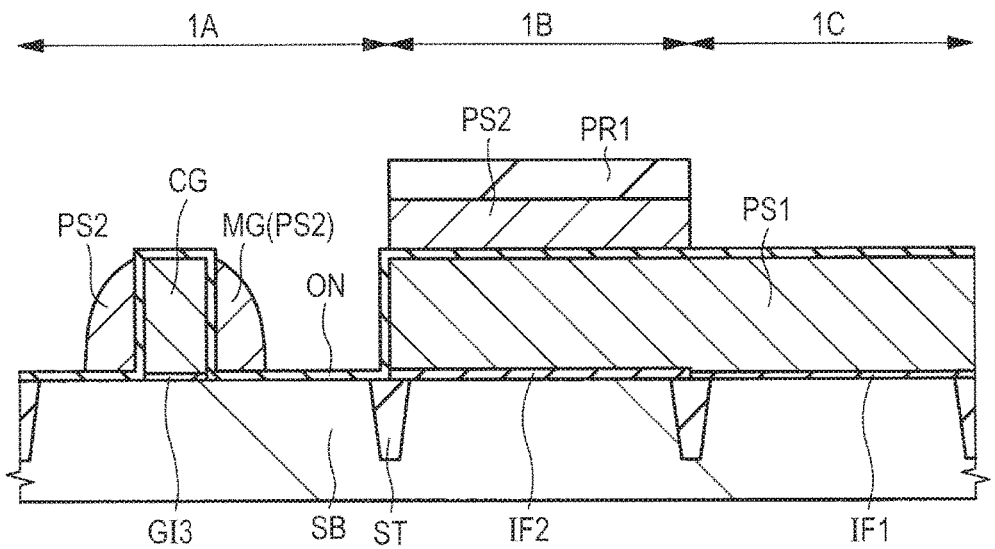
FIG. 7 is a cross-sectional view of the semiconductor device during the manufacturing process thereof, which is subsequent to FIG. 6.

Next, as shown in FIG. 7, a photoresist film PR1 covering the upper surface of the silicon film PS2 in the I/O region 1B is formed over the semiconductor substrate SB. Then, using the photoresist film PR1 as a mask (etching prevention mask), the silicon film PS2 is etched back (by dry etching or anisotropic etching) to expose the upper surface of the ONO film ON located in the memory cell region 1A and the logic region 1C.

In the etch-back step, the silicon film PS2 is anisotropically etched (etched back) to be left in the form of side walls over the both side surfaces of the multi-layer film including the gate insulating film GI3 and the control gate electrode CG via the ONO film ON. As a result, in the memory cell region 1A, the memory gate electrode MG made of the silicon film PS2 left in the form of the side wall is formed over one of the side surfaces of the foregoing multi-layer film via the ONO film ON. At this stage, the silicon film PS2 in the I/O region 1B, which is covered with the photoresist film PR1 as a protection film, is not removed and remains, while the silicon film PS2 in the logic region 1C, which is exposed from the photoresist film PR1, is removed.

Figure 8:
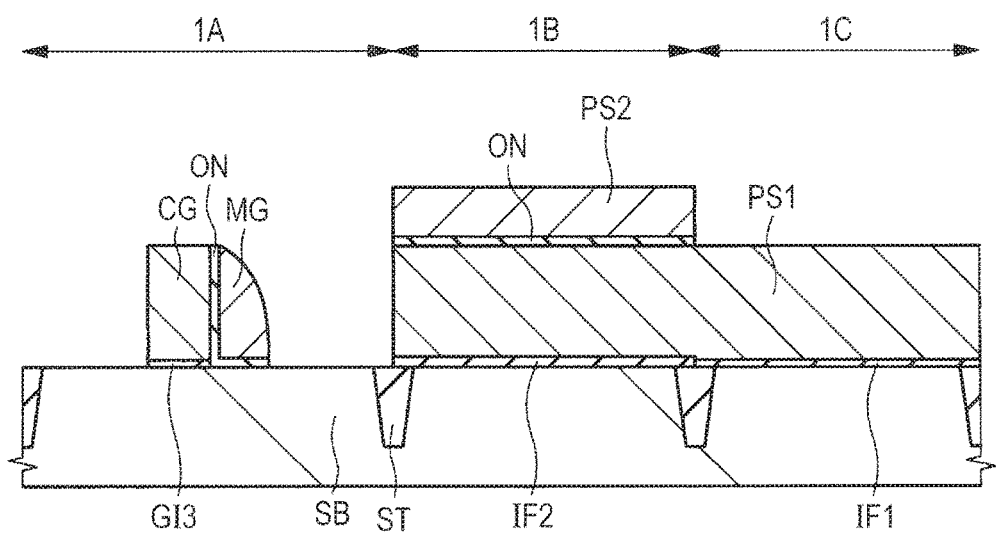
FIG. 8 is a cross-sectional view of the semiconductor device during the manufacturing process thereof, which is subsequent to FIG. 7.

Next, as shown in FIG. 8, the photoresist film PR1 is removed. Then, using a photolithographic technique, a photoresist pattern (not shown) covering the memory gate electrode MG adjacent to the one of the side surfaces of the control gate electrode CG and exposing the silicon film PS2 adjacent to the other side surface of the control gate electrode CG is formed over the semiconductor substrate SB. The photoresist pattern covers the upper surface of the silicon film PS2 in the I/O region 1B. Then, using the photoresist pattern as an etching mask, etching is performed to remove the silicon film PS2 formed opposite to the memory gate electrode MG relative to the control gate electrode CG interposed therebetween. After that, the photoresist pattern is removed. At this time, the memory gate electrode MG covered with the photoresist pattern is not etched and remains. Likewise, the silicon film PS2 in the I/O region 1B also remains over the ONO film ON.

Subsequently, of the ONO film ON, the exposed portion uncovered with the memory gate electrode MG is removed by etching (e.g., dry etching). At this time, in the memory cell region 1A, the ONO film ON located immediately below the memory gate electrode MG is not removed and remains. Likewise, the ONO film ON located between the multi-layer film including the gate insulating film GI3 and the control gate electrode CG and the memory gate electrode MG is not removed and remains. Since the ONO film ON is removed from the other region, the upper surface of the semiconductor substrate SB located in the memory cell region 1A is exposed, and the upper surface of the silicon film PS1 located in the memory cell region 1A and the logic region 1C are also exposed. Also, the side surface of the control gate electrode CG which is not adjacent to the memory gate electrode MG is exposed. On the other hand, the upper surface of the silicon film PS1 located in the I/O region 1B is covered with the ONO film ON and the silicon film PS2.

Thus, over the semiconductor substrate SB, the memory gate electrode MG is formed via the ONO film ON having the internal charge storage portion so as to be adjacent to the control gate electrode CG.

Figure 9:
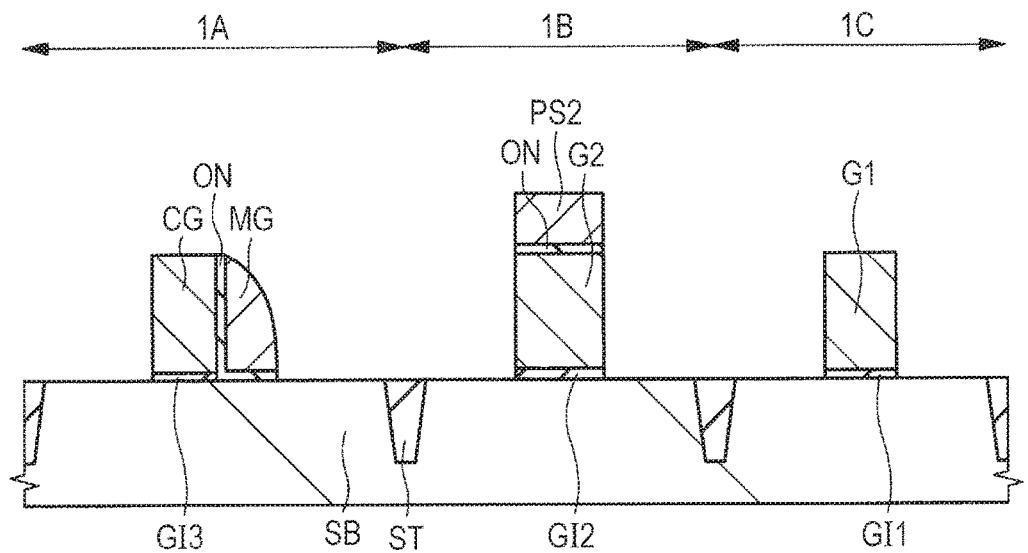
FIG. 9 is a cross-sectional view of the semiconductor device during the manufacturing process thereof, which is subsequent to FIG. 8.

Next, as shown in FIG. 9, the silicon film PS2, the ONO film ON, the silicon film PS1, and the insulating film IF2 each located in the I/O region 1B and the silicon film PS1 and the insulating film IF1 each located in the logic region 1C are patterned using a photolithographic technique and an etching technique. Thus, in the I/O region 1B, the gate electrode G2 made of the silicon film PS1 and the gate insulating film GI2 made of the insulating film IF2 are formed. Also, in the logic region 1C, the gate electrode G1 made of the silicon film PS1 and the gate insulating film GI1 made of the insulating film IF1 are formed.

Figure 10:
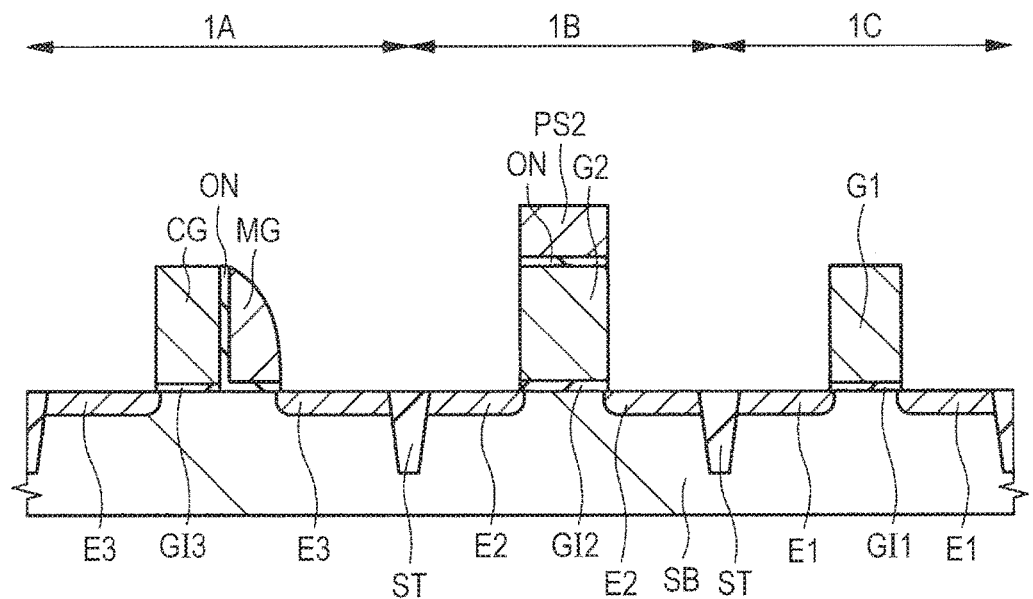
FIG. 10 is a cross-sectional view of the semiconductor device during the manufacturing process thereof, which is subsequent to FIG. 9.

Next, as shown in FIG. 10, the plurality of n$^-$-type semiconductor regions E1 to E3 are formed using an ion implantation method or the like. Specifically, an n-type impurity such as, e.g., As (arsenic) or P (phosphorus) is introduced into the semiconductor substrate SB using the control gate electrode CG, the memory gate electrode MG, the silicon film PS2, the gate electrodes G1 and G2, the ONO film ON, and the like as a mask (implantation blocking mask) to form the n$^-$-type semiconductor regions E1 to E3.

That is, in the memory cell region 1A, in the main surface of the semiconductor substrate SB located lateral to a pattern including the control gate electrode CG, the memory gate electrode MG, the gate insulating film GI3, and the ONO film ON, the n$^-$-type semiconductor regions E3 as the extension regions are formed. Also, in the I/O region 1B, in the main surface of the semiconductor substrate SB located lateral to a multi-layer pattern including the silicon film PS2, the ONO film ON, the gate electrode G2, and the gate insulating film GI2, the n$^-$-type semiconductor regions E2 as the extension regions are formed. Also, in the logic region 1C, in the main surface of the semiconductor substrate SB located lateral to a multi-layer pattern including the gate electrode G1 and the gate insulating film GI1, the n$^-$-type semiconductor regions E1 as the extension regions are formed.

Note that, before the n$^-$-type semiconductor regions E3 are formed, offset spacers covering the side surfaces of a pattern including the control gate electrode CG and the memory gate electrode MG and the respective side surfaces of the gate electrodes G1 and G2 may also be formed of, e.g., a silicon nitride film, a silicon dioxide film, a multi-layer film thereof, or the like. The n$^-$-type semiconductor regions E1 to E3 can be formed by the same ion implantation step, but can also be formed by different ion implantation steps.

Figure 11:
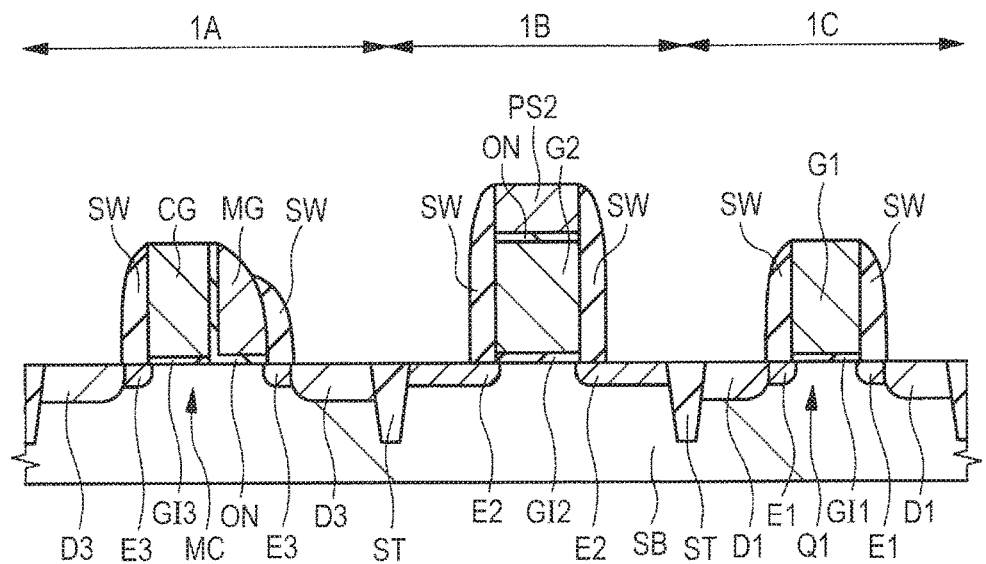
FIG. 11 is a cross-sectional view of the semiconductor device during the manufacturing process thereof, which is subsequent to FIG. 10.

Next, as shown in FIG. 11, in the memory cell region 1A, the sidewalls SW covering the both side surfaces of the pattern including the control gate electrode CG, the memory gate electrode MG, the gate insulating film GI3, and the ONO film ON are formed. Also, in the same step, in the I/O region 1B, the sidewalls SW covering the both side surfaces of the multi-layer pattern including the silicon film PS2, the ONO film ON, the gate electrode G2, and the gate insulating film GI2 are formed. Also, in the same step, in the logic region 1C, the sidewalls SW covering the both side surfaces of the multi-layer pattern including the gate electrode G1 and the gate insulating film GI1 are formed.

The sidewalls SW can be self-alignedly formed by, e.g., forming a silicon dioxide film and a silicon nitride film in this order over the semiconductor substrate SB using a CVD method, and then partly removing the silicon dioxide film and the silicon nitride film by anisotropic etching to expose the upper surface of the semiconductor substrate SB and the upper surface of each of the gate electrodes. Thus, it can be considered to form the sidewalls SW of the multi-layer film but, in the drawing, the interface between the films included in the multi-layer film is not shown.

Subsequently, using a photolithographic technique and an ion implantation method, the n$^+$-type semiconductor regions (impurity diffusion regions) D3 are formed in the memory cell region 1A, and the n$^+$-type semiconductor regions (impurity diffusion regions) D1 are formed in the logic region 1C. Since ion implantation is performed herein in the state where a photoresist pattern (not shown) covering the I/O region 1B is formed, the impurity is not implanted into the I/O region 1B.

Specifically, by introducing an n-type impurity (e.g., As (arsenic) or P (phosphorus)) into the semiconductor substrate SB using the photoresist pattern (not shown), the control gate electrode CG, the memory gate electrode MG, the gate electrode G1, the ONO film ON, the sidewalls SW, and the like as a mask (implantation blocking mask) by an ion implantation method, each of the n$^+$-type semiconductor regions D3 and D1 can be formed. Each of the n$^+$-type semiconductor regions D3 has an impurity concentration higher than that of each of the n$^-$-type semiconductor regions E3 and a depth larger than that of the n$^-$-type semiconductor region E3. Each of the n$^-$-type semiconductor regions D1 has an impurity concentration higher than that of each of the n$^-$-type semiconductor regions E1 and a depth larger than that of the n$^-$-type semiconductor region E1.

For example, both of As (arsenic) and P (phosphorus) are implanted herein into the main surface of the semiconductor substrate SB. At this time, when As (arsenic) is implanted, an energy is 40 keV and a dose is $1 \times 10^{15}$ cm$^{-2}$. When P (phosphorus) is implanted, an energy is 40 keV and a dose is $5 \times 10^{13}$ cm$^{-2}$. The depth of each of the n$^+$-type semiconductor regions D1 and D3 thus formed is, e.g., 80 nm, and the depth of the position in each of the n$^+$-type semiconductor regions D1 and D3 where the impurity concentration is highest is, e.g., 40 nm. It is difficult here to increase the energy to a level higher than in the foregoing implantation conditions since impurity ions may possibly penetrate the control gate electrode CG, the memory gate electrode MG, and the gate electrode G1 each used as the implantation blocking mask and be implanted into the main surface of the semiconductor substrate SB.

By the foregoing implantation step, in the memory cell region 1A, the source/drain regions each having an LDD structure and including the n$^-$-type semiconductor region E3 as the extension region and the n$^+$-type semiconductor region D3 as the diffusion region having an impurity concentration higher than that of the n$^-$-type semiconductor region E3 are formed. Likewise, in the logic region 1C, the source/drain regions each having an LDD structure and including the n$^-$-type semiconductor region E1 as the extension region and the n$^-$-type semiconductor region D1 as the diffusion region having an impurity concentration higher than that of the n$^-$-type semiconductor region E1 are formed.

In the memory cell region 1A, the n$^-$-type semiconductor regions E3 and the n$^+$-type semiconductor regions D3 which are formed in the upper surface of the semiconductor substrate SB located lateral to the pattern including the control gate electrode CG and the memory gate electrode MG form the source/drain regions. Also, in the logic region 1C, the n$^-$-type semiconductor regions E1 and the n$^+$-type semiconductor regions D1 which are formed in the upper surface of the semiconductor substrate SB located lateral to the gate electrode G1 form the source/drain regions. The respective n+-type semiconductor regions D3 and D1 in the memory cell region 1A and the logic region 1C can be formed by the same ion implantation step, but can also be formed by different ion implantation steps.

As a result, in the memory cell region 1A, the memory cell MC including the control gate electrode CG, the memory gate electrode MG, and the source/drain regions formed in the main surface of the semiconductor substrate SB located lateral thereto is formed. That is, in the memory cell region 1A, the control gate electrode CG and the pair of source/drain regions formed in the upper surface of the semiconductor substrate SB located lateral to the control gate electrode CG form the control transistor. Also, in the memory cell region 1A, the memory gate electrode MG and the pair of source/drain regions formed in the upper surface of the semiconductor substrate SB located lateral to the memory gate electrode MG form the memory transistor. The control transistor and the memory transistor share the pair of source/drain regions. The control transistor and the memory transistor form the memory cell MC.

In the logic region 1C, the lower-breakdown-voltage MISFET Q1 including the gate electrode G1 and the source/drain regions formed in the main surface of the semiconductor substrate SB located lateral to the gate electrode G1 is formed.

Figure 12:
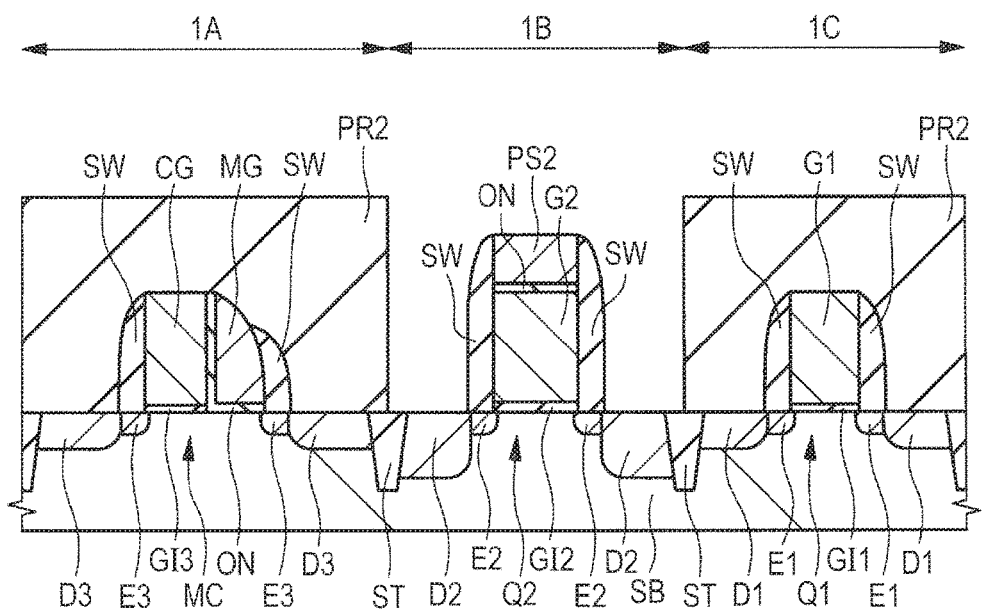
FIG. 12 is a cross-sectional view of the semiconductor device during the manufacturing process thereof, which is subsequent to FIG. 11.

Next, as shown in FIG. 12, a photoresist film PR2 covering the memory cell region 1A and the logic region 1C and exposing the I/O region 1B is formed over the semiconductor substrate SB. Subsequently, ion implantation is performed using the photoresist film PR2 and the silicon film PS2, the ONO film ON, the gate electrode G2, and the gate insulating film GI2 each located in the I/O region 1B as a mask (implantation blocking mask) to implant n-type impurities (e.g., As (arsenic) and P (phosphorus)) into the main surface of the semiconductor substrate SB exposed in the I/O region 1B. Thus, in the main surface of the semiconductor substrate SB, the pair of n+-type semiconductor regions D2 are formed. The pair of n−-type semiconductor regions D2 as the n-type diffusion regions are disposed such that the main surface of the semiconductor substrate SB located immediately below the gate electrode G2 is interposed therebetween in a gate length direction. The n−-type semiconductor regions D2 are formed at positions farther away from the main surface (channel region) of the semiconductor substrate SB located immediately below the gate electrode G2 than those of the n−-type semiconductor regions E2.

In the I/O region 1B, the n−-type semiconductor regions E2 and the n+-type semiconductor regions D2 which are formed in the upper surface of the semiconductor substrate SB located lateral to the gate electrode G2 form the source/drain regions. In the I/O region 1B, the higher-breakdown-voltage MISFET Q2 including the gate electrode G2 and the source/drain regions formed in the main surface of the semiconductor substrate SB located lateral to the gate electrode G2 is formed.

In the ion implantation step, when As (arsenic) is implanted, an energy is 80 keV and a dose is $1 \times 10^{15}$ cm$^{-2}$. When P (phosphorus) is implanted, an energy is 80 keV and a dose is $5 \times 10^{13}$ cm$^{-2}$. The depth of each of the n+-type semiconductor regions D2 thus formed is, e.g., 160 nm, and the depth of the position in each of the n+-type semiconductor regions D2 where the impurity concentration is highest is, e.g., 80 nm.

The implantation of As (arsenic) ions is performed herein with a relatively high energy. The gate pattern (gate stack) used as a mask in the I/O region 1B has not only the gate insulating film GI2 and the gate electrode G2, but also the ONO film ON and the silicon film PS2 over the gate electrode G2. Accordingly, even when the ion implantation is performed under a high energy condition, it is possible to prevent impurity ions from penetrating the gate electrode G2 and being implanted into the main surface of the semiconductor substrate SB located immediately below the gate electrode G2.

By thus performing the implantation with the high energy, each of the n+-type semiconductor regions D2 formed in the I/O region 1B has a depth larger than that of each of the n−-type semiconductor regions D3 and D1 formed in the memory cell region 1A and the logic region 1C. Specifically, each of the n+-type semiconductor regions D2 has a depth which is not less than twice the depth of each of the n+-type semiconductor regions D3 and D1. The deep n−-type semiconductor regions D2 are thus formed in the I/O region 1B for the purpose of improving the breakdown voltage of the MISFET Q2 formed in the I/O region 1B. As a result, the structure shown in FIG. 12 is obtained.

Next, the photoresist film PR2 is removed. Then, activation anneal as heat treatment for activating the impurities introduced in the source/drain semiconductor regions (the n−-type semiconductor regions E3 and the n−-type semiconductor regions D3) and the like is performed.

Figure 13:
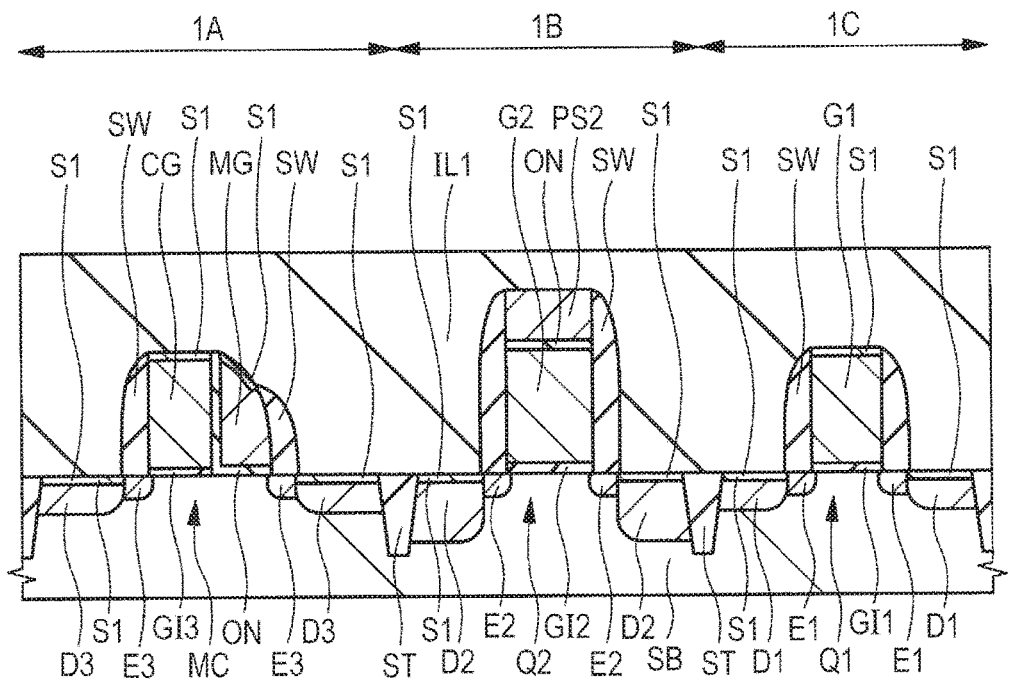
FIG. 13 is a cross-sectional view of the semiconductor device during the manufacturing process thereof, which is subsequent to FIG. 12.

Next, as shown in FIG. 13, the silicide layers S1 are formed. The silicide layers S1 can be formed by performing a so-called salicide (Self Aligned Silicide) process. Specifically, the silicide layers S1 can be formed as follows.

That is, first, over the entire main surface of the semiconductor substrate SB including the respective upper surfaces of the n+-type semiconductor regions D1 to D3, the control gate electrode CG, the memory gate electrode MG, and the gate electrodes G1 and G2, a metal film for forming the silicide layers S1 is formed (deposited). As the metal film, a single-element metal film (pure metal film) or an alloy film can be used. The metal film is made of, e.g., a cobalt (Co) film, a nickel (Ni) film, or a nickel-platinum alloy film and can be formed using a sputtering method or the like.

Then, heat treatment (heat treatment for forming the silicide layers S1) is performed on the semiconductor substrate SB to cause the respective surface layer portions of the n+-type semiconductor regions D3 and the memory gate electrode MG to react with the metal film. As a result, in the respective upper surfaces of the n+-type semiconductor regions D1 to D3, the control gate electrode CG, the memory gate electrode MG, and the gate electrode G1, the silicide layers S1 are formed. After that, the unreacted metal film is removed by wet etching or the like. Each of the silicide layers S1 can be, e.g., a cobalt silicide layer, a nickel silicide layer, or a nickel-platinum-silicide layer.

Subsequently, over the entire main surface of the semiconductor substrate SB, the interlayer insulating film IL1 is formed so as to cover the memory cell MC and the MISFETs Q1 and Q2. The interlayer insulating film IL1 is made of, e.g., a single-layer silicon dioxide film and can be formed using, e.g., a CVD method or the like. The interlayer insulating film IL1 is formed herein to a film thickness larger than the thickness of the multi-layer pattern (gate stack) including the gate insulating film GI2, the gate electrode G2, the ONO film ON, and the silicon film PS2.

Subsequently, the upper surface of the interlayer insulating film IL1 is polished using a CMP (Chemical Mechanical Polishing) method or the like. In the polishing step, none of the control gate electrode CG, the memory gate electrode MG, the gate electrodes G1 and G2, and the silicon film PS2 is exposed. That is, in the polishing step, only a part of the upper portion of the interlayer insulating film IL1 is removed and, even after the polishing step, the upper surface of the silicon film PS2 is covered with the interlayer insulating film IL1.

Figure 14:
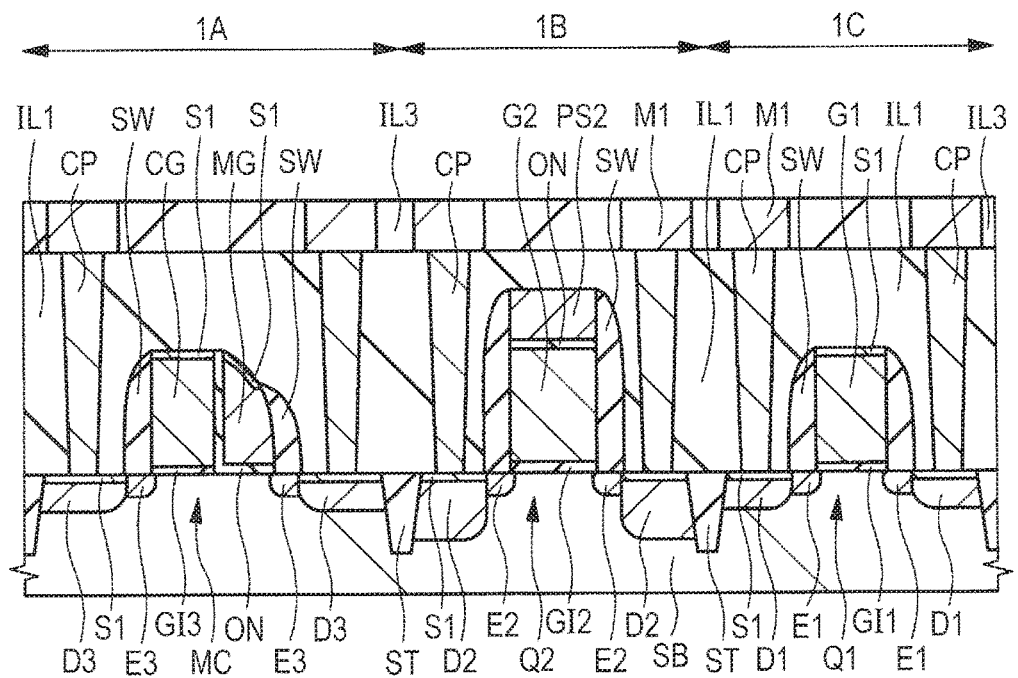
FIG. 14 is a cross-sectional view of the semiconductor device during the manufacturing process thereof, which is subsequent to FIG. 13.

Next, as shown in FIG. 14, the interlayer insulating films and the plurality of contact plugs are formed. First, using a photoresist pattern (not shown) formed over the interlayer insulating film IL1 using a photolithographic technique as an etching mask, the interlayer insulating film IL1 is dry-etched. Thus, the plurality of contact holes (openings or through holes) extending through the interlayer insulating film IL1 are formed.

Subsequently, in the individual contact holes, the plurality of conductive contact plugs CP made of W (tungsten) or the like are formed as coupling conductors. To form the contact plugs CP, e.g., a barrier conductor film (e.g., a titanium film, a titanium nitride film, or a multi-layer film thereof) is formed over the interlayer insulating film IL1 including the inner portions of the contact holes. Then, over the barrier conductor film, a main conductor film (e.g., a tungsten film) made of a tungsten film or the like is formed so as to completely fill each of the contact holes. Then, by removing the unneeded main conductor film and the unneeded barrier conductor film which are located outside the contact holes by a CMP method, an etch-back method, or the like, the contact plugs CP can be formed. Note that, for simpler illustration, in FIG. 14, the barrier conductor film and the main conductor film (tungsten film) which are included in each of the contact plugs CP are integrally shown.

The contact plugs CP embedded in the contact holes are coupled to the respective upper portions of the $n^+$-type semiconductor regions D1 to D3, the control gate electrode CG, the memory gate electrode MG, and the gate electrodes G1 and G2 and the like via the silicide layers S1. Note that, in the cross-sectional view of FIG. 14, the respective contact plugs CP electrically coupled to the control gate electrode CG, the memory gate electrode MG, and the gate electrodes G1 and G2 are not shown. To the control gate electrode CG, the memory gate electrode MG, and the gate electrodes G1 and G2 each extending in the gate width direction, the respective contact plugs CP are coupled in a region not shown.

Subsequently, over the interlayer insulating film IL1 in which the contact plugs CP are embedded, the first wiring layer including first-layer wires is formed. The wires can be formed using a damascene technique. That is, first, over the interlayer insulating film IL1, the interlayer insulating film IL3 made of, e.g., a silicon dioxide film is formed using, e.g., a CVD method. Then, using a photolithographic technique and an etching method, the plurality of wire trenches extending through the interlayer insulating film IL3 are formed. At a portion of the bottom surface of each of the wire trenches, the upper surface of the contact plug CP is exposed.

Subsequently, over the interlayer insulating IL3 including the inner portions of the wire trenches, a conductive film made mainly of, e.g., Cu (copper) is formed. By forming a barrier conductor film containing, e.g., Ta (tantalum) and a thin copper film (seed film) by a sputtering method or the like and then forming a main conductor film (Cu (copper) film) over the thin copper film by a plating method, the foregoing wire trenches are completely filled herein. Subsequently, the barrier conductor film, the thin copper film, and the main conductor film over the interlayer insulating film IL3 are removed by, e.g., a CMP method to expose the upper surface of the interlayer insulating film IL3. Thus, the wires M1 each including the barrier conductor film, the thin copper film, and the main conductor film and embedded individually in the plurality of wire trenches are formed. Note that, for simpler illustration, in FIG. 14, the barrier conductor film, the thin copper film, and the main conductor film which are included in each of the wires M1 are integrally shown.

Then, over the first wiring layer including the interlayer insulating film IL3 and the wires M1, a second wiring layer, a third wiring layer, and the like are formed in this order to form multiple wiring layers, though the illustration of the subsequent steps is omitted. Then, the semiconductor wafer is singulated by a dicing step to provide the plurality of semiconductor chips. In this manner, each of the semiconductor devices in Embodiment 1 is formed.

Effects of Embodiment 1

Figure 48:
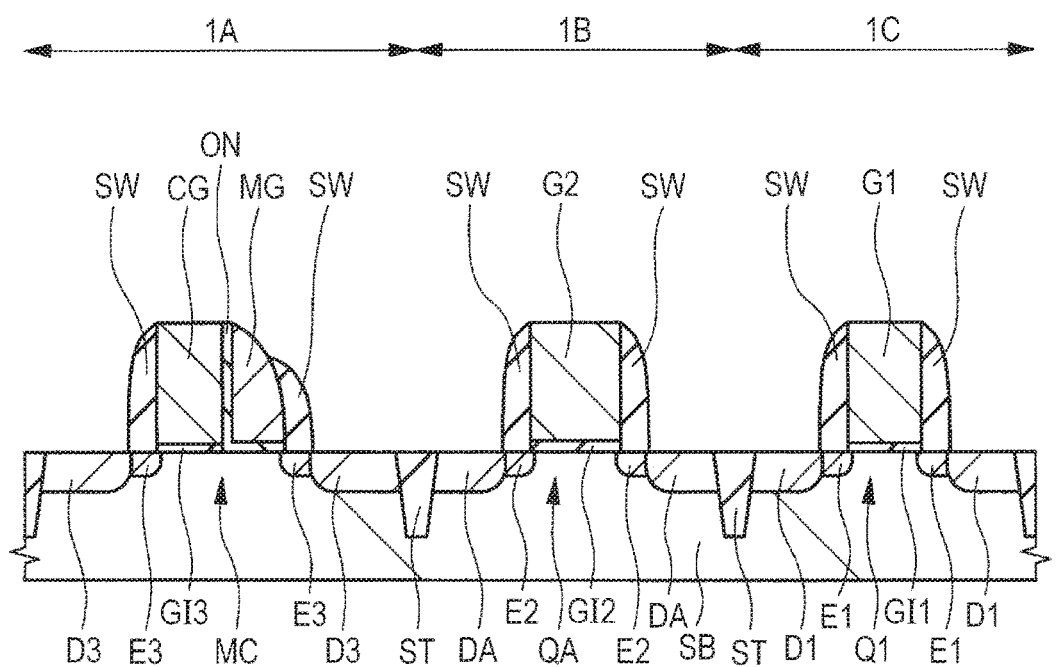
FIG. 48 is a cross-sectional view of a semiconductor device in a comparative example during the manufacturing process thereof.

The following will describe the problem of a semiconductor device in a comparative example, i.e., a semiconductor device in the case where the gate electrode in the I/O region and the gate electrode in the memory cell region or the logic region are formed to have equal heights, and then describe the effects of the manufacturing method of the semiconductor device in Embodiment 1. FIG. 48 shows a cross-sectional view of the semiconductor device in the comparative example during the manufacturing process thereof. The semiconductor device in the comparative example is, e.g., a vehicle-mounted semiconductor device used in, e.g., an automobile.

The automobile in which the vehicle-mounted semiconductor device is used runs with an engine and more than several tens of micro motors, which are generation sources of noise, being mounted in a narrow space. Accordingly, for an ECU (Engine Control Unit), a vehicle-mounted LAN (Local Area Network), or the like in which the vehicle-mounted semiconductor device is used, it is important to take measures for preventing malfunction induced by such noise. Noise also comes from outside the automobile. Specifically, such cases can be considered where e.g., the automobile is exposed to an intense electromagnetic field when passing through the vicinity of a power plant and where, e.g., a truck using illegal/illegitimate wireless personal communication or the like is coming closer to the automobile. In addition, interference/jam by a car radio or the like may also occur. In such a situation, it is important to improve a protection voltage for an I/O power supply which prevents the ingress of noise from the outside.

In the comparative example shown in FIG. 48, the structures of the memory cell MC and the lower-breakdown-voltage MISFET Q1 formed respectively in the memory cell region 1A and the logic region 1C are the same as in Embodiment 1. However, a higher-breakdown-voltage MISFET QA in the I/O region 1B shown in FIG. 48 is different from the higher-breakdown-voltage MISFET Q2 in Embodiment 1 in that the higher-breakdown-voltage MISFET QA has no ONO film and no silicon film over the gate electrode G2 and the depth of each of $n^-$-type semiconductor regions DA forming source/drain regions is smaller than that of each of the $n^+$-type semiconductor regions D2 shown in FIG. 1.

That is, in the comparative example, the height of a gate pattern including the gate insulating film GI2 and the gate electrode G2 under the interlayer insulating film IL1 is equal to the height of a gate pattern including the gate insulating film GI1 and the gate electrode G1 in the logic region 1C. Also, in the comparative example, the depth of each of the $n^+$-type semiconductor regions D1 included in the MISFET Q1 is substantially the same as the depth of each of the n⁻-type semiconductor regions DA included in the MISFET QA. To improve the breakdown voltage of the element (MISFET QA) in the I/O region 1B in such a semiconductor device, the following methods can be considered.

As a method of improving the breakdown voltage of the element in the I/O region of the semiconductor device, there is a method which increases the area of the I/O region. For example, there is a method in which the widths of the sidewalls formed over the side surfaces of a gate electrode are increased to increase the amounts of offsetting of the source/drain regions and thus improve the breakdown voltage of the MISFET. However, since the distances over which the source/drain regions can be offset and spaced apart from the gate electrode are determined by the height of the gate electrode, improving the breakdown voltage by offsetting the source/drain regions is limited. When the area of the I/O region is increased by such a method, a problem arises in that, due to the increased chip size, the miniaturization of the device becomes difficult and manufacturing cost increases.

As a method of improving the breakdown voltage of the element in the I/O region of the semiconductor device, it can also be considered to form the polysilicon film forming the gate electrode in the I/O region as a film having a multi-layer structure including, e.g., polysilicon films in two layers. When the gate electrode having such a multi-layer structure is formed, the grains forming the polysilicon film are reduced in size. Accordingly, in the ion implantation step performed to form the source/drain regions, the penetration of the gate electrode by impurity ions can conceivably be inhibited.

As a method of increasing the breakdown voltage of the MISFET, there is a method in which the depth of each of the n⁺-type semiconductor regions as the diffusion regions forming the source/drain regions is increased to thus increase the area of each of the side surfaces of the pair of n⁺-type semiconductor regions facing each other with the channel region of the MISFET being interposed therebetween. To form the MISFET thus having the deep n⁻-type semiconductor regions, it can be considered to perform the ion implantation for forming the n⁻-type semiconductor regions with a high energy.

However, even though the polysilicon film having the multi-layer structure is used, when the implantation is performed with a high energy (e.g., 80 keV), an impurity is likely to enter the channel region, and therefore it is difficult to form the deep source/drain regions. That is, when impurity ions which have penetrated the gate pattern are implanted into the channel region, the main surface of the semiconductor substrate located immediately below the gate electrode is likely to conduct electricity. This causes the problem that the MISFET no longer operates as a transistor.

To prevent the problem, in Embodiment 1, the ONO film ON and the silicon film PS2 which are formed over the silicon film PS1 in the I/O region 1B in the step described using FIG. 6 are left by being protected with the photoresist film PR1 in the etching step described using FIG. 7. Then, in the step described using FIG. 9, the gate pattern including the gate insulating film GI2, the gate electrode G2, the ONO film ON, and the silicon film PS2 is formed herein. Accordingly, the gate pattern is higher than the gate pattern including the gate electrode G1 in the logic region 1C and higher than the gate pattern including the control gate electrode CG in the memory cell region 1A.

In Embodiment 1, as described using FIG. 12, the n⁻-type semiconductor regions D2 are formed by performing the ion implantation with a high energy (e.g., 80 keV) using the high gate pattern including the gate insulating film GI2, the gate electrode G2, the ONO film ON, and the silicon film PS2 as a mask. As a result, even though the height of the gate electrode G2 is equal to that of each of the control gate electrode CG and the gate electrode G1, it is possible to prevent impurity ions from penetrating the gate pattern and being implanted into the channel region of the higher-breakdown-voltage MISFET Q2 (see FIGS. 1 and 14) in the ion implantation.

This can prevent a situation in which the semiconductor device no longer normally operates due to the penetration by impurity ions during the ion implantation and allow the MISFET Q2 having the deep n⁺-type semiconductor regions D2 to be formed. In the MISFET Q2 having the deep n⁺-type semiconductor regions D2, the areas of the respective side surfaces of the pair of n⁺-type semiconductor regions D2 which face each other with the channel region being interposed therebetween increase to lower a voltage per unit area in each of the side surfaces and thus allow an improvement in the breakdown voltage of the MISFET Q2.

In other words, the positions where the n⁺-type semiconductor regions D2 included in the source/drain regions of the MISFET Q2 shown in FIGS. 1 and 14 are formed need not be offset and spaced apart from the gate electrode G2, and the MISFET Q2 having a high breakdown voltage relative to the surface area thereof in plan view can be formed. That is, it is possible to simultaneously increase the breakdown voltage of the semiconductor device and miniaturize the semiconductor device. As a result, by increasing a rewrite voltage for the memory cell MC, it is possible to further increase a threshold voltage for rewriting and thus improve the reliability of the memory. In addition, the breakdown voltage margin of a circuit improves to be able to improve reliability against an electromagnetic wave (EMS for Electro Magnetic Susceptibility) coming from the outside.

In Embodiment 1, the description has been given of the case where the n-channel MISFETs are formed. However, in the case where p-channel MISFETs are formed also, the effects of Embodiment 1 can be obtained. When p-type semiconductor regions are formed instead of the n⁻-type semiconductor regions E1 to E3 and the n⁺-type semiconductor regions D1 to D3 which are included in the individual source/drain regions shown in FIG. 1, in the step of forming the semiconductor regions, a p-type impurity (e.g., B (boron)) is implanted into the main surface of the semiconductor substrate SB by an ion implantation method.

When B (boron) is implanted to form p⁺-type semiconductor regions as diffusion regions in the memory cell region 1A and the logic region 1C, an energy is 20 keV and a dose is $1\times10^{15}$ cm⁻². The depth of each of the p⁺-type semiconductor regions of the memory cell MC and the MISFET Q1 is, e.g., 120 nm, and the depth of the position in the p⁺-type semiconductor region where the impurity concentration is highest is, e.g., 60 nm. These implantation conditions and depths are the same as the implantation conditions and depths of the p⁺-type semiconductor regions formed in the I/O region 1B of the semiconductor device described in the comparative example using FIG. 48.

By contrast, in the case where the p-type MISFET Q2 is formed in the I/O region 1B in Embodiment 1, when B (boron) is implanted to form the p⁺-type semiconductor regions as the diffusion regions of the MISFET Q2, an energy is 40 keV and a doze is $1\times10^{15}$ cm⁻². The depth of each of the p⁻-type semiconductor regions of the MISFET Q2 is, e.g., 240 nm, and the depth of the position in the p⁺-type semiconductor region where the impurity concentration is highest is, e.g., 120 nm. Thus, in Embodiment 1, the p⁺-type semiconductor regions deeper than the p⁺-type semiconductor regions in the I/O region 1B in the comparative example can be formed. Therefore, it is possible to increase the breakdown voltage of the MISFET Q2 in the I/O region 1B.

Modification

The following will describe the manufacturing process of a modification of the semiconductor device in Embodiment 1 using FIGS. 15 to 18. FIGS. 15 to 18 are cross-sectional views of the present modification during the manufacturing process thereof. In each of the drawings of FIGS. 15 to 18, in the same manner as in FIGS. 3 to 14, the memory cell region 1A, the I/O region 1B, and the logic region 1C are shown. In the present modification, a metal film to be used as an ion implantation blocking mask is additionally formed in the upper portion of the gate pattern in the I/O region.

In the manufacturing process of the present modification, first, the steps described using FIGS. 3 to 6 are performed.

Figure 15:
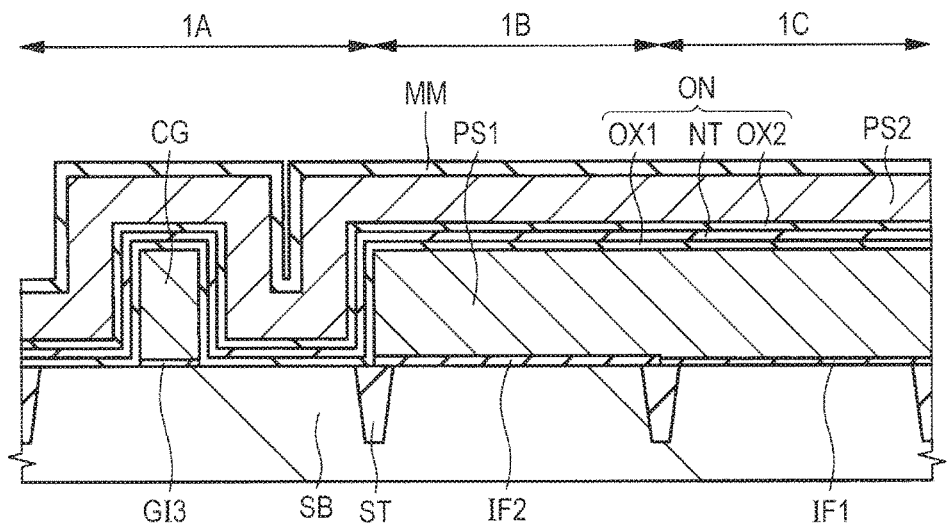
FIG. 15 is a cross-sectional view of a semiconductor device in a modification of Embodiment 1 during the manufacturing process thereof.

Next, as shown in FIG. 15, using, e.g., a sputtering method or the like, a metal film MM is formed over the entire main surface of the semiconductor substrate SB. The metal film MM contains, e.g., Al (aluminum), Ti (titanium), TiN (titanium nitride), TiW (titanium tungsten), or W (tungsten). It is assumed herein that the metal film MM is made of an aluminum film. The film thickness of the metal film MM is, e.g., 5 nm. The metal film MM is formed so as to cover the top surface of the silicon film PS2 in the memory cell region 1A, the I/O region 1B, and the logic region 1C.

Figure 16:
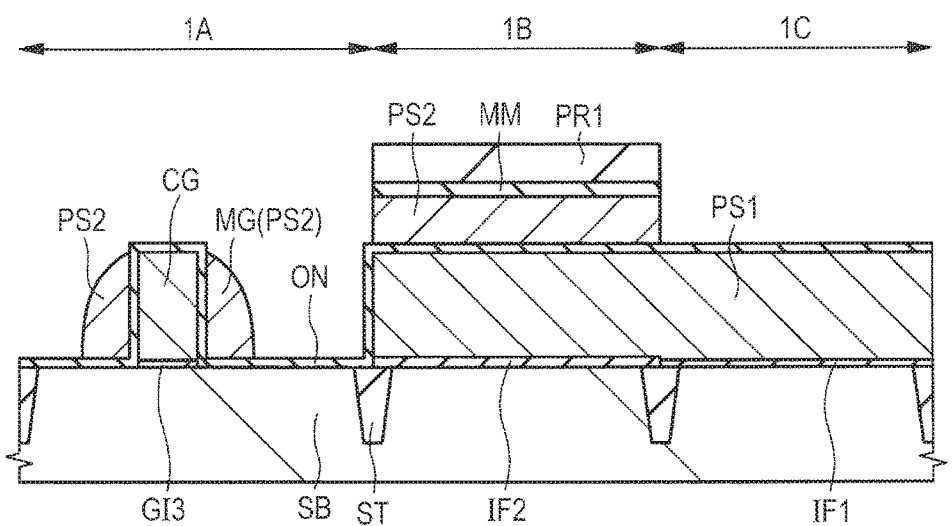
FIG. 16 is a cross-sectional view of the semiconductor device during the manufacturing process thereof, which is subsequent to FIG. 15.

Next, as shown in FIG. 16, the same step as the step described using FIG. 7 is performed. That is, the photoresist film PR1 covering the respective upper surfaces of the silicon film PS2 and the metal film MM which are located in in the I/O region 1B is formed. Then, using the photoresist film PR1 as a mask (for preventing etching), the metal film MM and the silicon film PS2 are etched back to expose the upper surface of the ONO film ON located in the memory cell region 1A and the logic region 1C. As a result, the metal film MM located in the memory cell region 1A and the logic region 1C is entirely removed therefrom, while a portion of the silicon film PS2 located in the memory cell region 1A and the silicon film PS2 located in the logic region 1C are removed therefrom.

Figure 17:
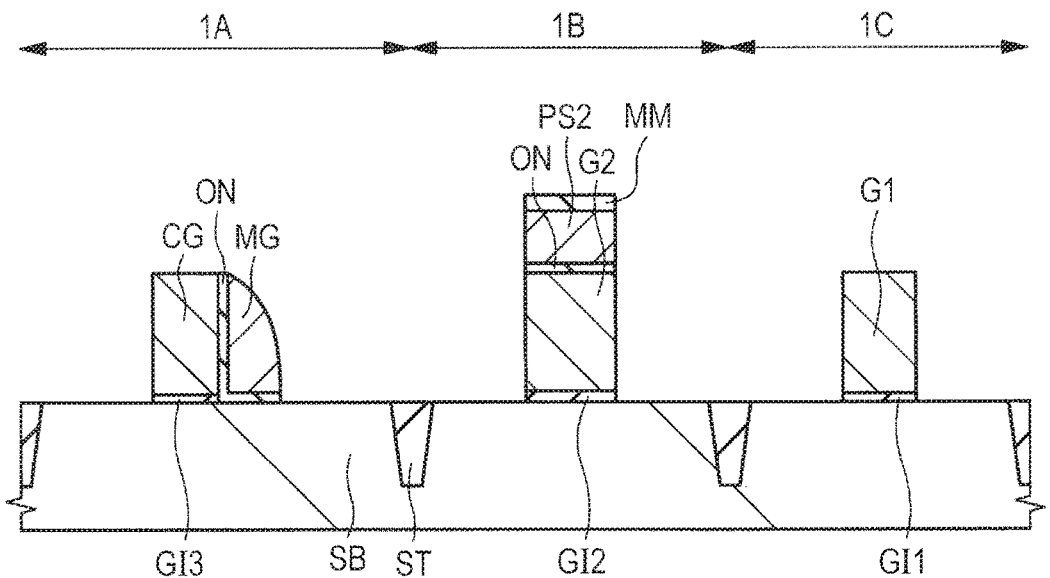
FIG. 17 is a cross-sectional view of the semiconductor device during the manufacturing process thereof, which is subsequent to FIG. 16.

Next, as shown in FIG. 17, the same steps as the steps described using FIGS. 8 and 9 are performed. As a result, in the I/O region 1B, a gate pattern including the gate insulating film GI2, the gate electrode G2, the ONO film ON, the silicon film PS2, and the metal film MM which are stacked over the semiconductor substrate SB is formed.

Figure 18:
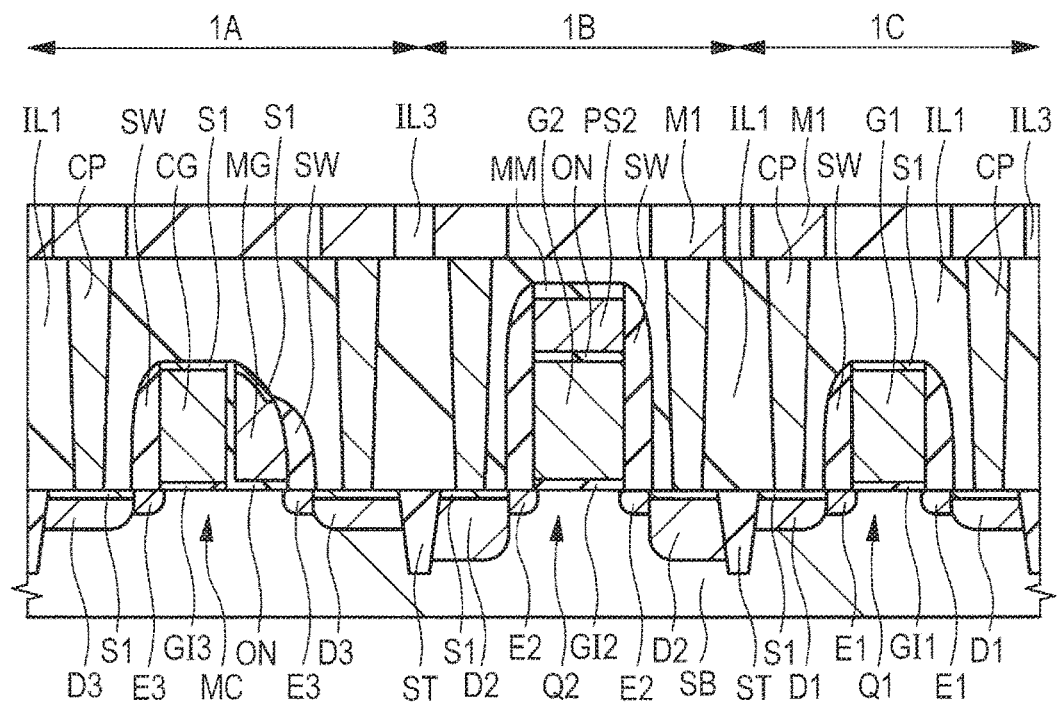
FIG. 18 is a cross-sectional view of the semiconductor device during the manufacturing process thereof, which is subsequent to FIG. 17.

Next, as shown in FIG. 18, the same steps as the steps described using FIGS. 10 to 14 are performed to form the semiconductor device in the present modification. When the sidewalls SW are formed in the step described using FIG. 11, in the I/O region 1B, the sidewalls SW covering the side surfaces of the gate pattern including the gate insulating film GI2, the gate electrode G2, the ONO film ON, the silicon film PS2, and the metal film MM are formed. In the step described using FIG. 12, ion implantation is performed using the photoresist film PR2, the gate pattern including the metal film MM, and the sidewalls SW as a mask (implantation blocking mask or protection mask) to form the n⁺-type semiconductor regions D2 as the diffusion regions.

At this time, since the metal film MM has a density and a mass which are higher and larger than those of a silicon film, by using the metal film MM as the mask, it is possible to easily prevent impurity ions from penetrating the gate pattern during the formation of the n⁺-type semiconductor regions D2. As a result, even when the metal film MM has a small thickness of not more than 5 nm, by using the metal film MM as the mask, it is possible to prevent the penetration by impurity ions despite a small total film thickness of the silicon film PS2, the ONO film ON, the gate electrode G2, and the gate insulating film GI2 under the metal film MM. Therefore, it is possible to prevent the gate pattern from being excessively high in level and prevent the degradation of the reliability of the semiconductor device resulting from the penetration by impurity ions.

Embodiment 2

Figure 19:
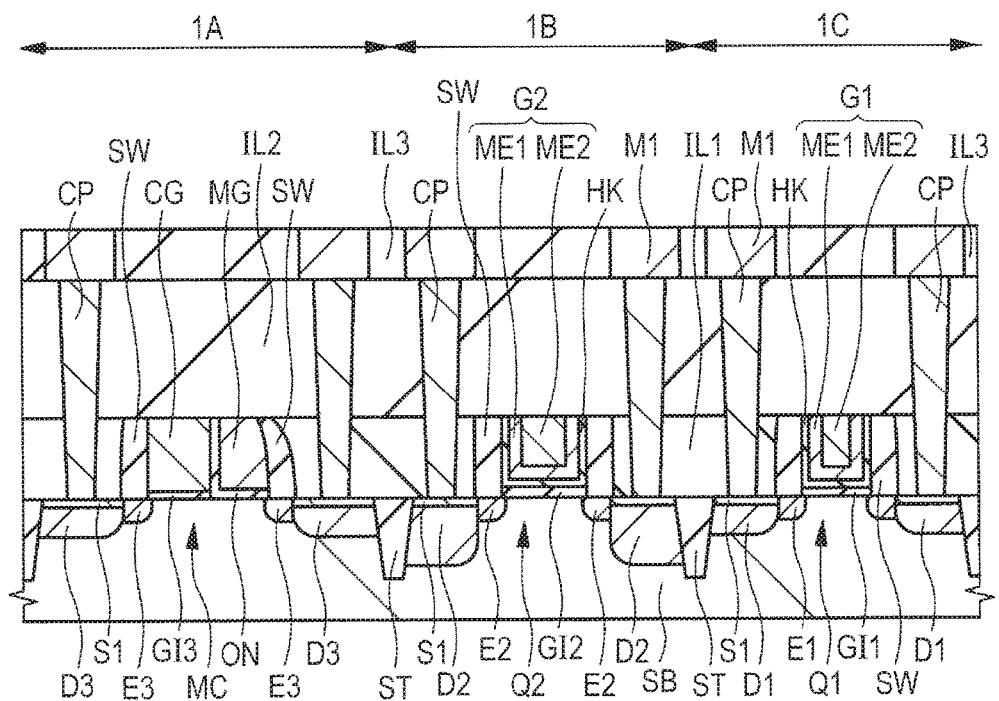
FIG. 19 is a cross-sectional view of a semiconductor device in Embodiment 2.

Embodiment 2 uses a gate-last manufacturing method in which the gate electrodes are formed after the formation of the source/drain regions, unlike Embodiment 1 described above which uses a gate-first manufacturing method in which the gate electrodes are formed before the step of forming the source/drain regions. FIG. 19 shows a cross-sectional view of a semiconductor device in Embodiment 2. In FIG. 19, in the same manner as in FIG. 1, the memory cell region 1A, the I/O region 1B, and the logic region 1C are shown.

In the structure shown in FIG. 19, the structure in the semiconductor substrate SB is the same as in Embodiment 1 described above. Also, in the same manner as in Embodiment 1 described above, the memory cell MC including the control gate electrode CG and the memory gate electrode MG is formed in the memory cell region 1A, the higher-breakdown-voltage MISFET Q2 having the gate electrode G2 is formed in the I/O region 1B, and the higher-breakdown-voltage MISFET Q1 having the gate electrode G1 is formed in the logic region 1C.

However, in Embodiment 2, the respective upper surfaces of the control gate electrode CG, the memory gate electrode MG, the gate electrodes G1 and G2, the interlayer insulating film IL1, and the sidewalls SW in the memory cell region 1A, the I/O region 1B, and the logic region 1C are planarized in a plane at an equal height. The width of the upper surface of each of the sidewalls SW in the gate length direction in the I/O region 1B is larger than the width of the upper surface of each of the sidewalls SW in the gate length direction in the memory cell region 1A and the logic region 1C.

Between the interlayer insulating films IL1 and IL3, an interlayer insulating film IL2 made of, e.g., a silicon dioxide film is interposed. The contact plugs CP over the respective source/drain regions extend through a multi-layer film including the interlayer insulating films IL1 and IL2. The upper surfaces of the contact plugs CP are planarized at the same height as that of the upper surface of the interlayer insulating film IL2. The interlayer insulating film IL2 covers the respective upper surfaces of the control gate electrode CG, the memory gate electrode MG, the gate electrodes G1 and G2, the interlayer insulating film IL1, and the sidewalls SW in the memory cell region 1A, the I/O region 1B, and the logic region 1C. That is, the interlayer insulating film IL1 covers the side surfaces of the sidewalls SW.

The interlayer insulating film IL1 exposes the respective upper surfaces of the control gate electrode CG, the gate electrodes G1 and G2, and the sidewalls SW. That is, the interlayer insulating film IL1 is embedded in the spaces between the control gate electrode CG and the gate electrode G1 and between the gate electrodes G1 and G2 to cover the respective side surfaces of the control gate electrode CG and the gate electrodes G1 and G2 via the sidewalls SW.

Over the upper surface of each of the gate electrodes G1 and G2, no silicide layer is formed. Note that, in the drawing, over the upper surface of each of the control gate electrode CG and the memory gate electrode MG, no silicide layer is shown, but silicide layers covering the respective upper surfaces of the control gate electrode CG and the memory gate electrode MG may also be formed.

Each of the gate electrodes G1 and G2 is a metal gate electrode formed of a metal film. The metal film forming each of the gate electrodes G1 and G2 is formed of a multi-layer film including a metal film ME1 having the function of controlling the work function of each of the gate electrodes G1 and G2 and a metal film ME2 formed over the metal film ME1 and having the function of reducing the resistance of the gate electrode G1. Between the gate electrode G1 and the gate insulating film GI1, an insulating film HK is interposed and, between the gate electrode G2 and the gate insulating film GI2, the insulating film HK is interposed. The insulating film HK is made of a metal oxide film such as a hafnium oxide film, a zirconium oxide film, an aluminum oxide film, a tantalum oxide film, or a lanthanum oxide film, which is a material having a dielectric constant (specific permittivity) higher than that of silicon nitride. Note that, in the present application, when a high-k film or a high-dielectric-constant film is mentioned, the film means a film having a dielectric constant (specific permittivity) higher than that of silicon nitride.

The insulating film HK has a U-shaped cross-sectional structure to cover the respective bottom and side surfaces of the gate electrodes G1 and G2. Specifically, in the I/O region 1B, between the sidewalls SW and the gate electrode G2, the insulating film HK is interposed and, in the logic region 1C, between the sidewalls SW and the gate electrode G1, the insulating film HK is interposed. The metal film ME1 has a U-shaped cross-sectional structure to cover the bottom and side surfaces of the metal film ME2. That is, in the I/O region 1B, between the metal film ME2 and the sidewalls SW, the insulating film HK and the metal film ME1 are interposed and, in the logic region 1C, between the sidewalls SW and the metal film ME2, the insulating film HK and the metal film ME1 is interposed.

The insulating film HK in the I/O region 1B functions as a portion of the gate insulating film of the MISFET Q2. That is, the gate insulating film of the MISFET Q2 includes the insulating film HK and the gate insulating film GI2. The insulating film HK in the logic region 1C functions as a portion of the gate insulating film of the MISFET Q1. That is, the gate insulating film of the MISFET Q1 includes the insulating film HK and the gate insulating film GI1. When a high-dielectric-constant film (which is the insulating film HK herein) is used as each of the gate insulating films, the physical film thickness of the gate insulating film can be increased compared to that in the case where only a silicon dioxide film is used as the film forming the gate insulating films. This allows the advantage of being able to reduce a leakage current to be obtained.

As each of the metal films ME1 and ME2, a metal film such as, e.g., a TiN (titanium nitride) film, a TaN (tantalum nitride) film, a WN (tungsten nitride) film, a TiC (titanium carbide) film, a TaC (tantalum carbide) film, a WC (tungsten carbide) film, a TaCN (tantalum carbonitride film), a Ti (titanium) film, a Ta (tantalum) film, a TiAl (titanium aluminum) film, or an Al (aluminum) film can be used. It is assumed that the metal films mentioned herein refer to conductive films showing metal conduction and include not only a single-element metal film (pure metal film) and an alloy film, but also a metal compound film showing metal conduction.

For example, the metal film ME1 is formed herein of a titanium nitride (TiN) film, while the metal film ME2 is formed herein of an aluminum (Al) film. At this time, the aluminum film is preferably formed thicker than the titanium nitride film. Since the aluminum film has a relatively low resistance, by forming the metal film ME2 of the aluminum film, it is possible to reduce the resistance of each of the gate electrodes G1 and G2. In the region not shown, the contact plugs CP extending through the interlayer insulating film IL2 are coupled to the respective upper surfaces of the control gate electrode CG, the memory gate electrode MG, and the gate electrodes G1 and G2.

Using FIGS. 20 to 25, the following will describe the manufacturing process of the semiconductor device in Embodiment 2. FIGS. 20 to 25 are cross-sectional views of the semiconductor device in Embodiment 2 during the manufacturing process thereof. In FIGS. 20 to 25, in the same manner as in FIGS. 3 to 14, the memory cell region 1A, the I/O region 1B, and the logic region 1C are shown.

In the manufacturing process of the semiconductor device in Embodiment 2, first, the same steps as the steps described using FIGS. 3 to 12 are performed. However, the pattern provided over the gate insulating film GI2 in the I/O region 1B is referred to as a dummy gate electrode DG2, not the gate electrode G2, and the pattern provided over the gate insulating film IG1 in the logic region 1C is referred to as a dummy gate electrode DG1, not the gate electrode G1. Each of the dummy gate electrodes DG1 and DG2 is a gate pattern to be removed and replaced with a gate electrode in the subsequent step. Therefore, the dummy gate electrodes DG1 and DG2 are pseudo gate electrodes and can be regarded as to-be-replaced gate electrodes.

In the step described using FIG. 9, in the I/O region 1B, a gate pattern including the gate insulating film GI2, the dummy gate electrode DG2, the ONO film ON, and the silicon film PS2 which are stacked in this order over the semiconductor substrate SB is formed and, in the logic region 1C, a gate pattern including the gate insulating film GI1 and the dummy gate electrode DG1 which are stacked in this order over the semiconductor substrate SB is formed. In the step described using FIG. 12, using the gate pattern including the gate insulating film GI2, the dummy gate electrode DG2, the ONO film ON, and the silicon film PS2 which are stacked over the semiconductor substrate SB as a mask, ion implantation is performed with a relatively high energy to thus form, in the I/O region 1B, the $n^+$-type semiconductor regions D2 deeper than the $n^-$-type semiconductor regions D1 and D3.

Figure 20:
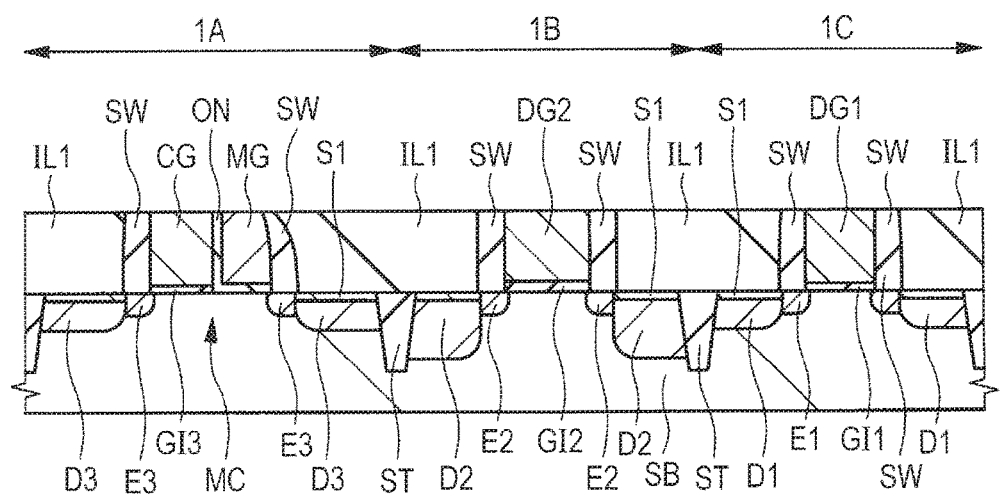
FIG. 20 is a cross-sectional view of the semiconductor device in Embodiment 2 during the manufacturing process thereof.

Next, as shown in FIG. 20, the upper surface of the interlayer insulating film IL1 is subsequently polished using a CMP method or the like. Thus, the respective upper surfaces of the control gate electrode CG, the memory gate electrode MG, and the dummy gate electrodes DG1 and DG2 are exposed. Specifically, in this polishing step, the interlayer insulating film IL1 is polished until the respective upper surfaces of the control gate electrode CG, the memory gate electrode MG, and the dummy gate electrodes DG1 and DG2 are exposed. As a result, the ONO film ON and the silicon film PS2 which are located over the dummy gate electrode DG2 are removed, and the upper portions of the sidewalls SW are also partly removed. In addition, the silicide layer S1 over each of the control gate electrode CG, the memory gate electrode MG, and the dummy gate electrodes DG1 and DG2 is removed by this step together with a part of the upper portion of each of the gate electrodes.

The sidewalls SW formed in the I/O region 1B in the step described using FIG. 11 are formed self-alignedly with the side surfaces of the relatively high gate pattern including the gate insulating film GI2, the dummy gate electrode DG2, the ONO film ON, and the silicon film PS2. By contrast, the sidewalls SW in the memory cell region 1A and the logic region 1C are formed self-alignedly with the respective side surfaces of the gate pattern including the gate insulating film GI3, the ONO film ON, the control gate electrode CG, and the memory gate electrode MG and the gate pattern including the gate insulating film GI1 and the gate electrode G1. Accordingly, the width of each of the sidewalls SW in the gate length direction at any height between the upper and lower ends of the sidewall SW in each of the memory cell region 1A and the logic region 1C is smaller than the width of each of the sidewalls SW in the gate length direction at the height in the I/O region 1B.

Consequently, when a part of the upper portion of each of the sidewalls SW is removed by the forgoing polishing step to planarize the upper surface of each of the sidewalls SW, the width of the upper surface of each of the sidewalls SW in the gate length direction in the I/O region 1B is larger than the width of the upper surface of each of the sidewalls SW in the gate length direction in each of the memory cell region 1A and the logic region 1C.

Figure 21:
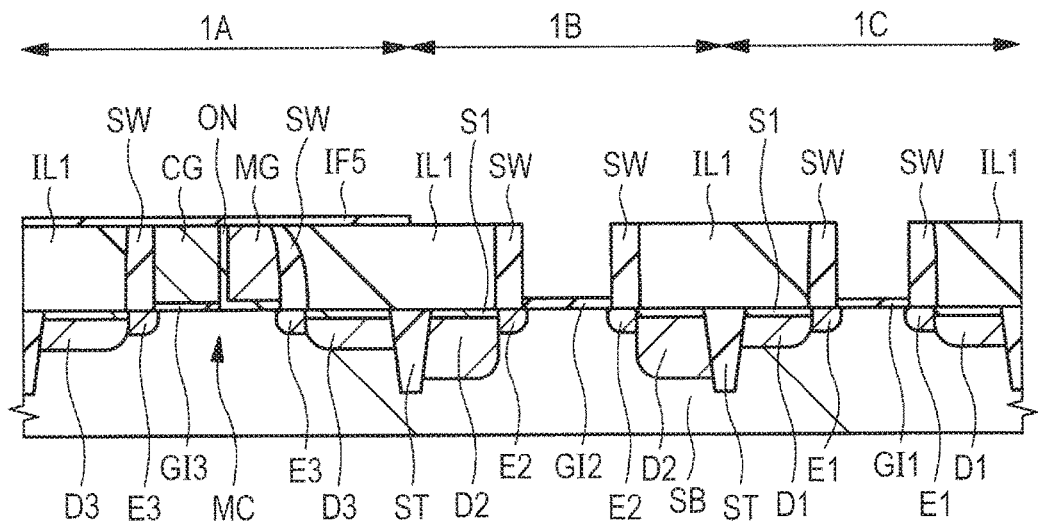
FIG. 21 is a cross-sectional view of the semiconductor device during the manufacturing process thereof, which is subsequent to FIG. 20.

Next, as shown in FIG. 21, over the interlayer insulating film IL1, an insulating film IF5 is formed using, e.g., a CVD method and then processed using a photolithographic technique and an etching method. As a result, the insulating film IF5 remains in the memory cell region 1A. That is, the insulating film IF5 covers the respective upper surfaces of the control gate electrode CG and the memory gate electrode MG, while exposing the dummy gate electrodes DG1 and DG2. The insulating film IF5 is made of, e.g., a silicon nitride film.

Subsequently, the dummy gate electrodes DG1 and DG2 are etched to be removed. The dummy gate electrodes DG1 and DG2 are removed herein by performing wet etching using, e.g., an aqueous alkaline solution using the insulating film IF5 as a mask protecting the control gate electrode CG and the memory gate electrode MG. As the aqueous alkaline solution, e.g., aqueous ammonia ($NH_4OH$) is used. As a result of the removal of the dummy gate electrodes DG1 and DG2, over the respective gate insulating films GI1 and GI2, trenches (depressed portions or recessed portions) are formed. That is, in the upper surface of the interlayer insulating film IL1 located in the I/O region 1B, a first trench is formed and, in the upper surface of the interlayer insulating film IL1 located in the logic region 1C, a second trench is formed.

The first trench over the gate insulating film GI2 in the I/O region 1B corresponds to the region from which the dummy gate electrode DG2 has been removed, and the both side surfaces of the first trench are formed of the sidewalls SW. The second trench over the gate insulating film GI1 in the logic region 1C corresponds to the region from which the dummy gate electrode DG1 has been removed, and the both side surfaces of the second trench are formed of the sidewalls SW.

Figure 22:
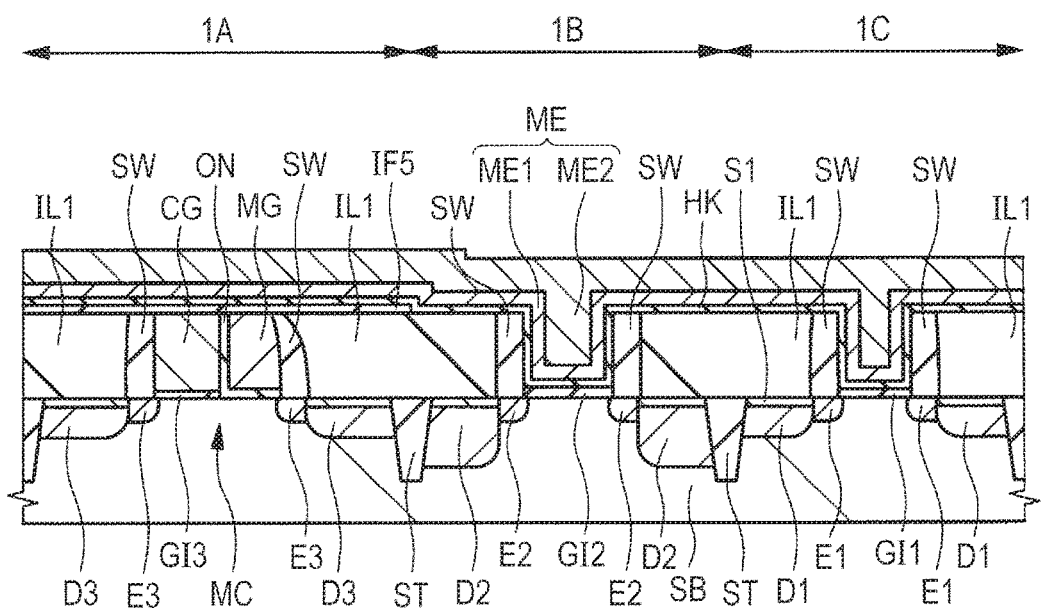
FIG. 22 is a cross-sectional view of the semiconductor device during the manufacturing process thereof, which is subsequent to FIG. 21.

Next, as shown in FIG. 22, over the semiconductor substrate SB, i.e., over the interlayer insulating film IL1 including the respective inner surfaces (bottom and side surfaces) of the plurality of trenches described above, the insulating film HK is formed. Then, over the semiconductor substrate SB, i.e., over the insulating film HK, the metal films ME1 and ME2 are formed in this order as conductive films for the gate electrodes so as to completely fill each of the trenches described above. A multi-layer film including the metal films ME1 and ME2 forms the metal film ME.

In the steps of forming the insulating film HK and the metal film ME1, each of the trenches described above is not completely filled and, by forming the metal film ME2 over the metal film ME1, each of the trenches is completely filled. The metal film ME including the metal films ME1 and ME2 is formed also over the interlayer insulating film IL1.

The insulating film HK is an insulating film for the gate insulating films, while the metal film is a conductive film for the gate electrodes. Specifically, the insulating film HK is the film forming the gate insulating films of the MISFETs formed later in the I/O region 1B and the logic region 1C. The insulating film HK is an insulating material film having a dielectric constant (specific permittivity) higher than that of silicon nitride, i.e., a so-called high-k film (high-dielectric-constant film).

As the insulating film HK, a metal oxide film such as a hafnium oxide film, a zirconium oxide film, an aluminum oxide film, a tantalum oxide film, or a lanthanum oxide film can be used. Such a metal oxide film can also contain either or both of nitrogen (N) and silicon (Si). The insulating film HK can be formed by, e.g., an ALD (Atomic layer Deposition) method or the like. The film thickness of the insulating film HK is, e.g., 1.5 nm. When a high-dielectric-constant film (which is the insulating film HK herein) is used as each of the gate insulating films, the physical film thickness of the gate insulating film can be increased compared to that in the case where a silicon dioxide film is used as each of the gate insulating films. This allows the advantage of being able to reduce a leakage current to be obtained.

As each of the metal films ME1 and ME2, a metal film such as, e.g., a TiN (titanium nitride) film, a TaN (tantalum nitride) film, a WN (tungsten nitride) film, a TiC (titanium carbide) film, a TaC (tantalum carbide) film, a WC (tungsten carbide) film, a TaCN (tantalum carbonitride) film, a Ti (titanium) film, a Ta (tantalum) film, a TiAl (titanium aluminum) film, or an Al (aluminum) film can be used. It is assumed that the metal films mentioned herein refer to conductive films showing metal conduction and include not only a single-element metal film (pure metal film) and an alloy film, but also a metal compound film showing metal conduction. The metal films can be formed using, e.g., a sputtering method or the like.

For example, the metal film ME1 is formed herein of a titanium nitride (TiN) film, while the metal film ME2 over the titanium nitride film is formed herein of an aluminum (Al) film. At this time, the aluminum film is preferably formed thicker than the titanium nitride film. The aluminum film having a relatively low resistance allows a reduction in the resistance of each of the gate electrodes formed later.

Figure 23:
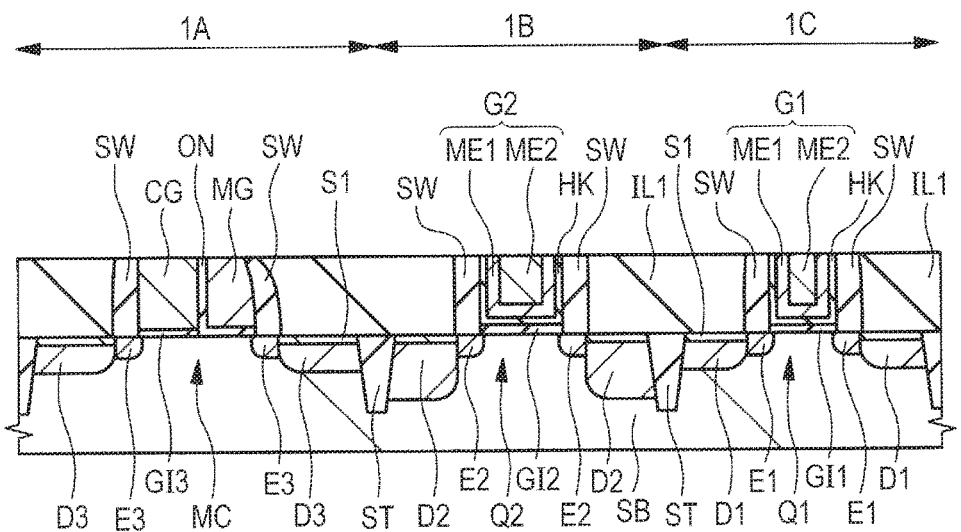
FIG. 23 is a cross-sectional view of the semiconductor device during the manufacturing process thereof, which is subsequent to FIG. 22.

Next, as shown in FIG. 23, by polishing and removing the unneeded metal films ME1 and ME2 and the unneeded insulating film HK which are located outside the plurality of trenches described above by a CMP method or the like, the insulating film HK and the metal films ME1 and ME2 which are embedded in each of the trenches are left. At this time, the insulating film IF5 is also removed. Thus, the control gate electrode CG and the memory gate electrode MG are exposed. In the I/O region 1B, the metal films ME1 and ME2 embedded in the first trench over the gate insulating film GI2 form the gate electrode G2. In the logic region 1C, the metal films ME1 and ME2 embedded in the second trench over the gate insulating film GI1 form the gate electrode G1.

As a result, in the logic region 1C, the lower-breakdown-voltage MISFET Q1 having the gate electrode G1 and the source/drain regions is formed while, in the I/O region 1B, the higher-breakdown-voltage MISFET Q2 having the gate electrode G2 and the source/drain regions is formed.

The insulating film HK and the gate insulating film GI1 which are located immediately below the gate electrode G1 form the gate insulating film of the MISFET Q1. The insulating film HK and the gate insulating film GI2 which are located immediately below the gate electrode G2 form the gate insulating film of the MISFET Q2. In Embodiment 2, the dummy gate electrodes DG1 and DG2 (see FIG. 20) are removed and replaced with the gate electrodes G1 and G2.

In Embodiment 2, each of the gate electrodes G1 and G2 is formed using the metal films and provided as a metal gate electrode. This allows the advantage of being able to suppress a depletion phenomenon in each of the gate electrodes G1 and G2 and eliminate a parasitic capacitance to be obtained. This also allows the advantage of being able to reduce the sizes of transistors (reduce the thicknesses of the gate insulating films) to be obtained.

Figure 24:
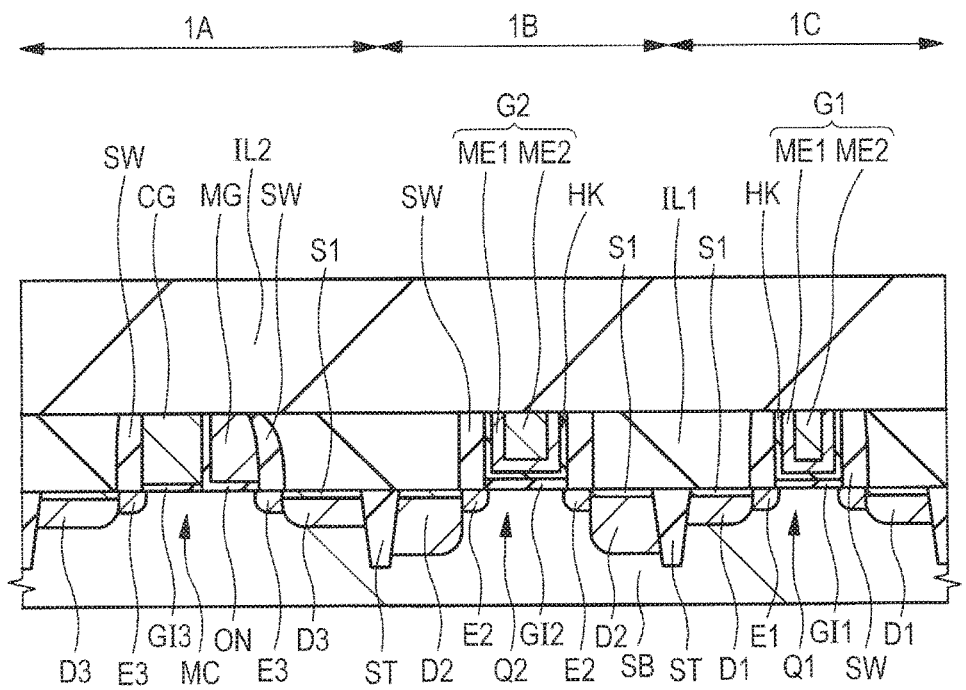
FIG. 24 is a cross-sectional view of the semiconductor device during the manufacturing process thereof, which is subsequent to FIG. 23.

Next, as shown in FIG. 24, the interlayer insulating film IL2 covering the entire upper surface of the interlayer insulating film IL1 is formed using, e.g., a CVD method. The interlayer insulating film IL2 is made of, e.g., a silicon dioxide film and covers the respective upper surfaces of the control gate electrode CG, the memory gate electrode MG, the gate electrodes G1 and G2, and the interlayer insulating film IL1.

Note that, prior to the formation of the interlayer insulating film IL2, silicide layers (not shown) covering the respective upper surfaces of the control gate electrode CG and the memory gate electrode MG may also be formed. In that case, prior to the formation of the interlayer insulating film IL2, an insulating film covering the respective upper surfaces of the gate electrodes G1 and G2 in the I/O region 1B and the logic region 1C is formed. Then, a metal film (e.g., a nickel film) is formed to come in contact with the respective upper surfaces of the control gate electrode CG and the memory gate electrode MG which are exposed from the insulating film. Subsequently, heat treatment is performed to cause the respective upper surfaces of the control gate electrode CG and the memory gate electrode MG to react with the metal film and thus form the foregoing silicide layers. Then, the unreacted metal film is removed. In the step of removing the metal film, the gate electrodes G1 and G2 each covered with the foregoing insulating film are not removed. Then, the interlayer insulating film IL2 is formed as described above.

Figure 25:
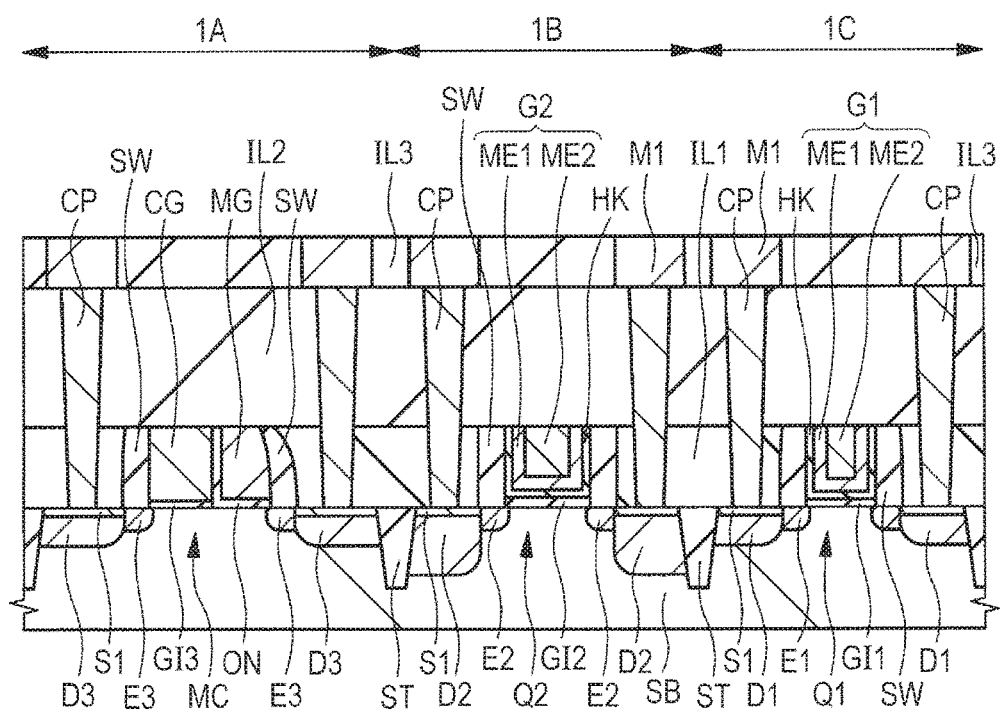
FIG. 25 is a cross-sectional view of the semiconductor device during the manufacturing process thereof, which is subsequent to FIG. 24.

Next, as shown in FIG. 25, the same step as the step described using FIG. 14 is performed to form the plurality of contact plugs CP extending through the multi-layer film including the interlayer insulating films IL1 and IL2. Then, over the interlayer insulating film IL2, the first wiring layer including the interlayer insulating film IL3 and the plurality of wires M1 is formed. Subsequently, over the first wiring layer, the second wiring layer, the third wiring layer, and the like are formed in this order to form the multiple wiring layers. Then, a semiconductor wafer is singulated by a dicing step to provide the plurality of semiconductor chips. In this manner, each of the semiconductor devices in Embodiment 2 is formed.

In Embodiment 2, in the step described using FIG. 12, using the thick gate pattern including the gate insulating film GI2, the dummy gate electrode DG2, the ONO film ON, and the silicon film PS2 which are stacked over the semiconductor substrate SB as a mask, the ion implantation is performed with a relatively high energy to thus form, in the I/O region 1B, the $n^-$-type semiconductor regions D2 deeper than the $n^-$-type semiconductor regions D1 and D3. This allows the same effects as obtained in Embodiment 1 described above to be obtained.

Embodiment 3

In Embodiment 3, when a memory cell having a floating gate split structure is formed, the source/drain regions of the higher-breakdown-voltage MISFET in the I/O region are formed deeper.

Structure of Semiconductor Device in Embodiment 3

Figure 26:
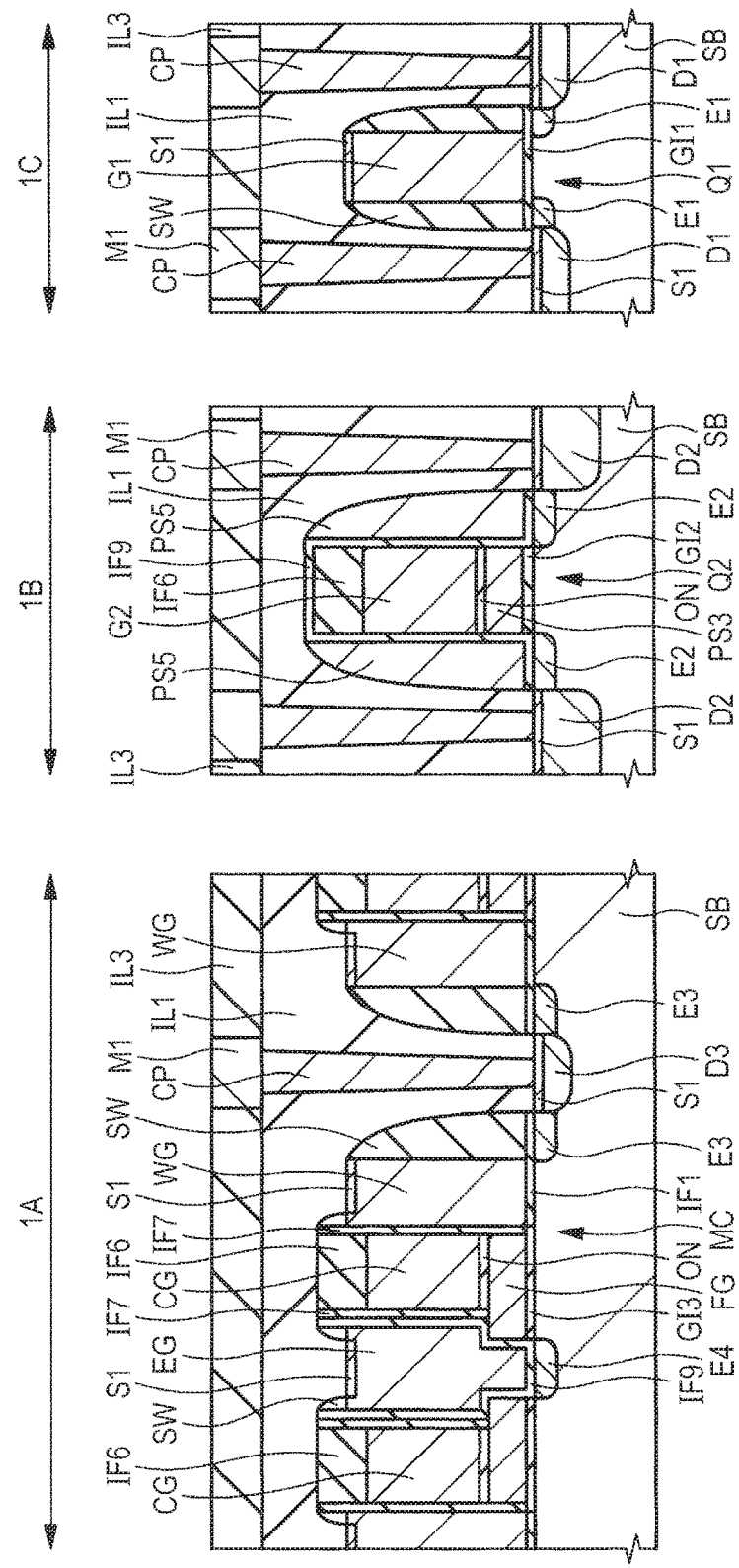
FIG. 26 is a cross-sectional view of a semiconductor device in Embodiment 3.

FIG. 26 shows a cross-sectional view of a semiconductor device in Embodiment 3. FIG. 26 shows the memory cell region 1A, the I/O region 1B, and the logic region 1C in this order in the left-to-right direction in the drawing.

In the structure shown in FIG. 26, in the memory cell region 1A, gate patterns each including the gate insulating film GI3, a floating gate electrode FG, the ONO film ON, the control gate electrode CG, and an insulating film IF6 which are stacked in this order over the main surface of the semiconductor substrate SB are arranged in juxtaposition to be spaced apart from each other. The respective widths of the gate insulating film GI3 and the floating gate electrodes FG in the gate length direction are larger than the respective widths of the ONO film ON, the control gate electrode CG, and the insulating film IF6 in the gate length direction. Between the foregoing two gate patterns, the respective end portions of the gate insulating film GI3 and the floating gate electrode FG protrude in a lateral direction.

The gate insulating film GI3 is made of, e.g., a silicon dioxide film. Each of the floating gate electrode FG and the control gate electrode CG is made of, e.g., a polysilicon film. The insulating film IF6 is made of, e.g., a silicon nitride film. The configuration of the ONO film ON has a multi-layer structure (see FIG. 27) including a silicon nitride film as a charge storage portion, in the same manner in Embodiment 1 described above.

In the space between the foregoing adjacent two gate patterns, an erase gate electrode EG is embedded via insulating films IF7 and IF9 formed in this order. The insulating film IF9 is formed continuously so as to cover the respective side surfaces of the facing gate patterns and the main surface of the semiconductor substrate SB located under the space between the facing gate patterns. That is, the insulating film IF9 covers a portion of the upper surface of the floating gate electrode FG and the side surfaces thereof and, between the semiconductor substrate SB and the erase gate electrode EG, the insulating film IF9 is interposed. The insulating film IF7 exposes a portion of each of the upper and side surfaces of the floating gate electrodes FG. The side surface of each of the gate patterns which is opposite to the erase gate electrode EG is covered with the insulating film IF7, a word gate electrode WG, and the sidewall SW which are formed in this order. The word gate electrode WG and the sidewall SW are formed over the semiconductor substrate SB via the insulating film IF1.

Each of the insulating films IF1, IF7, and IF9 is made of, e.g., a silicon dioxide film. Each of the erase gate electrode EG and the word gate electrode WG is made of, e.g., a polysilicon film. Each of the sidewalls SW is made of a multi-layer film including, e.g., a silicon nitride film and a silicon dioxide film, but is shown as a single-layer film in the drawing. The respective upper surfaces of the erase gate electrode EG, the word gate electrode WG, and the sidewalls SW are located at positions higher in level than that of the upper surface of the control gate electrode CG and lower in level than those of the respective upper surfaces of the insulating films IF6, IF7, and IF9.

In the main surface of the semiconductor substrate SB located in the region adjacent to the sidewall SW in the gate length direction and opposite to the word gate electrode WG, the drain region including the $n^-$-type semiconductor region E3 and the $n^+$-type semiconductor region D3 is formed. In the main surface of the semiconductor substrate SB located between the foregoing adjacent gate patterns, the source region including the $n^-$-type semiconductor region E4 is formed. Note that, in the main surface of the semiconductor substrate SB, channel regions as p-type semiconductor regions and p-type wells are formed, but the illustration thereof is omitted. The source region, the drain region, the floating gate electrode FG, the control gate electrode CG, the erase gate electrode EG, and the word gate electrode WG each described above form the memory cell MC having the floating gate split structure.

In the I/O region 1B, over the semiconductor substrate SB, a gate pattern including the gate insulating film GI2, a silicon film (conductive film) PS3, the ONO film ON, the gate electrode G2, and the insulating film IF6 is formed. The insulating film IF6 covers the upper surface of the gate electrode G2 and exposes the side surfaces of the gate electrode G2. The both side surfaces of the gate pattern are covered with silicon films PS5 via the insulating film IF9. The silicon films PS5 are self-alignedly formed and have sidewall shapes. Between the silicon films PS5 and the main surface of the semiconductor substrate SB, the insulating film IF9 is interposed. In the I/O region 1B, the insulating film IF9 continuously covers the upper surface of the insulating film IF6, the side surfaces of the gate pattern, and the main surface of the semiconductor substrate SB located lateral to the gate pattern. The gate insulating film GI2 is made of, e.g., a silicon dioxide film. The gate electrode G2 is made of, e.g., a polysilicon film.

In the main surface of the semiconductor substrate SB located lateral to the gate electrode G2, the pair of source/drain regions each including the $n^-$-type semiconductor region E2 and the $n^-$-type semiconductor region D2 are formed. The $n^-$-type semiconductor regions E2 as the extension regions shown herein are shallower than the $n^+$-type semiconductor regions D2 as the diffusion regions. However, the $n^-$-type semiconductor regions E2 may also be deeper than the $n^-$-type semiconductor regions D2. The source/drain regions and the gate electrode G2 form the higher-breakdown-voltage MISFET Q2. The gate insulating film GI2, the silicon film PS3, and the ONO film ON which are stacked under the gate electrode G2 function as the gate insulating film of the MISFET Q2.

In the logic region 1C, over the semiconductor substrate SB, the gate pattern including the gate insulating film GI1 and the gate electrode G1 is formed. The both side surfaces of the gate electrode G1 are covered with the sidewalls SW. Between each of the gate electrode G1 and the sidewalls SW and the semiconductor substrate SB, the gate insulating film GI1 is interposed. The gate insulating film GI1 is made of, e.g., a silicon dioxide film. The gate electrode G1 is made of, e.g., a polysilicon film.

In the main surface of the semiconductor substrate SB located lateral to the gate electrode G1, the pair of source/drain regions each including the $n^-$-type semiconductor region E1 and the $n^-$-type semiconductor region D1 are formed. The $n^-$-type semiconductor regions E1 as the extension regions shown herein are shallower than the $n^+$-type semiconductor regions D1 as the diffusion regions. The source/drain regions and the gate electrode G1 form the lower-breakdown-voltage MISFET Q1.

Immediately above the erase gate electrode EG and the word gate electrode WG in the memory cell region 1A, the sidewalls SW are formed so as to cover the side surfaces of insulating films IF7 and IF9. The respective upper surfaces of the erase gate electrode EG, the word gate electrode WG, the $n^-$-type semiconductor regions D1, D2, and D3, and the gate electrode G1 are covered with the silicide layers S1. Over the semiconductor substrate SB, the interlayer insulating film IL1 is formed so as to cover the memory cell MC and the MISFETs Q1 and Q2. In the same manner as in Embodiment 1 described above, the contact plugs CP extending through the interlayer insulating film IL1 and the first wiring layer including the interlayer insulating film IL3 and the wires M1 which are formed over the interlayer insulating film IL1 are formed.

The floating gate electrode FG in the memory cell region 1A and the silicon film PS3 in the I/O region 1B are each made of a conductive film in a floating state which is electrically coupled to none of wires, electrodes, the semiconductor substrate SB, and the like and which is not included in a circuit.

The height of a gate pattern including the gate insulating film GI3, the floating gate electrode FG, the ONO film ON, the control gate electrode CG, and the insulating film IF6 and formed in the memory cell region 1A is equal to the height of a gate pattern including the gate insulating film GI2, the silicon film PS3, the ONO film ON, the gate electrode G2, and the insulating film IF6 and formed in the I/O region 1B.

By contrast, one of the characteristic features of Embodiment 3 is that the height of the gate pattern including the gate electrode G2 in the I/O region 1B is larger than the height of the gate pattern including the gate insulating film GI1 and the gate electrode G1 and formed in the logic region 1C. The height of the gate pattern including the gate electrode G2 in the I/O region 1B is also larger than the height of each of the erase gate electrode EG, the word gate electrode WG, and the sidewalls SW which are formed in the memory cell region 1A.

Accordingly, the height of each of the sidewall-shaped silicon films PS5 formed in the I/O region 1B is higher than the height of each of the erase gate electrode EG, the word gate electrode WG, and the sidewalls SW in the memory cell region 1A and the sidewalls SW in the logic region 1C.

One of the characteristic features of the semiconductor device in Embodiment 3 is that the depth of each of the $n^-$-type semiconductor regions D2 is deeper than the depth of each of the $n^-$-type semiconductor regions D1 and D3. For example, the depth of each of the $n^+$-type semiconductor regions D2 is not less than twice the depth of each of the $n^+$-type semiconductor regions D1 and D3. This is because, by using the foregoing gate pattern and the silicon films PS5 in the I/O region 1B which are higher in level than each of the erase gate electrode EG, the word gate electrode WG, and the sidewalls SW in the memory cell region 1A and the gate electrode G1 and the sidewalls SW in the logic region 1C as the mask, the $n^+$-type semiconductor regions D2 can be formed by the ion implantation performed using a high energy.

Operation of Nonvolatile Memory

Next, referring to FIG. 26, a description will be given of an example of the operation of the nonvolatile memory.

In the memory cell MC having the floating gate split structure, during a write operation, 0.5 V is applied to the drain region coupled to a bit line, 1 V is applied to the word gate electrode WG coupled to a word line, 4.5 V is applied to each of the source region and the erase gate electrode EG, and 10.5 V is applied to the control gate electrode CG. As a result, electrons flowing from the drain region toward the source region are trapped in the flowing gate electrode FG in the floating state to bring the memory cell MC into a written state.

During an erase operation, 0 V is applied to each of the source/drain regions, the word gate electrode WG, and the control gate electrode CG and 11.5 V is applied to the erase gate electrode EG to extract the electrons from within the floating gate electrode FG into the erase gate electrode EG. This brings the memory cell MC into an erased state.

During a read operation, 0.5 V is applied to the drain region, 0 V is applied to each of the source region and the erase gate electrode EG, and a power supply voltage is applied to each of the word gate electrode WG and the control gate electrode CG. At this time, depending on the presence or absence of charges in the floating gate electrode FG, the threshold voltage of the MISFET including the control gate electrode CG and the source/drain regions changes to allow the written state or the erased state of the memory cell MC to be determined.

Manufacturing Method of Semiconductor Device in Embodiment 3

The following will describe a method of manufacturing the semiconductor device in Embodiment 3 using FIGS. 27 to 46. FIGS. 27 to 46 are cross-sectional views of the semiconductor device in Embodiment 3 during the manufacturing process thereof. FIGS. 27 to 46 show the cross-sectional views of the memory cell region 1A, the I/O region 1B, and the logic region 1C which are arranged in this order in the left-to-right direction in the drawing.

First, the semiconductor substrate SB made of, e.g., monocrystalline silicon is provided. Then, in the main surface of the semiconductor substrate SB, a plurality of isolation regions (not shown) defining active regions are formed.

Subsequently, in the main surface of the semiconductor substrate SB located in the memory cell region 1A, the I/O region 1B, and the logic region 1C, p-type wells are formed, though the illustration thereof is omitted. The p-type wells can be formed by ion implantation of a p-type impurity such as, e.g., B (boron) into the semiconductor substrate SB or the like.

Subsequently, over the main surface of the semiconductor substrate SB, an insulating film IF, the silicon film (conductive film) PS3, the ONO film ON, a silicon film (conductive film) PS4, and the insulating film IF6 are formed in this order. The insulating film IF is formed by, e.g., a thermal oxidation method. The silicon films PS3 and PS4 and the insulating film IF6 are formed by, e.g., a CVD method. A method of forming the ONO film ON is the same as the method described using FIG. 6. The ONO film ON includes the silicon dioxide film OX1, the silicon nitride film NT, and the silicon dioxide film OX2 which are stacked in this order over the silicon film PS3. However, in each of the drawings used in the following description, for improved clarity of illustration, the ONO film ON is shown as a single-layer film.

In each of the silicon films PS3 and PS4, e.g., a p-type impurity (e.g., B (boron) is introduced. The film thickness of the silicon film PS4 is, e.g., 80 nm. The film thickness of the insulating film IF6 is, e.g., 260 nm.

Figure 28:
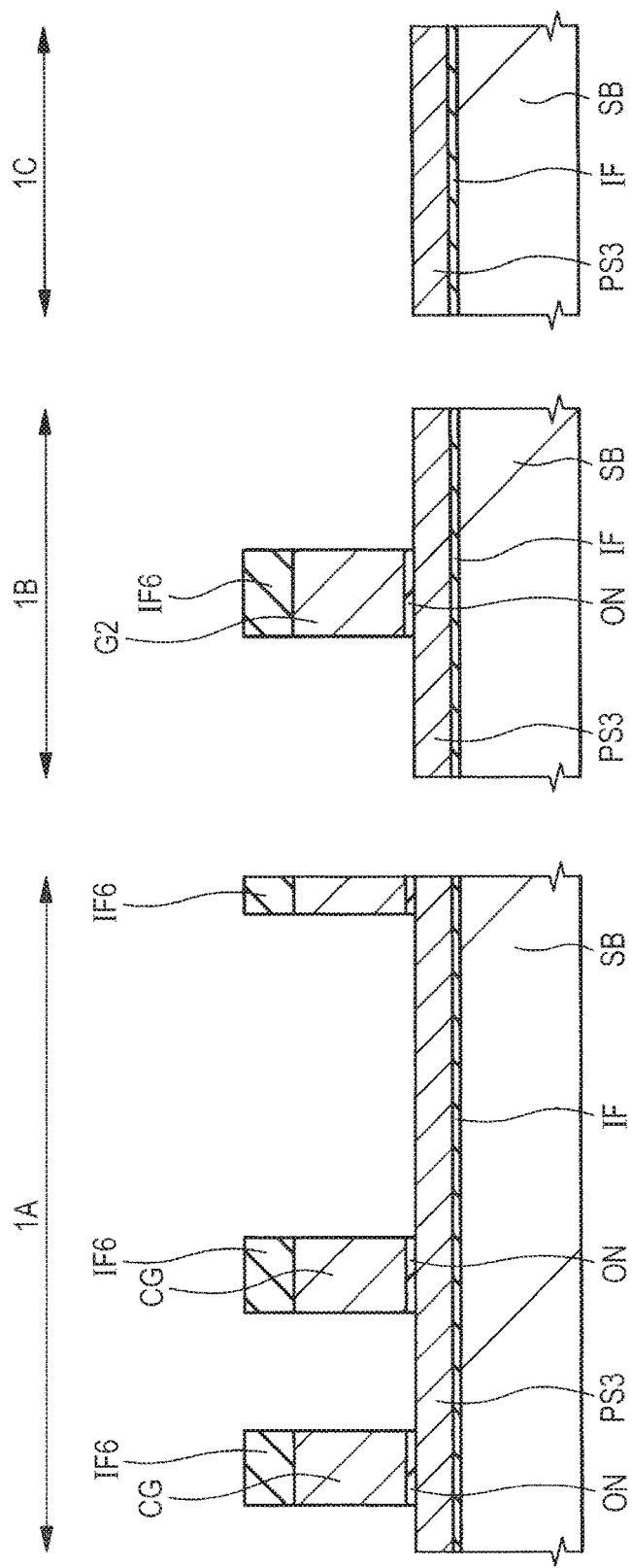
FIG. 28 is a cross-sectional view of the semiconductor device during the manufacturing process thereof, which is subsequent to FIG. 27.

Next, as shown in FIG. 28, using a photolithographic technique and an etching method, the insulating film IF6, the silicon film PS4, and the ONO film ON are processed. At this time, in each of the memory cell region 1A and the I/O region 1B, a pattern including the insulating film IF6, the silicon film PS4, and the ONO film ON is left, while the insulating film IF6, the silicon film PS4, and the ONO film ON are entirely removed from the logic region 1C. As a result, the upper surface of the silicon film PS3 is exposed in each of the regions. FIG. 28 shows the structure in which the etching is ended at the time when the upper surface of the silicon film PS3 is exposed, and the upper surface of the silicon film PS3 is not lowered in level. However, it may also be possible that the silicon film PS3 is etched back to a middle point in the depth direction thereof, and the upper surface of the silicon film PS3 exposed from the insulating film IF6, the silicon film PS4, and the ONO film ON is lowered in level.

As a result, in the memory cell region 1A, the control gate electrode CG made of the silicon film PS4 is formed while, in the I/O region 1B, the gate electrode G2 made of the silicon film PS4 is formed.

Figure 29:
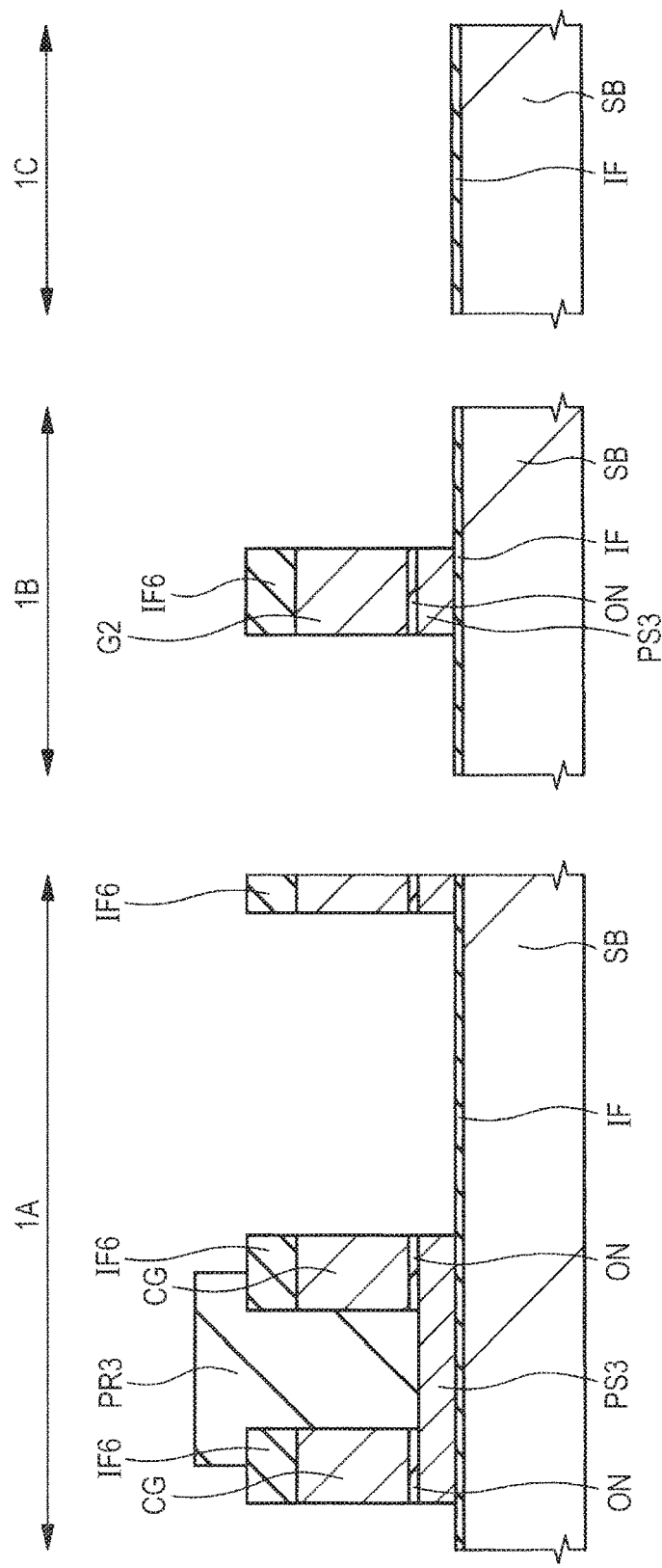
FIG. 29 is a cross-sectional view of the semiconductor device during the manufacturing process thereof, which is subsequent to FIG. 28.

Next, as shown in FIG. 29, in the memory cell region 1A, a photoresist film PR3 covering the region between the adjacent patterns each including the insulating film IF6, the control gate electrode CG, and the ONO film ON is formed over the semiconductor substrate SB. The photoresist film PR3 terminates immediately above the insulating film IF6.

Subsequently, the silicon film PS3 exposed from the photoresist film PR3, the insulating film IF6, the control gate electrode CG, the gate electrode G2, and the ONO film ON is removed by an etching method. As a result, the upper surface of the insulating film IF is exposed. From the logic region 1C, the silicon film PS3 is entirely removed.

Figure 30:
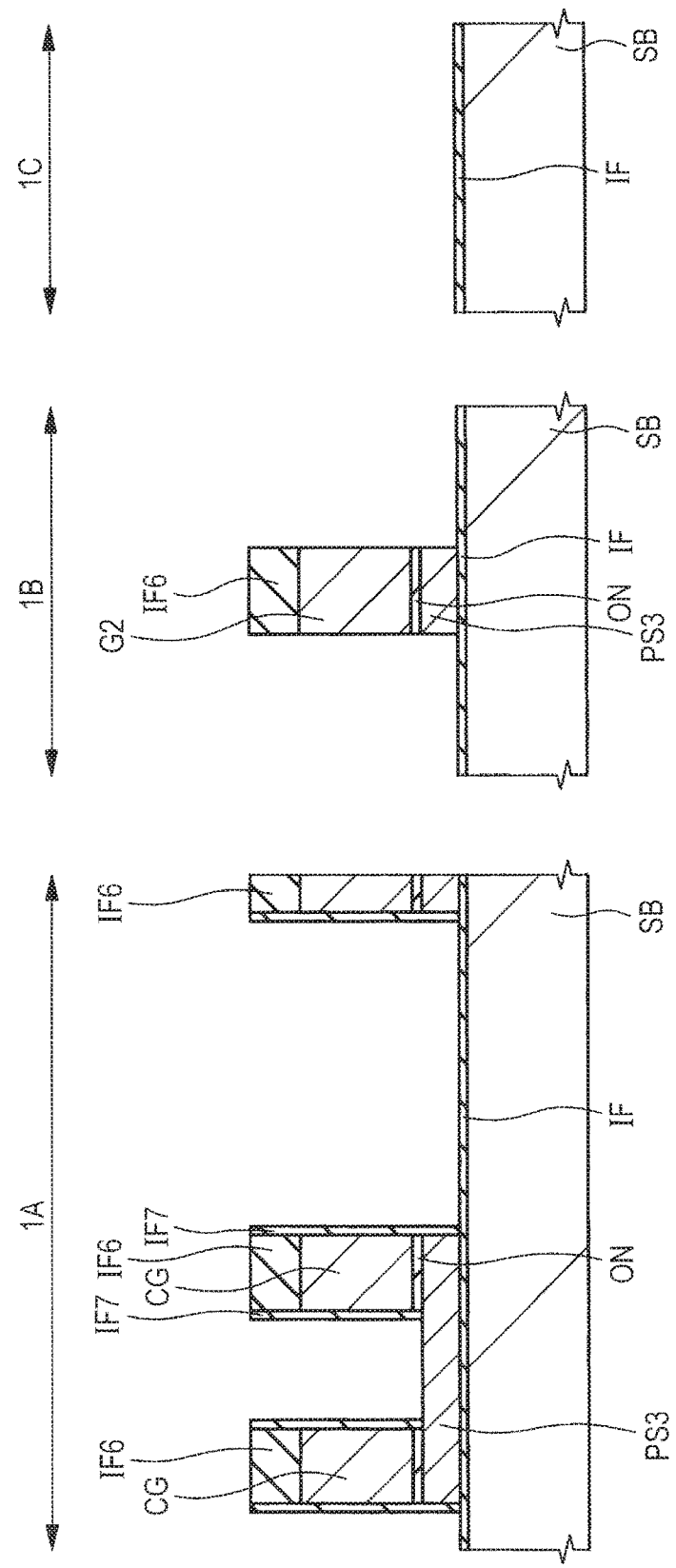
FIG. 30 is a cross-sectional view of the semiconductor device during the manufacturing process thereof, which is subsequent to FIG. 29.

Next, as shown in FIG. 30, the photoresist film PR3 is removed, and then the insulating film IF7 is formed (deposited) over the entire main surface of the semiconductor substrate SB using, e.g., a CVD method. As a result, the upper and side surfaces of a pattern including the insulating film IF6, the control gate electrode CG, and the ONO film ON and the upper surface of the insulating film IF are covered with the insulating film IF7. The film thickness of the insulating film IF7 is, e.g., 36 nm. For example, the insulating film IF7 is made of a multi-layer film including a silicon dioxide film and a silicon nitride film or of a silicon nitride film. In the memory cell region 1A, the upper surface of the silicon film PS3 between the two patterns each including the insulating film IF6, the control gate electrode CG, and the ONO film ON is covered with the insulating film IF7.

Subsequently, the insulating film IF7 is etched back by a dry etching method to expose the upper surface of the insulating film IF. As a result, only the insulating films IF7 covering the side surfaces of the patterns each including the insulating film IF6, the control gate electrode CG, and the ONO film ON remain. Note that, in the memory cell region 1A, the insulating films IF7 remaining in the form of sidewalls are shown but, for improved clarity of illustration, the illustration of the insulating films IF7 covering the side surfaces of a pattern including the insulating film IF6, the gate electrode G2, the ONO film ON, and the silicon film PS3 in the I/O region 1B is omitted.

Figure 31:
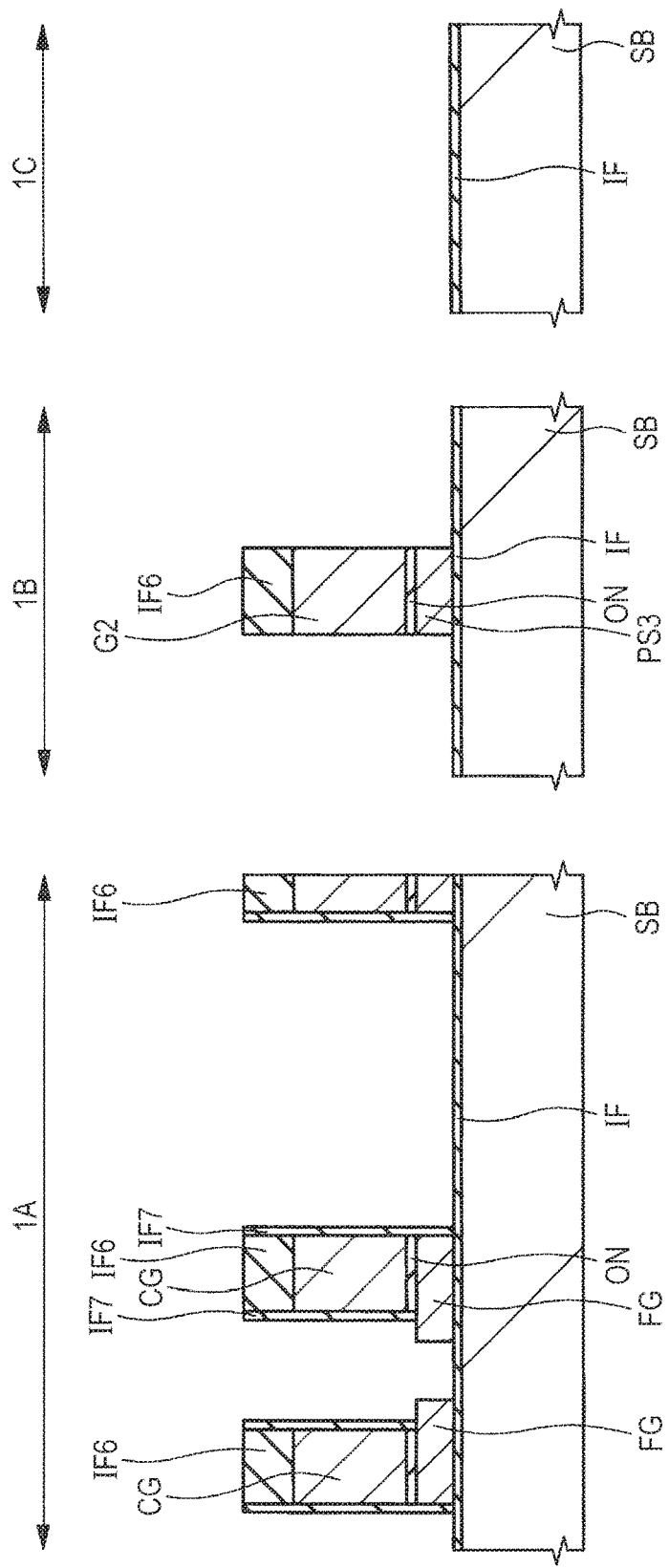
FIG. 31 is a cross-sectional view of the semiconductor device during the manufacturing process thereof, which is subsequent to FIG. 30.

Next, as shown in FIG. 31, using a photolithographic technique and an etching method, the silicon film PS3 formed between the two patterns each including the insulating film IF6, the control gate electrode CG, and the ONO film ON is processed in the memory cell region 1A to thus expose the upper surface of the insulating film IF. As a result, the silicon film PS3 immediately below the two patterns each including the insulating film IF6, the control gate electrode CG, and the ONO film ON is divided. Thus, in the memory cell region 1A, the floating gate electrodes FG made of the silicon films PS3 are formed. Consequently, a plurality of multi-layer patterns each including the insulating film IF6, the control gate electrode CG, the ONO film ON, and the floating gate electrode FG are formed.

Figure 32:
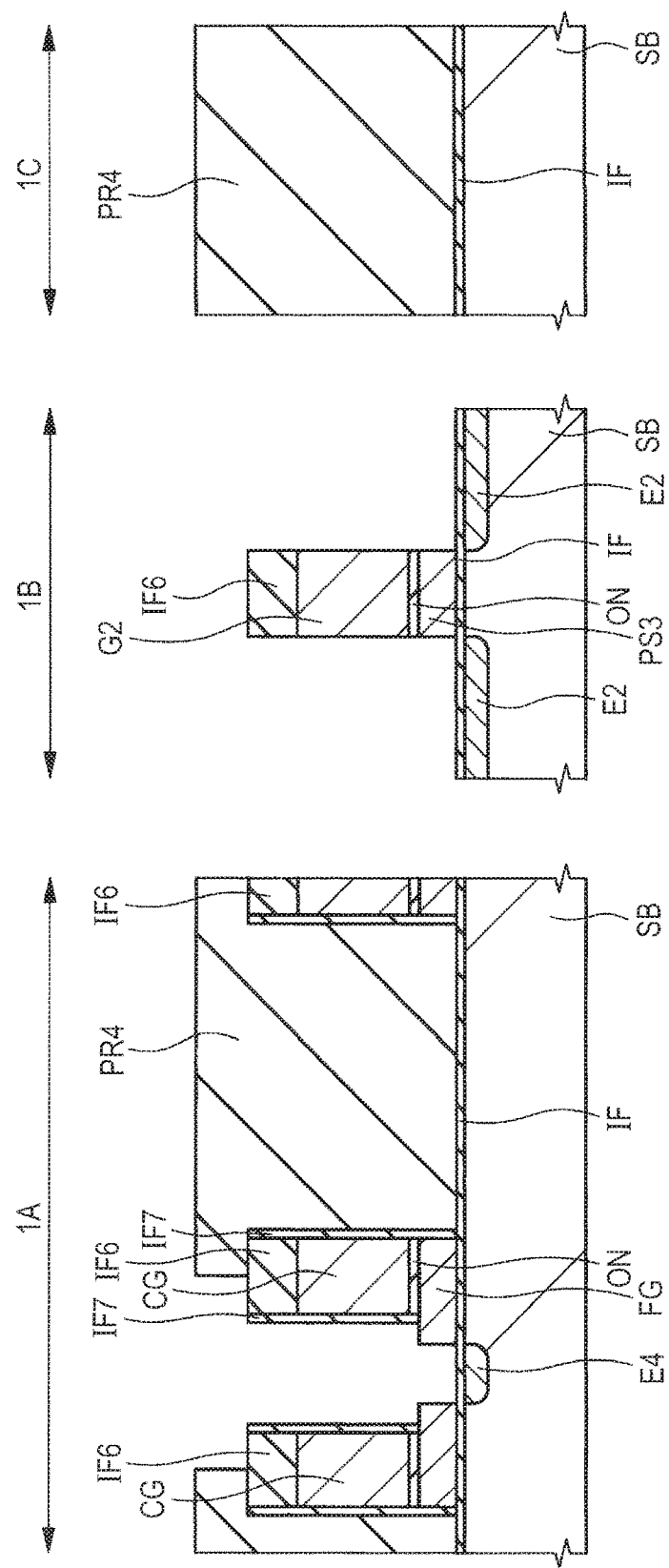
FIG. 32 is a cross-sectional view of the semiconductor device during the manufacturing process thereof, which is subsequent to FIG. 31.

Next, as shown in FIG. 32, a photoresist film PR4 covering a portion of the memory cell region 1A and the logic region 1C and exposing the I/O region 1B is formed over the semiconductor substrate SB. The photoresist film RP4 is a resist pattern exposing the main surface of the semiconductor substrate SB located in the region from which the silicon film PS3 has been removed in the step described using FIG. 31 and covering the main surface of the semiconductor substrate SB located between two multi-layer patterns each including the insulating film IF6, the control gate electrode CG, the ONO film ON, and the floating gate electrode FG in another place. In the memory cell region 1A, the photoresist film PR4 terminates immediately above the insulating film IF6.

Subsequently, using an ion implantation method, in the main surface of the semiconductor substrate SB located in the memory cell region 1A and the I/O region 1B, an n-type impurity (e.g., As (arsenic)) is implanted. In the implantation performed herein, the photoresist film PR4, the multi-layer patterns each including the insulating film IF6, the control gate electrode CG, the ONO film ON, and the floating gate electrode FG in the memory cell region 1A, and the multi-layer pattern including the insulating film IF6, the gate electrode G2, the ONO film ON, and the silicon film PS3 in the I/O region 1B are used as the implantation blocking mask. Thus, in the main surface of the semiconductor substrate SB located in the memory cell region 1A, the $n^-$-type semiconductor region E4 is formed, while the pair of $n^-$-type semiconductor regions E2 are formed in the main surface of the semiconductor substrate SB located in the I/O region 1B. The pair of $n^-$-type semiconductor regions E2 in the I/O region 1B are formed such that the gate electrode G2 is interposed therebetween in plan view.

Figure 33:
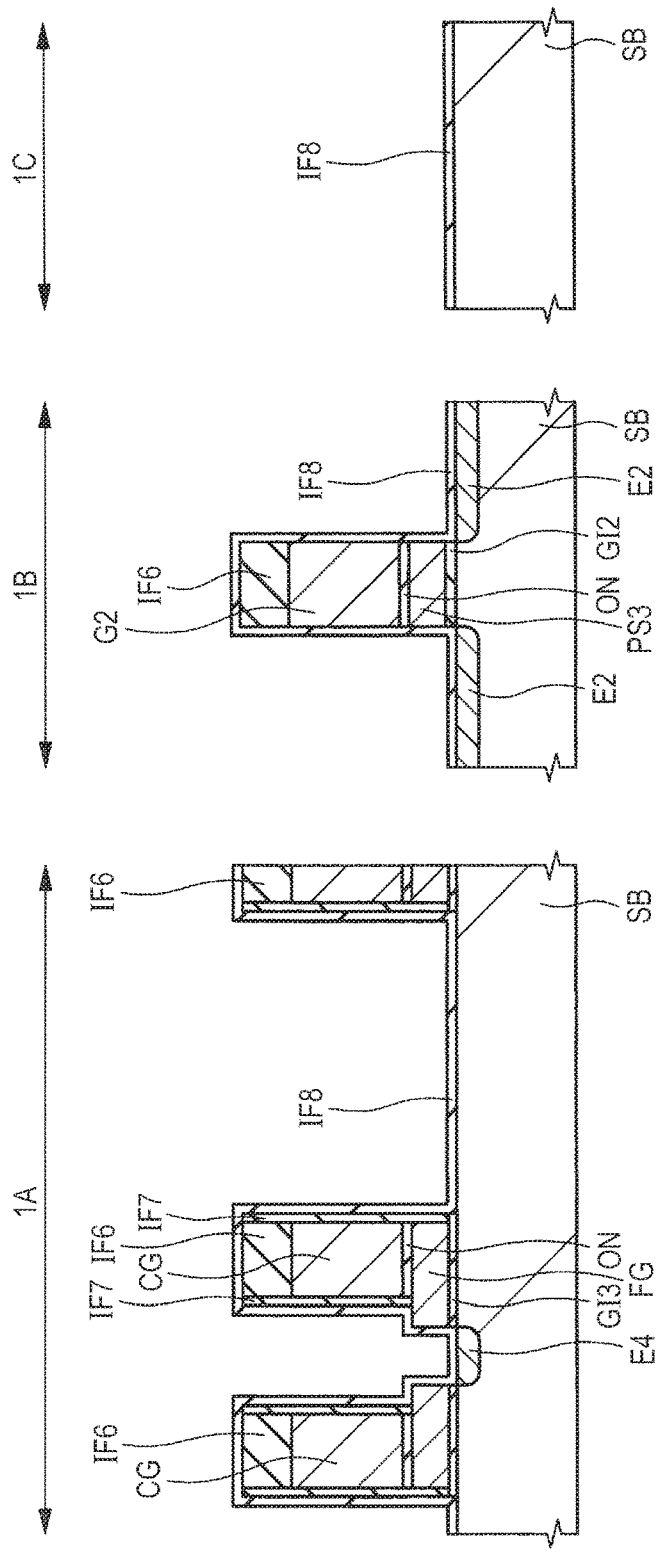
FIG. 33 is a cross-sectional view of the semiconductor device during the manufacturing process thereof, which is subsequent to FIG. 32.

Next, as shown in FIG. 33, the photoresist film PR4 is removed. Then, over the main surface of the semiconductor substrate SB, an insulating film IF8 is formed using, e.g., a CVD method. The insulating film IF8 is made of, e.g., a silicon dioxide film and has a film thickness of, e.g., 8 nm. Over the upper surface of the insulating film IF exposed from the floating gate electrodes FG and the silicon film PS3, the insulating film IF8 is formed to come in contact therewith. In the following, the illustration of the insulating film IF in contact with the lower surface of the insulating film IF8 is omitted on the assumption that the insulating film IF is integrated with the insulating film IF8. The insulating film IF immediately below each of the floating gate electrodes FG forms the gate insulating film GI3, while the insulating film IF immediately below the silicon film PS3 forms the gate insulating film GI2.

Figure 34:
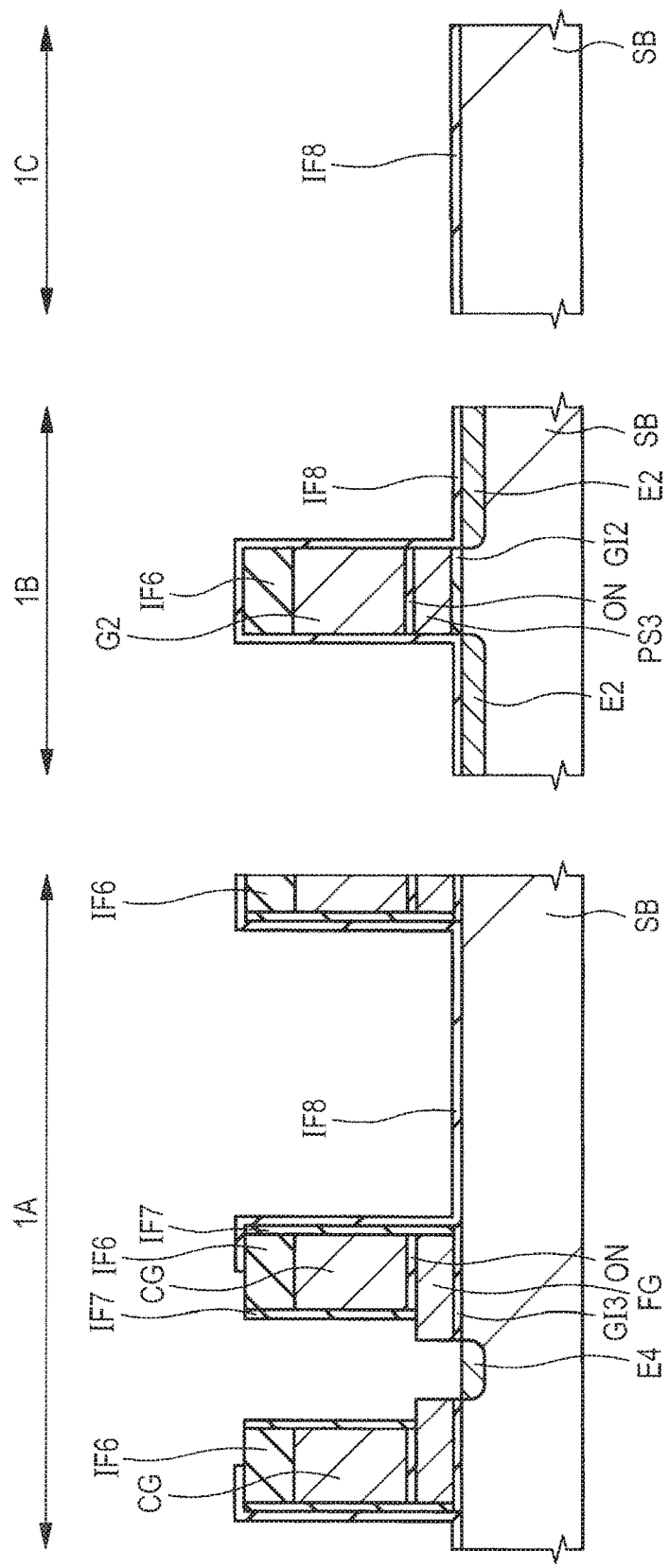
FIG. 34 is a cross-sectional view of the semiconductor device during the manufacturing process thereof, which is subsequent to FIG. 33.

Next, as shown in FIG. 34, using a photolithographic technique and a wet etching method, the insulating film IF8 located between the two multi-layer patterns each including the insulating film IF6, the control gate electrode CG, the ONO film ON, and the floating gate electrode FG is removed. This exposes the upper surface of the $n^-$-type semiconductor region E4.

Figure 35:
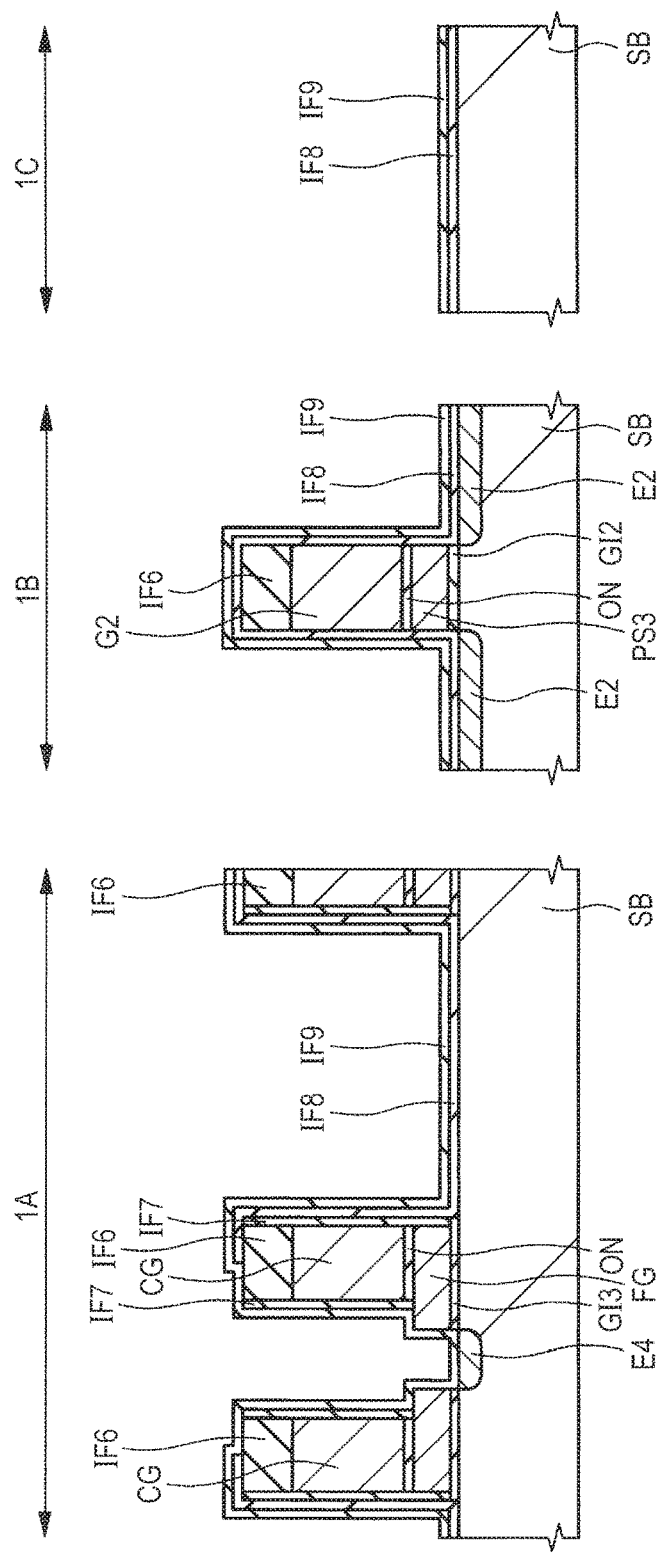
FIG. 35 is a cross-sectional view of the semiconductor device during the manufacturing process thereof, which is subsequent to FIG. 34.

Next, as shown in FIG. 35, over the main surface of the semiconductor substrate SB, an insulating film IF9 is formed using, e.g., a CVD method. The insulating film IF9 is made of, e.g., a silicon dioxide film and has a film thickness of, e.g., 15 nm. With the upper surface of the insulating film IF exposed from the floating gate electrodes FG and the silicon film PS3, the insulating film IF9 comes in contact.

Figure 36:
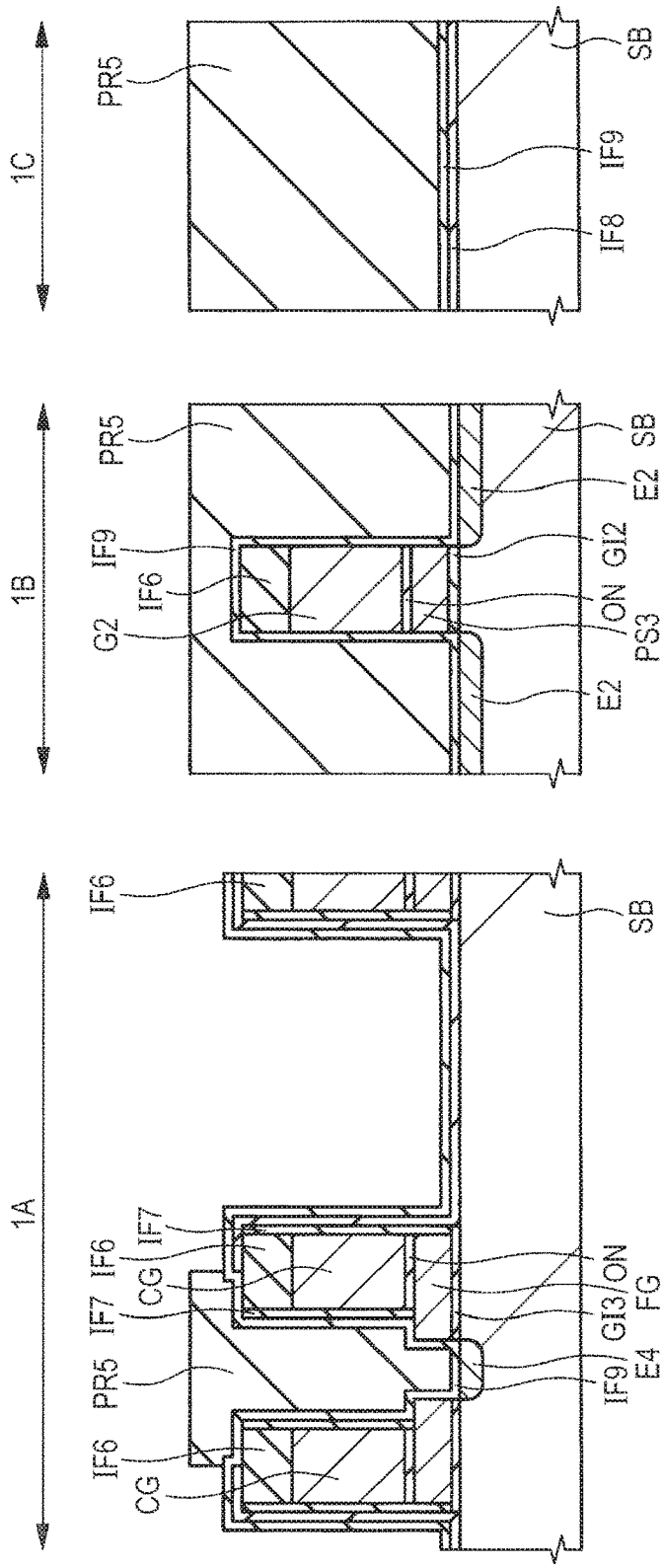
FIG. 36 is a cross-sectional view of the semiconductor device during the manufacturing process thereof, which is subsequent to FIG. 35.

Next, as shown in FIG. 36, a photoresist film PR5 covering a portion of the memory cell region 1A, the I/O region 1B, and the logic region 1C is formed over the semiconductor substrate SB. The photoresist film PR5 is a photoresist pattern covering the main surface of the semiconductor substrate SB located between two gate patterns each including the insulating film IF6, the control gate electrode CG, the ONO film ON, the floating gate electrode FG, and the gate insulating film GI3 in the region of the memory cell region 1A which includes the space immediately above the $n^-$-type semiconductor region E4 and exposing the insulating film IF8. Note that, in FIG. 36 and the drawings used in the subsequent description, for improved clarity of illustration, the insulating films IF8 and IF9 stacked in the I/O region 1B are shown as the integral single-layer insulating film IF9.

Subsequently, using the photoresist film PR5 and the gate patterns as a mask, a p-type impurity (e.g., B (boron)) is implanted into the main surface of the semiconductor substrate SB located between the adjacent two gate patterns by, e.g., an ion implantation method. Thus, in the main surface of the semiconductor substrate SB, the channel region (not shown) is formed.

Figure 37:
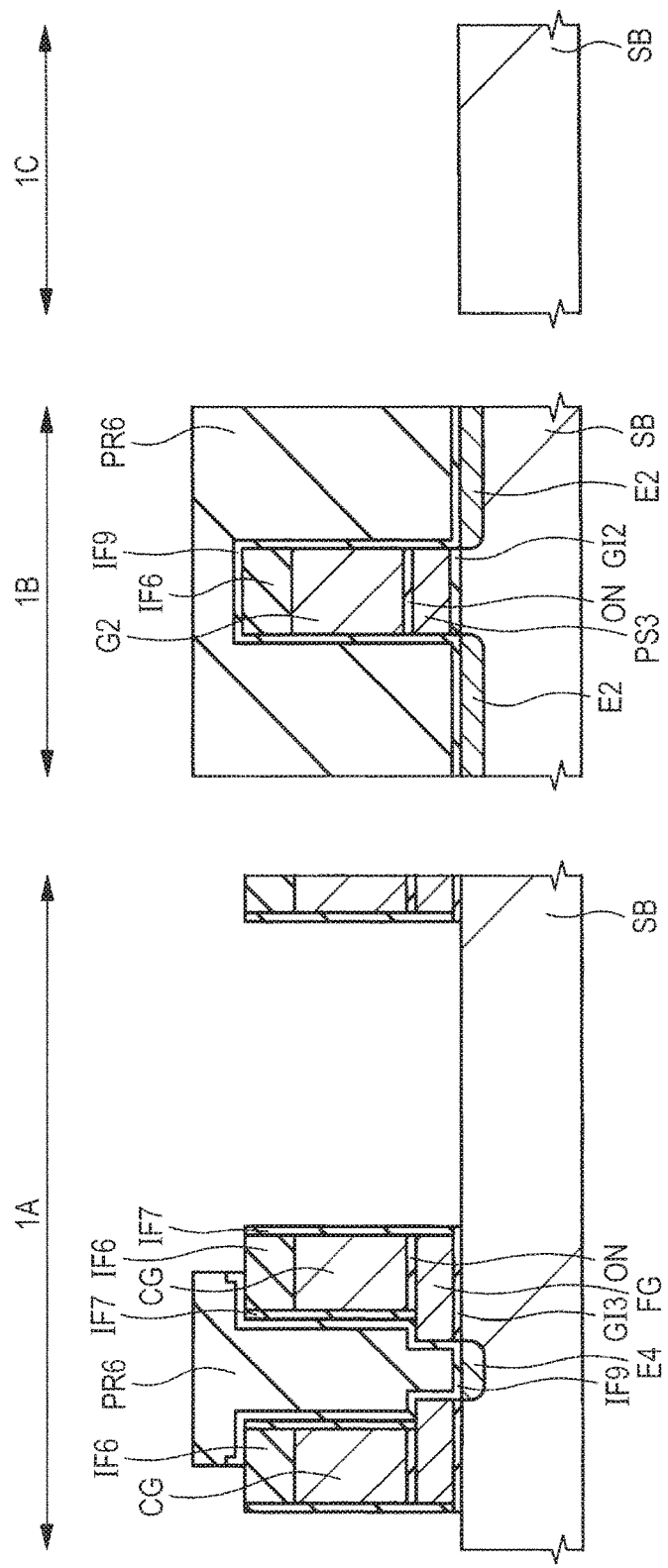
FIG. 37 is a cross-sectional view of the semiconductor device during the manufacturing process thereof, which is subsequent to FIG. 36.

Next, as shown in FIG. 37, the photoresist film PR5 is removed. Then, a photoresist film PR6 covering a portion of the memory cell region 1A and the I/O region 1B is formed over the semiconductor substrate SB. The photoresist film PR6 is a resist pattern covering the main surface of the semiconductor substrate SB located between the two gate patterns each including the insulating film IF6, the control gate electrode CG, the ONO film ON, the floating gate electrode FG, and the gate insulating film GI3 in the region of the memory cell region 1A which includes the space immediately above the $n^-$-type semiconductor region E4. The photoresist film PR6 exposes the main surface of the semiconductor substrate SB in which the foregoing channel regions are formed, the insulating film IF8 formed thereover, and the insulating film IF8 in the logic region 1C. A portion of the insulating film IF9 in the memory cell region 1A and the insulating film IF9 in the logic region 1C are also exposed from the photoresist film PR6.

Subsequently, using the photoresist film PR6 as a mask, wet etching is performed to remove the insulating films IF9 and IF8 exposed from the photoresist film PR6. As a result, in a portion of the memory cell region 1A, the main surface of the semiconductor substrate SB and the insulating film IF7 are exposed while, in the logic region 1C, the main surface of the semiconductor substrate SB is exposed.

Figure 38:
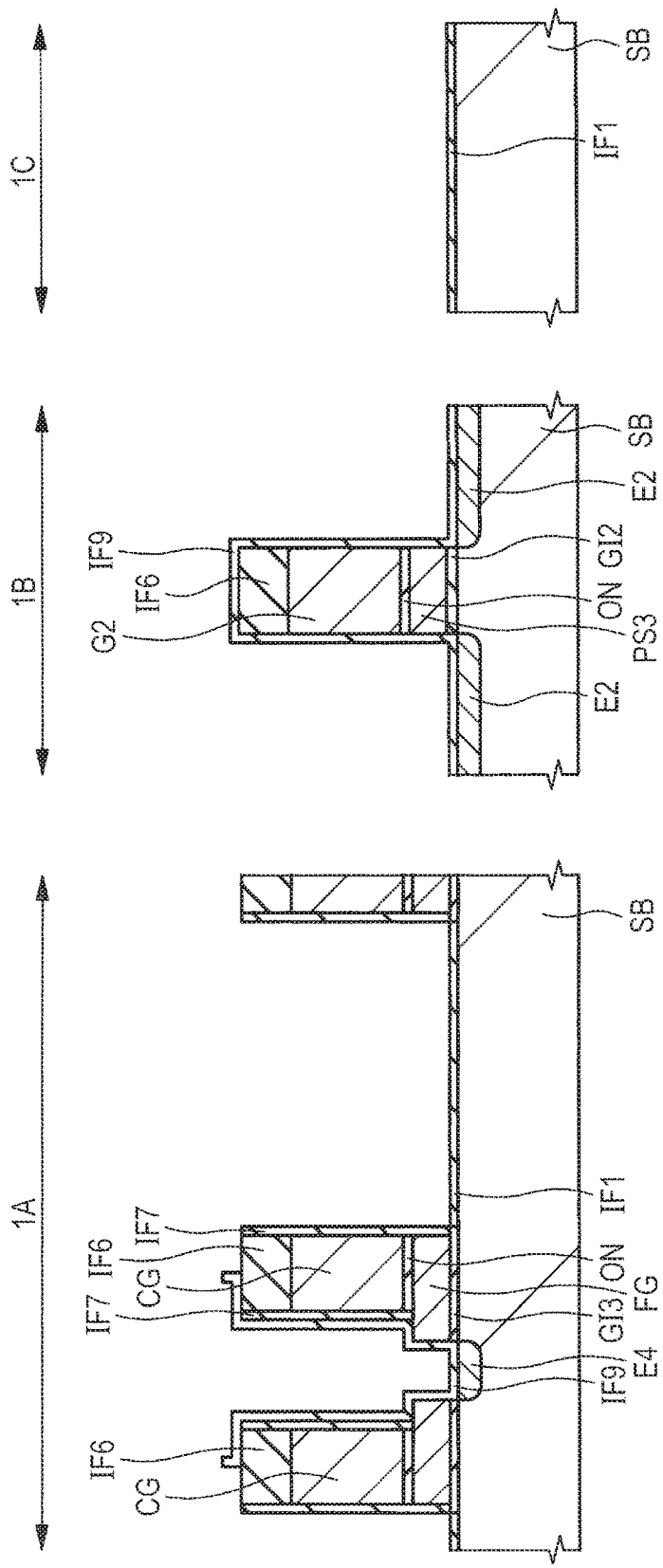
FIG. 38 is a cross-sectional view of the semiconductor device during the manufacturing process thereof, which is subsequent to FIG. 37.

Next, as shown in FIG. 38, the photoresist film PR6 is removed. Then, by, e.g., a thermal oxidation method, the insulating film IF1 is formed over the main surface of the semiconductor substrate SB exposed in the memory cell region 1A and the logic region 1C. The insulating film IF1 is made of, e.g., a silicon dioxide film and has a film thickness of, e.g., 2 nm.

Figure 39:
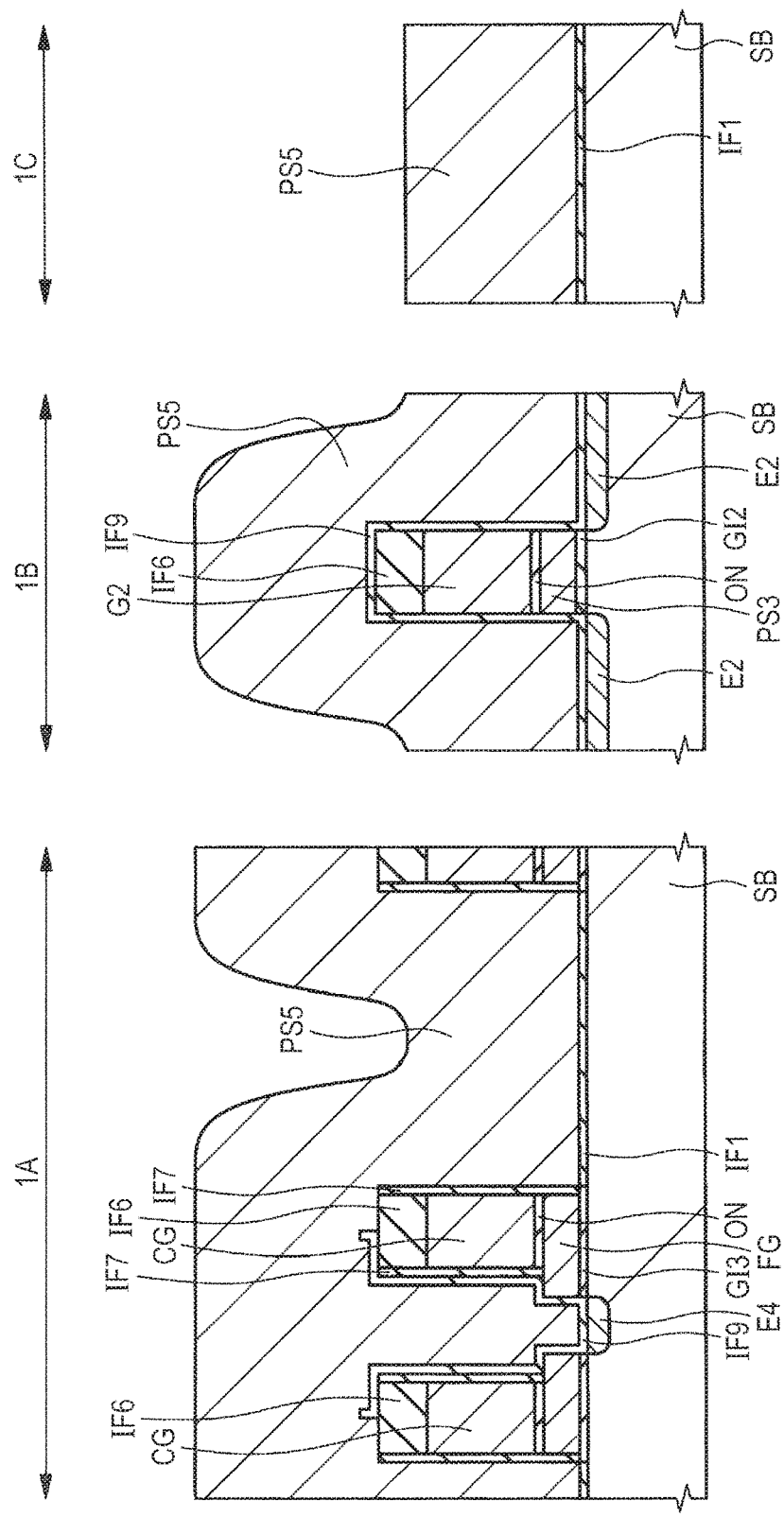
FIG. 39 is a cross-sectional view of the semiconductor device during the manufacturing process thereof, which is subsequent to FIG. 38.

Next, as shown in FIG. 39, using, e.g., a CVD method, the silicon film (conductive film) PS5 is formed over the entire main surface of the semiconductor substrate SB. A film thickness of the silicon film PS5 is, e.g., 150 nm. As a result, the spaces between the foregoing plurality of gate patterns formed in the memory cell region 1A are filled with the silicon film PS5. Also, in the I/O region 1B, the side surfaces of a gate pattern including the insulating film IF6, the gate electrode G2, the ONO film ON, the silicon film PS3, and the gate insulating film GI2 are covered with the silicon film PS5 via the insulating film IF9.

Figure 40:
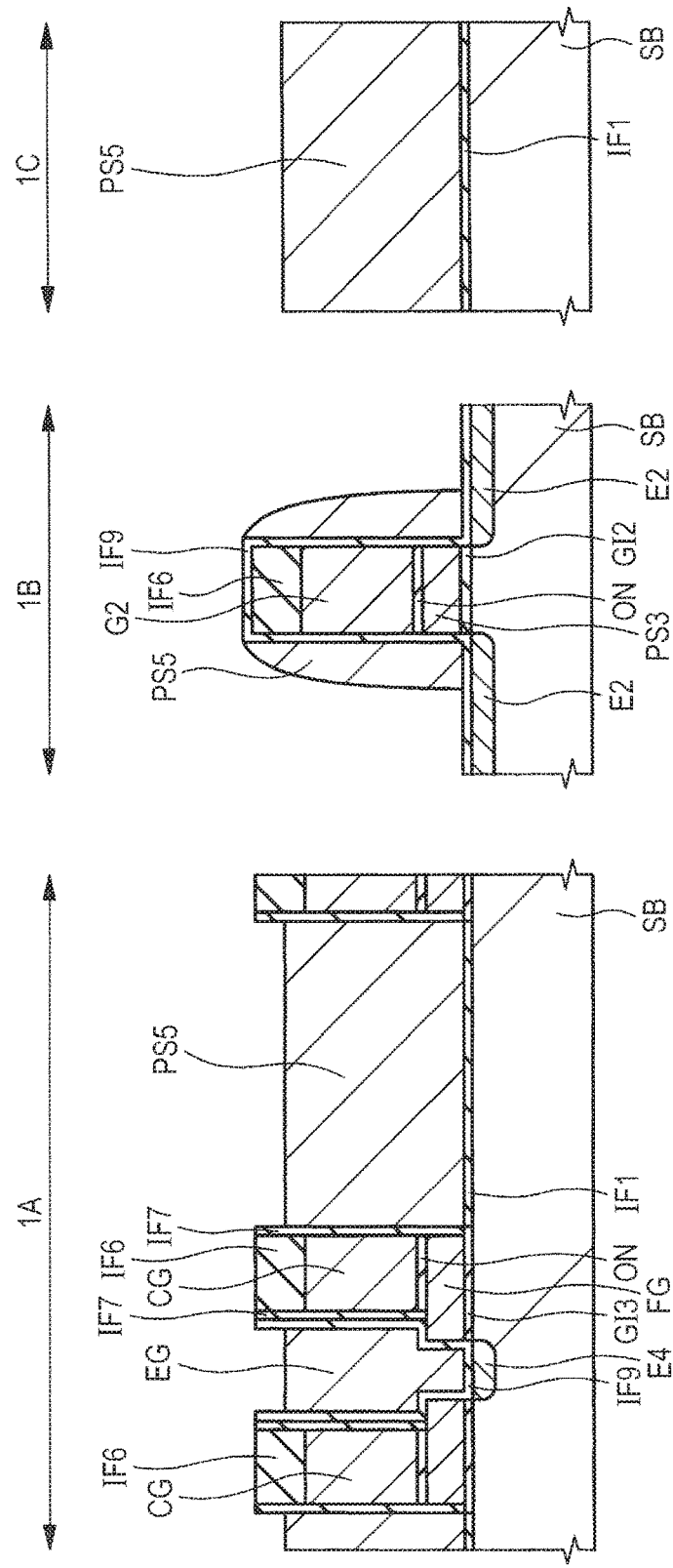
FIG. 40 is a cross-sectional view of the semiconductor device during the manufacturing process thereof, which is subsequent to FIG. 39.

Next, as shown in FIG. 40, using a photolithographic technique and an etching method, the silicon film PS5 is etched back. As a result, the upper surface of the insulating film IF6 in the memory cell region 1A and the upper surface of the insulating film IF9 in the I/O region 1B are exposed. In the memory cell region 1A, the upper surface of the silicon film PS5 is lowered in level to a position lower than that of the upper surface of the insulating film IF6 and higher than that of each of the upper surface of the control gate electrode CG and the upper surface of the gate electrode G2. Consequently, the erase gate electrode EG is formed of the silicon film PS5 embedded in the region of the memory cell region 1A which is located between the two gate patterns each including the insulating film IF6, the control gate electrode CG, the ONO film ON, the floating gate electrode FG, and the gate insulating film GI3 and which is located immediately above the n⁻-type semiconductor region E4.

It can be considered that, immediately after the foregoing etch-back process, in the memory cell region 1A, the respective end portions of the erase gate electrode EG and the silicon film PS5 cover the upper ends of the side surfaces of the foregoing gate pattern, i.e., the upper ends of the side surfaces of the insulating film IF6. However, in that case also, the lowermost surfaces of the erase gate electrode EG and the silicon film PS5 in the memory cell region 1A are located at positions lower in level than the upper surface of the insulating film IF6.

In the I/O region 1B, only the silicon films PS5 covering the side surfaces of the gate pattern including the insulating film IF6, the gate electrode G2, the ONO film ON, the silicon film PS3, and the gate insulating film GI2 remain in the form of sidewalls. Since the etch-back process is performed in the state where the logic region 1C is covered with a photoresist film (not shown), the silicon film PS5 covering the main surface of the semiconductor substrate SB located in the logic region 1C is not removed and remains. At this stage, the upper surface of the silicon film PS5 located in the logic region 1C is located at a position lower in level than that of the upper surface of the insulating film IF6.

Figure 41:
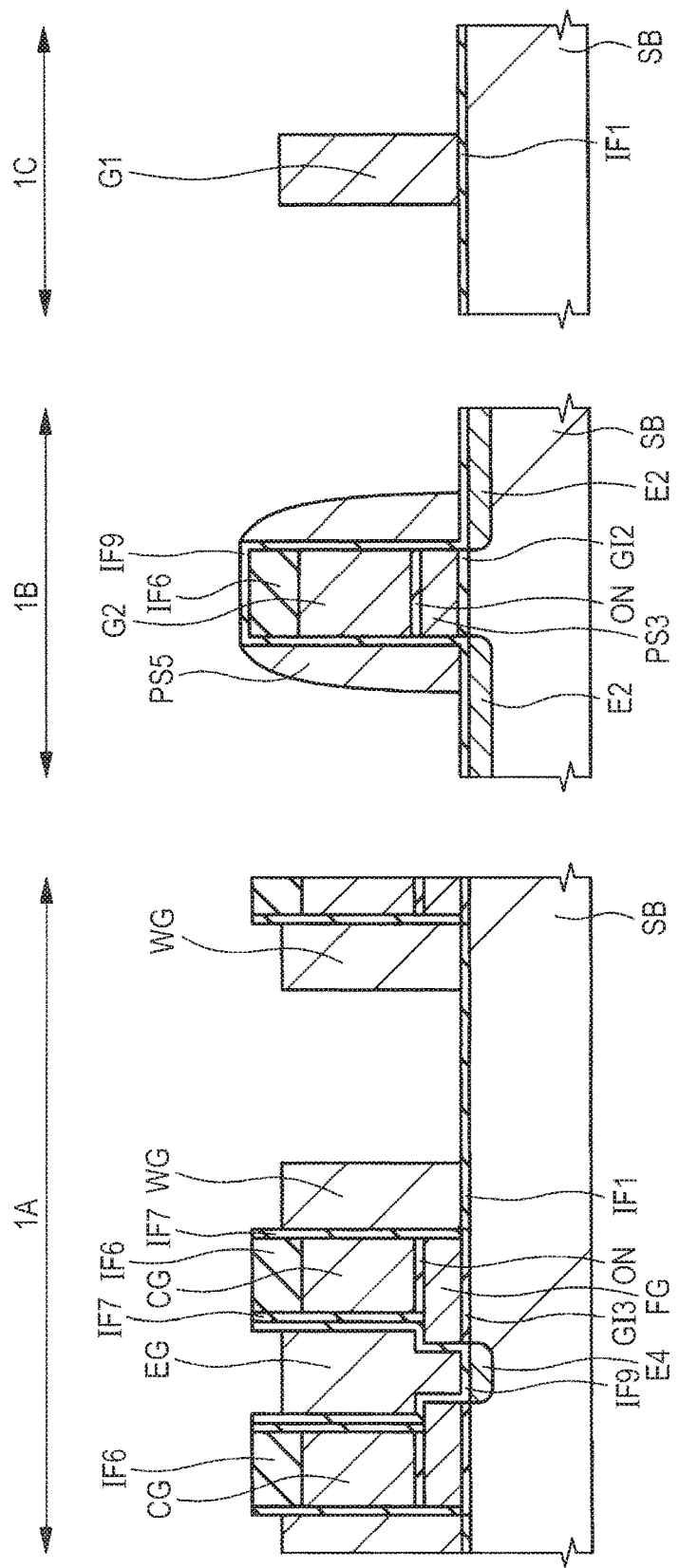
FIG. 41 is a cross-sectional view of the semiconductor device during the manufacturing process thereof, which is subsequent to FIG. 40.

Next, as shown in FIG. 41, using a photolithographic technique and an etching method, a portion of each of the silicon films PS5 located in the memory cell region 1A and the logic region 1C is removed. That is, in the memory cell region 1A, by removing a portion of the silicon film PS5 embedded in the space between two gate patterns each including the insulating film IF6, the control gate electrode CG, the ONO film ON, the floating gate electrode FG, and the gate insulating film GI3, the insulating film IF1 is exposed. Consequently, in the region adjacent to one of the side surfaces of the gate pattern, the erase gate electrode EG is formed while, in the region adjacent to the other side surface thereof, the word gate electrode WG made of the silicon film PS5 is formed. That is, each of the plurality of gate patterns in the memory cell region 1A is interposed between the erase gate electrode EG and the word gate electrode WG.

In the logic region 1C, by processing the silicon film PS5 in the foregoing etching step and thus exposing the insulating film IF1, the gate electrode G1 made of the silicon film PS5 is formed. The height of the gate electrode G1 is equal to the height of each of the erase gate electrode EG and the word gate electrode WG. That is, the height of each of the gate electrode G1, the erase gate electrode EG, and the word gate electrode WG is lower than the height of each of the gate patterns including the insulating film IF6, the control gate electrode CG, the ONO film ON, the floating gate electrode FG, and the gate insulating film GI3 in the memory cell region 1A. The height of each of the gate electrode G1, the erase gate electrode EG, and the word gate electrode WG is lower than the height of the gate pattern including the insulating film IF6, the gate electrode G2, the ONO film ON, the silicon film PS3, and the gate insulating film GI2 in the I/O region 1B.

Figure 42:
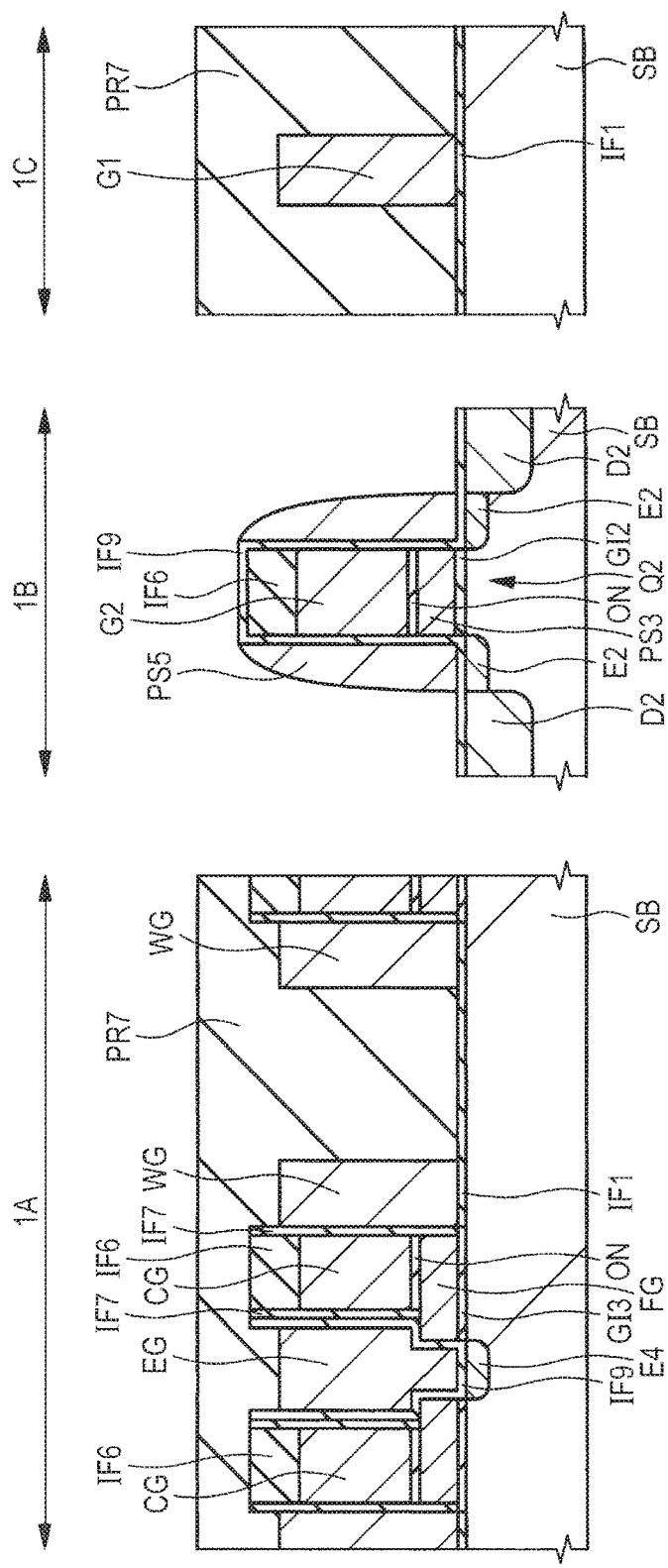
FIG. 42 is a cross-sectional view of the semiconductor device during the manufacturing process thereof, which is subsequent to FIG. 41.

Next, as shown in FIG. 42, a photoresist film PR7 covering the memory cell region 1A and the logic region 1C and exposing the I/O region 1B is formed over the semiconductor substrate SB. Subsequently, using the photoresist film PR7, the gate pattern including the insulating film IF6, the gate electrode G2, the ONO film ON, the silicon film PS3, and the gate insulating film GI2, and the sidewall-shaped silicon films PS5 as a mask, ion implantation is performed. Into the main surface of the semiconductor substrate SB located in the I/O region 1B, n-type impurities (e.g., As (arsenic) and P (phosphorus)) are implanted herein. Thus, in the main surface of the semiconductor substrate SB located lateral to the gate pattern in the I/O region 1B, the n⁺-type semiconductor regions D2 as the pair of diffusion regions are formed.

In the ion implantation step, when As (arsenic) is implanted, an energy is 80 keV and a doze is $1 \times 10^{15}$ cm⁻² and, when P (phosphorus) is implanted, an energy is 80 keV and a doze is $5 \times 10^{13}$ cm⁻². The depth of each of the n⁺-type semiconductor regions D2 thus formed is, e.g., 160 nm, and the depth of the position in the n⁺-type semiconductor region D2 where the impurity concentration is highest is, e.g., 80 nm.

The n⁻-type semiconductor regions E2 and the n⁻-type semiconductor regions D2 which are formed in the main surface of the semiconductor substrate SB located lateral to the gate electrode G2 form the source/drain regions. The source/drain regions and the gate electrode G2 form the higher-breakdown-voltage MISFET Q2.

The As (arsenic) implanted herein has the function of preventing excessively thick silicide layers from being formed in the upper surfaces of the source/drain regions formed in the I/O region 1B in the subsequent step of forming the silicide layers.

Figure 43:
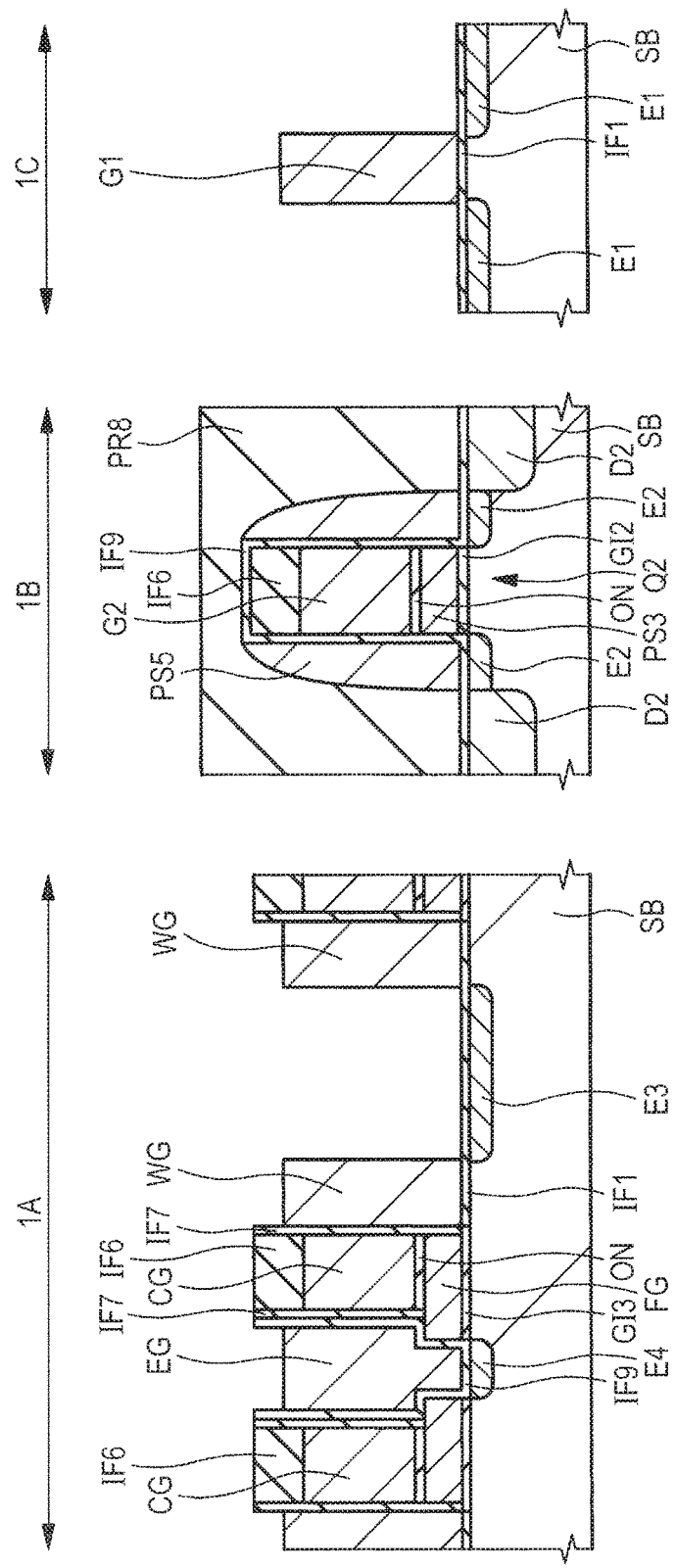
FIG. 43 is a cross-sectional view of the semiconductor device during the manufacturing process thereof, which is subsequent to FIG. 42.

Next, as shown in FIG. 43, the photoresist film PR7 is removed. Then, a photoresist film PR8 covering the I/O region 1B and exposing each of the memory cell region 1A and the logic region 1C is formed over the semiconductor substrate SB. Subsequently, using the photoresist film PR8, the gate patterns each including the insulating film IF6, the control gate electrode CG, the ONO film ON, the floating gate electrode FG, and the gate insulating film GI3, the gate electrode G1, the erase gate electrode EG, and the word gate electrode WG as a mask, ion implantation is performed. Into the main surface of the semiconductor substrate SB located in the memory cell region 1A and the logic region 1C, n-type impurities (e.g., As (arsenic) and P (phosphorus)) are implanted herein. Thus, in the main surface of the semiconductor substrate SB located lateral to the word gate electrode WG in the memory cell region 1A, the n⁻-type semiconductor region E3 as the extension region is formed and, in the main surface of the semiconductor substrate SB located lateral to the gate electrode G1 in the logic region 1C, the n⁻-type semiconductor regions E1 as the extension regions are formed.

Figure 44:
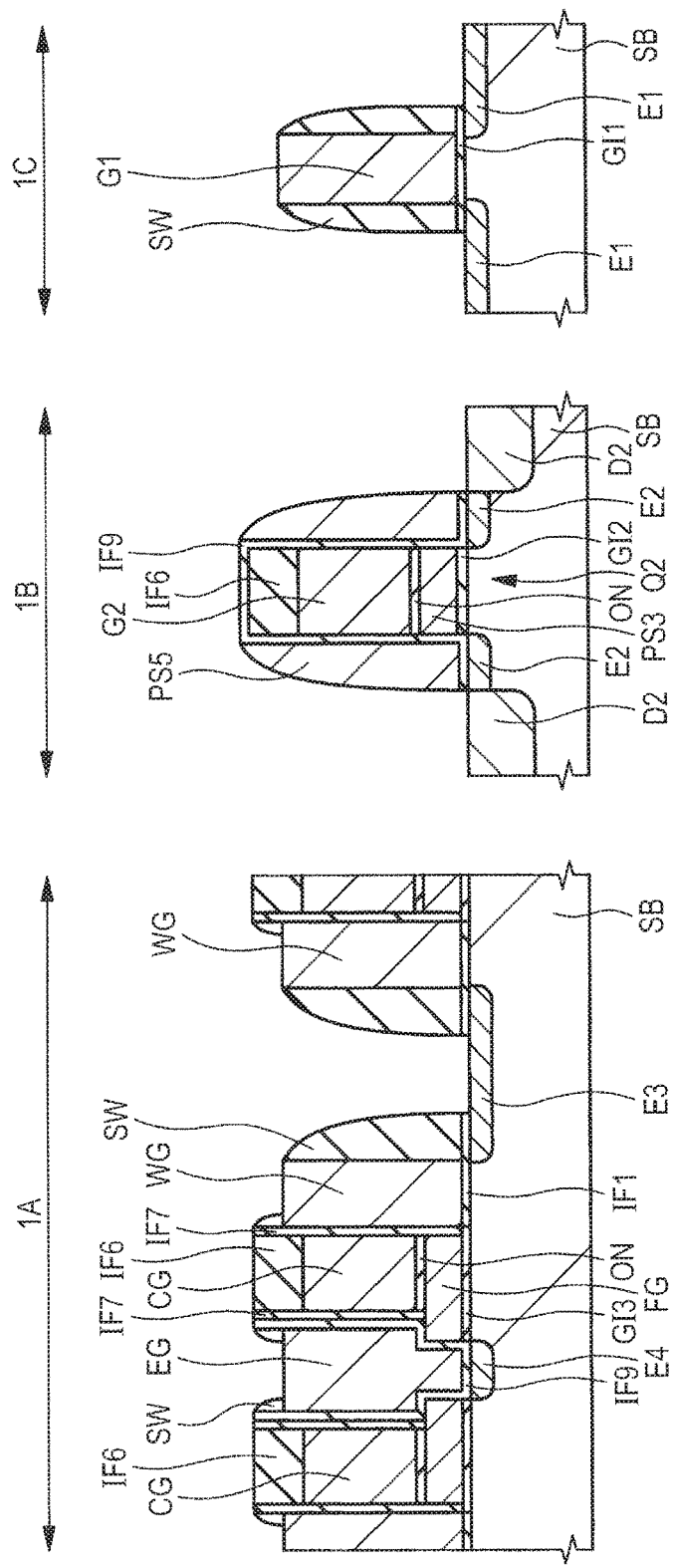
FIG. 44 is a cross-sectional view of the semiconductor device during the manufacturing process thereof, which is subsequent to FIG. 43.

Next, as shown in FIG. 44, the sidewall SW covering the exposed one of the side surfaces of the word gate electrode WG which is opposite to the control gate electrode CG and the sidewalls SW covering the both side surfaces of the gate electrode G1 are formed. A method of forming the sidewalls SW is the same as the method described using FIG. 11. Over the side surface of each of the sidewall-shaped silicon films PS5 formed in the I/O region 1B, no sidewall is formed herein. The following is the reason for this. In contrast to the respective side surfaces of the word gate electrode WG and the gate electrode G1, the exposed side surface of each of the silicon films PS5 does not have an angle close to that of a direction perpendicular to the main surface of the semiconductor substrate SB, but is gently inclined. As a result, the insulating film formed so as to cover the side surface of each of the silicon films PS5 is entirely removed by the etching.

In the etching step performed to form the sidewalls SW, the insulating film IF1 exposed from the word gate electrode WG, the gate electrode G1, and the sidewalls SW is removed. As a result, in the logic region 1C, the gate insulating film GI1 made of the insulating film IF1 located immediately below the gate electrode G1 is formed. The insulating film IF1 immediately below the word gate electrode WG also functions as the gate insulating film.

In the memory cell region 1A, the sidewalls SW covering the respective side surfaces of the insulating films IF7 and IF9 located above the erase gate electrode EG and the word gate electrode WG are formed.

Figure 45:
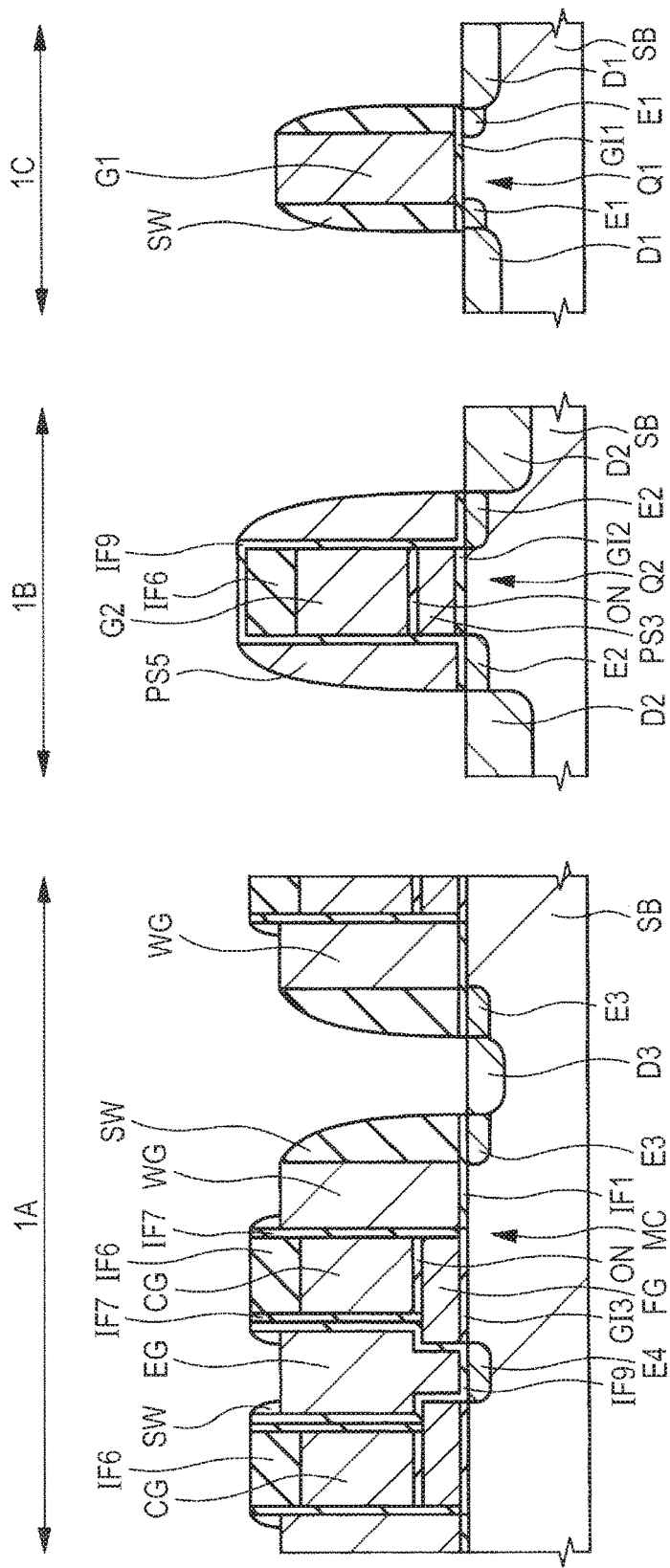
FIG. 45 is a cross-sectional view of the semiconductor device during the manufacturing process thereof, which is subsequent to FIG. 44.

Next, as shown in FIG. 45, using a photolithographic technique and an ion implantation method, n-type impurities (e.g., As (arsenic) and P (phosphorus)) are implanted into the main surface of the semiconductor substrate SB located in each of the memory cell region 1A and the logic region 1C. Thus, in the main surface of the semiconductor substrate SB located lateral to the word gate electrode WG in the memory cell region 1A, the $n^+$-type semiconductor regions D3 as the diffusion regions are formed and, in the main surface of the semiconductor substrate SB located lateral to the gate electrode G1 in the logic region 1C, the pair of $n^-$-type semiconductor regions D1 as the diffusion regions are formed.

The $n^+$-type semiconductor regions D1 to D3 have impurity concentrations higher than those of the $n^-$-type semiconductor regions E1 to E3 and depths larger than those of the $n^-$-type semiconductor regions E1 to E3. Since the ion implantation is performed herein in the state where the I/O region 1B is covered with a photoresist film (not shown), impurity ions are not implanted into the main surface of the semiconductor substrate SB located in the I/O region 1B.

For example, both of As (arsenic) and P (phosphorus) are implanted herein into the main surface of the semiconductor substrate SB. At this time, when As (arsenic) is implanted, an energy is 40 keV and a dose is $1\times10^{15}$ cm$^{-2}$. When P (phosphorus) is implanted, an energy is 40 keV and a dose is $5\times10^{13}$ cm$^{-2}$. The depth of each of the $n^-$-type semiconductor regions D1 and D3 thus formed is, e.g., 80 nm, and the depth of the position in each of the $n^-$-type semiconductor regions D1 and D3 where the impurity concentration is highest is, e.g., 40 nm.

As described above, the energy used in the ion implantation when the $n^+$-type semiconductor regions D1 and D3 are formed is not more than half the energy used when the $n^+$-type semiconductor regions D2 are formed. Accordingly, the depth of each of the $n^-$-type semiconductor regions D2 is larger than the depth of each of the $n^+$-type semiconductor regions D1 and D3.

In the memory cell region 1A, the $n^-$-type semiconductor region E4 immediately below the erase gate electrode EG forms the source region, while the $n^-$-type semiconductor region E3 and the $n^-$-type semiconductor region D3 which are adjacent to each other in the main surface of the semiconductor substrate SB located lateral to the word gate electrode WG form the drain region. The source/drain regions, the floating gate electrode FG, the control gate electrode CG, the erase gate electrode EG, and the word gate electrode WG form the memory cell MC having the floating gate split structure.

In the logic region 1C, the $n^-$-type semiconductor regions E1 and the $n^+$-type semiconductor regions D1 which are formed in the main surface of the semiconductor substrate SB located lateral to the gate electrode G1 form the source/drain regions, and the source/drain regions and the gate electrode G1 form the lower-breakdown-voltage MISFET Q1.

Figure 46:
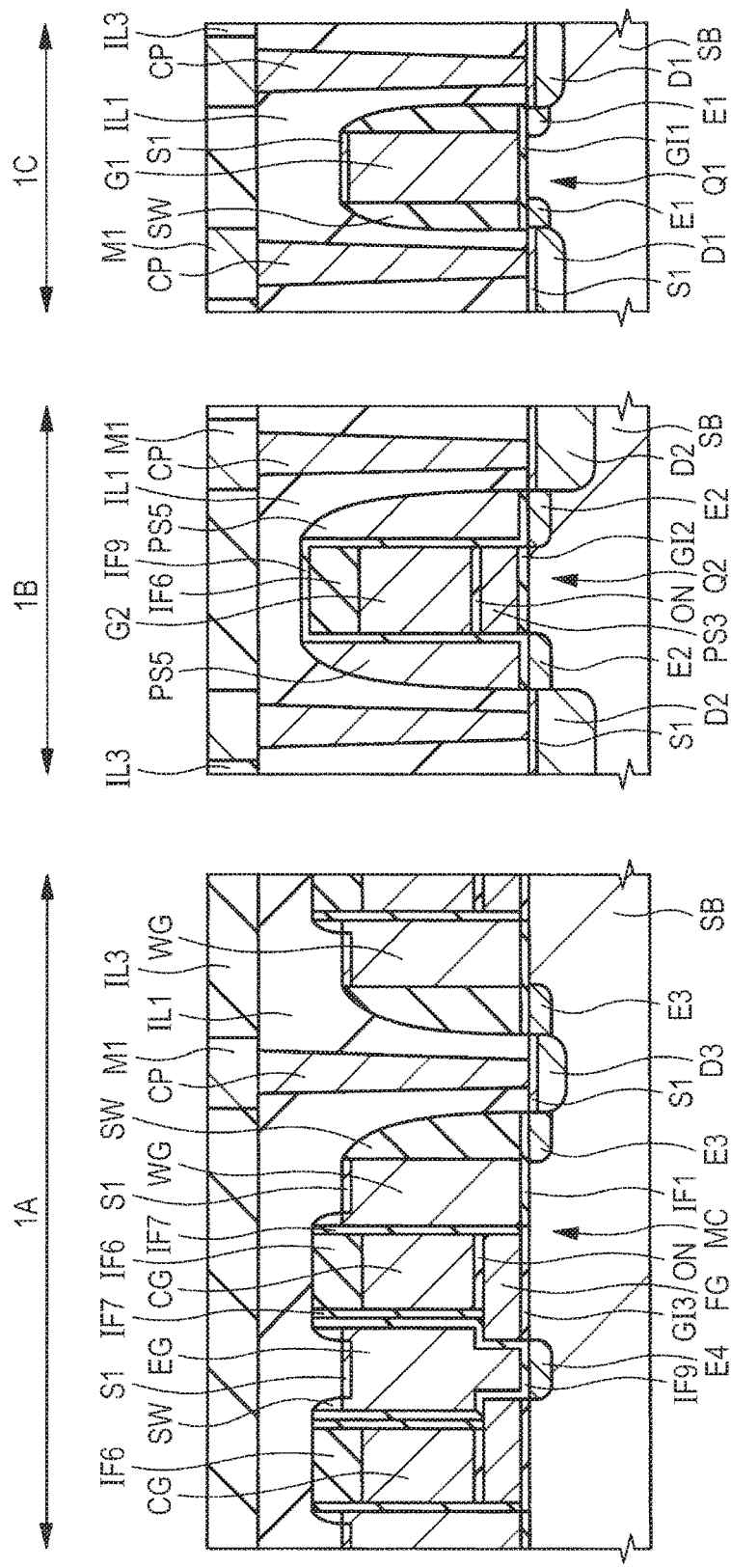
FIG. 46 is a cross-sectional view of the semiconductor device during the manufacturing process thereof, which is subsequent to FIG. 45.

Next, as shown in FIG. 46, by performing the same steps as the steps described using FIGS. 13 and 14, the silicide layers S1, the interlayer insulating film ILL the contact plugs CP, the interlayer insulating film IL3, and the wires M1 are formed. The silicide layers S1 are formed so as to cover the respective upper surfaces of the erase gate electrode EG, the word gate electrode WG, the $n^+$-type semiconductor regions D1, D2, and D3, and the gate electrode G1. In this manner, the semiconductor device in Embodiment 3 is formed.

Effects of Embodiment 3

In Embodiment 3, in the step described using FIG. 42, using the thick gate pattern including the insulating film IF6, the gate electrode G2, the ONO film ON, the silicon film PS3, and the gate insulating film GI2 which are stacked over the semiconductor substrate SB as a mask, the ion implantation is performed with the relatively high energy. Thus, the $n^+$-type semiconductor regions D2 deeper than the $n^+$-type semiconductor regions D1 and D3 are formed in the I/O region 1B. This allows the same effects as obtained in Embodiment 1 described above to be obtained.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

For example, the step of using the metal film MM (see FIG. 17) described above in the modification of Embodiment 1 as the implantation blocking mask may also be applied to the manufacturing method of the semiconductor device in Embodiment 2 described above. In that case, the metal film MM is removed by the polishing step described using FIG. 23.

The following is provided as additional description of parts of the content of the description of the foregoing embodiments.

(Note 1)

A semiconductor device, comprising:

a semiconductor substrate having a first region, a second region, and a third region;

a first gate pattern including a first conductive film, a first insulating film, a first gate electrode, and a second insulating film which are formed in this order over the semiconductor substrate located in the first region via a first gate insulating film;

first source/drain regions formed in a main surface of the semiconductor substrate located in the first region;

a second gate electrode formed over the semiconductor substrate located in the second region via a second gate insulating film;

second source/drain regions formed in the main surface of the semiconductor substrate located in the second region;

a second gate pattern including a floating gate electrode, a third insulating film having an internal charge storage portion, a control gate electrode, and a fourth insulating film which are formed in this order over the semiconductor substrate located in the third region via a third gate insulating film;

an erase gate electrode formed over a first side surface of the second gate pattern via a fifth insulating film;

a word gate electrode formed over a second side surface of the second gate pattern opposite to the first side surface via a sixth insulating film;

a seventh insulating film formed between the erase gate electrode and the semiconductor substrate;

an eighth insulating film formed between the word gate electrode and the semiconductor substrate; and third source/drain regions formed in the main surface of the semiconductor substrate, wherein each of the first source/drain regions includes a first semiconductor region having a first conductivity type, each of the second source/drain regions includes a second semiconductor region having the first conductivity type, and each of the third source/drain regions includes a third semiconductor region having the first conductivity type, wherein the first gate electrode and the first source/drain regions form a first field effect transistor, the second gate electrode and the second source/drain regions form a second field effect transistor, and the floating gate electrode, the control gate electrode, the erase gate electrode, the word gate electrode, and the third source/drain regions form a memory cell, and wherein the first semiconductor region is deeper than each of the second semiconductor region and the third semiconductor region.

(Note 2)

A method of manufacturing a semiconductor device, comprising the steps of:

(a) providing a semiconductor substrate having a first region, a second region, and a third region;

(b) forming a first insulating film over the semiconductor substrate located in the first region, forming a second insulating film over the semiconductor substrate located in the second region, and forming a third insulating film over the semiconductor substrate located in the third region;

(c) forming a first conductive film over the semiconductor substrate located in the first region, the second region, and the third region;

(d) processing the first conductive film located in the third region to form a third gate electrode;

(e) after the step (d), forming, over the semiconductor substrate, a fourth insulating film covering the third gate electrode and the first conductive film located in the first region and the second region and having an internal charge storage portion and forming a second conductive film over the fourth insulating film;

(f) processing the second conductive film to form a fourth gate electrode made of the second conductive film over a side surface of the third gate electrode via the fourth insulating film, while removing the second conductive film from the second region;

(g) after the step (f), processing the second conductive film, the fourth insulating film, and the first conductive film each located in the first region to form a first gate electrode made of the first conductive film, while processing the first conductive film located in the second region to form a second gate electrode made of the first conductive film;

(h) after the step (g), implanting an impurity having a first conductivity type into a main surface of the semiconductor substrate located in the second region to form second source/drain regions, while implanting an impurity having the first conductivity type into the main surface of the semiconductor substrate located in the third region to form third source/drain regions; and (i) after the step (g), implanting an impurity having the first conductivity type into the main surface of the semiconductor substrate located in the first region to form first source/drain regions deeper than each of the second source/drain regions and the third source/drain regions, wherein the first gate electrode and the first source/drain regions form a first field effect transistor, the second gate electrode and the second source/drain regions form a second field effect transistor, and the third gate electrode, the fourth gate electrode, and the third source/drain regions form a memory cell.

(Note 3)

The method of manufacturing the semiconductor device according to (Note 2), further comprising the steps of:

(e1) after the step (e) and before the step (f), forming a second metal film over the second conductive film and then removing the second metal film from each of the second region and the third region, wherein, in the step (g), the second metal film, the second conductive film, the fourth insulating film, and the first conductive film each located in the first region are processed to form the first gate electrode, while the first conductive film located in the second region is processed to form the second gate electrode, and wherein, in the step (i), using the second metal film as a protection film, an impurity having the first conductivity type is implanted into the main surface of the semiconductor substrate located in the first region to form the first source/drain regions.

(Note 4)

A method of manufacturing a semiconductor device, comprising the steps of:

(a) providing a semiconductor substrate having a first region, a second region, and a third region;

(b) forming a first gate pattern including a first conductive film, a first insulating film, a first gate electrode, and a second insulating film which are stacked in this order over the semiconductor substrate located in the first region via a first gate insulating film, while forming a second gate pattern including a floating gate electrode, a third insulating film having an internal charge storage portion, a control gate electrode, and a fourth insulating film which are stacked in this order over the semiconductor substrate located in the third region via a third gate insulating film;

(c) forming a fifth insulating film covering a first side surface of the second gate pattern and a sixth insulating film covering a second side surface of the second gate pattern opposite to the first side surface;

(d) forming a seventh semiconductor region having a first conductivity type in a main surface of the semiconductor substrate located closer to the first side surface of the second gate pattern;

(e) after the step (c) and the step (d), forming a third conductive film over the semiconductor substrate via a ninth insulating film;

(f) processing the third conductive film to form a second gate electrode made of the third conductive film located in the second region, form an erase gate electrode made of the third conductive film over the first side surface of the second gate pattern via the fifth insulating film, and form a word gate electrode made of the third conductive film over the second side surface of the second gate pattern via the sixth insulating film;

(g) after the step (f), implanting an impurity having the first conductivity type into the main surface of the semiconductor substrate located in the first region to form first source/drain regions; and (h) after the step (f), implanting an impurity having the first conductivity type into the main surface of the semiconductor substrate located in the second region to form second source/drain regions, while implanting an impurity having the first conductivity type into the main surface of the semiconductor substrate located in the third region to form third source/drain regions each including the seventh semiconductor region, wherein the first gate electrode and the first source/drain regions form a first field effect transistor, the second gate electrode and the second source/drain regions form a second field effect transistor, and the floating gate electrode, the control gate electrode, the erase gate electrode, the word gate electrode, and the third source/drain regions form a memory cell, and wherein the first source/drain regions are deeper than each of the second source/drain regions and the third source/drain regions.

What is claimed is:

1. A method of manufacturing a semiconductor device, comprising:
    (a) providing a semiconductor substrate having a main surface, and having a first region, a second region, and a third region;
    (b) forming a first insulating film over the semiconductor substrate on the main surface located in the first region, forming a second insulating film over the semiconductor substrate on the main surface located in the second region, and forming a third insulating film over the semiconductor substrate on the main surface located in the third region;
    (c) forming a first conductive film over the semiconductor substrate on the main surface located in the first region, the second region, and the third region;
    (d) processing the first conductive film located in the third region to form a third gate electrode;
    (e) after the step (d), forming a fourth insulating film covering the third gate electrode and the first conductive film located in the first region and the second region and having an internal charge storage portion, and forming a second conductive film over the fourth insulating film in this order;
    (f) processing the second conductive film to form a fourth gate electrode made of the second conductive film over a side surface of the third gate electrode via the fourth insulating film, while removing the second conductive film from the second region and not removing the second conductive film from the first region;
    (g) after the step (f), processing the second conductive film, the fourth insulating film, and the first conductive film each located in the first region to form a first dummy gate electrode made of the first conductive film, while processing the first conductive film located in the second region to form a second dummy gate electrode made of the first conductive film;
    (h) after the step (g), implanting an impurity having the first conductivity type into the main surface of the semiconductor substrate located in the second region to form second source/drain regions while implanting an impurity having the first conductivity type into the main surface of the semiconductor substrate located in the third region to form third source/drain regions;
    (i) after the step (g), implanting the impurity (are they the same of different antecedent) having the first conductivity type into the main surface of the semiconductor substrate located in the first region to form first source/drain regions deeper than each of the second source/drain regions and the third source/drain regions;
    (j) after the step (i), forming, over the semiconductor substrate, an interlayer insulating film covering the third gate electrode, the fourth gate electrode, the first dummy gate electrode, and the second dummy gate electrode;
    (k) polishing an upper surface of the interlayer insulating film to expose the first dummy gate electrode and the second dummy gate electrode; and
    (l) after the step (k), replacing the first dummy gate electrode with a first gate electrode and replacing the second dummy gate electrode with a second gate electrode,
    wherein the first gate electrode and the first source/drain regions form a first field effect transistor, the second gate electrode and the second source/drain regions form a second field effect transistor, and
    the third gate electrode, the fourth gate electrode, and the third source/drain regions form a memory cell.

2. The method of manufacturing the semiconductor device according to claim 1, wherein, in the step (h), the impurity having the first conductivity type is implanted into the main surface of the semiconductor substrate located in the second region with a second energy to form the second source/drain regions,
    while the impurity having the first conductivity type is implanted into the main surface of the semiconductor substrate located in the third region with a third energy to form the third source/drain regions,
    wherein, in the step (i), the impurity having the first conductivity type is implanted into the main surface of the semiconductor substrate located in the first region with a first energy to form the first source/drain regions, and
    wherein the first energy is higher than each of the second energy and the third energy.

3. The method of manufacturing the semiconductor device according to claim 1, wherein the step (l) includes:
    (l1) removing the first dummy gate electrode to form a first trench and removing the second dummy gate electrode to form a second trench;
    (l2) forming a first metal film over the semiconductor substrate to fill the first trench and the second trench therewith; and
    (l3) removing the first metal film from over the interlayer insulating film to form the first gate electrode made of the first metal film in the first trench and form the second gate electrode made of the first metal film in the second trench.

* * * * *